US012777913B2

(12) United States Patent
Clampitt et al.

(10) Patent No.: US 12,777,913 B2
(45) Date of Patent: Oct. 27, 2026

(54) MICROELECTRONIC DEVICES INCLUDING CONTACT STRUCTURES, AND RELATED MEMORY DEVICES, ELECTRONIC SYSTEMS, AND METHODS

(71) Applicant: Micron Technology, Inc., Boise, ID (US)

(72) Inventors: Darwin A. Clampitt, Wilder, ID (US); Shruthi Kumara Vadivel, Boise, ID (US); David Neumeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 936 days.

(21) Appl. No.: 17/930,365

(22) Filed: Sep. 7, 2022

(65) Prior Publication Data

US 2024/0079322 A1 Mar. 7, 2024

(51) Int. Cl.

| | |
|---|---|
| ***H10W 20/43*** | (2026.01) |
| ***H10B 43/10*** | (2023.01) |
| ***H10B 43/27*** | (2023.01) |
| ***H10B 43/50*** | (2023.01) |
| ***H10W 20/00*** | (2026.01) |
| ***H10W 20/41*** | (2026.01) |

(52) U.S. Cl.

CPC ............ *H10W 20/43* (2026.01); *H10B 43/10* (2023.02); *H10B 43/27* (2023.02); *H10B 43/50* (2023.02); *H10W 20/075* (2026.01); *H10W 20/076* (2026.01); *H10W 20/089* (2026.01); *H10W 20/435* (2026.01)

(58) Field of Classification Search

CPC ........................ H01L 23/528; H01L 21/76816

See application file for complete search history.

(56) References Cited

U.S. PATENT DOCUMENTS

| | | | | |
|---|---|---|---|---|
| 8,383,512 | B2 * | 2/2013 | Chen ...................... | H10B 43/20 438/622 |
| 9,064,576 | B2 | 6/2015 | Tanzawa | |
| 9,362,226 | B2 * | 6/2016 | Lee ....................... | H01L 23/528 |
| 9,870,990 | B2 * | 1/2018 | Freeman ........... | H01L 21/32139 |

(Continued)

OTHER PUBLICATIONS

Clampitt et al., Microelectronic Devices Including Stair Step Structures, and Related Electronic Systems and Methods, U.S. Appl. No. 17/644,937, filed Dec. 17, 2021, 42 pages.

(Continued)

*Primary Examiner* — Daniel Luke

(74) *Attorney, Agent, or Firm* — TraskBritt

(57) ABSTRACT

A microelectronic device comprises a stack structure comprising a vertically alternating sequence of conductive structures and insulative structures arranged in tiers, the stack structure divided into block structures horizontally extending in parallel in a first direction and horizontally separated from one another in a second direction by dielectric slot structures. At least one of the block structures comprises a stadium structure comprising opposing staircase structures each having steps comprising edges of the tiers, and conductive contact structures vertically extending to and in contact with at least some of the conductive structures at the steps, the conductive contact structures positioned proximate horizontal boundaries of the stadium structure in the second direction. Related memory devices, electronic systems, and methods are also described.

22 Claims, 42 Drawing Sheets

(56) References Cited

U.S. PATENT DOCUMENTS

| | | | | |
|---|---|---|---|---|
| 9,911,750 | B2 * | 3/2018 | Lee | H01L 23/528 |
| 9,941,209 | B2 | 4/2018 | Tessariol et al. | |
| 10,134,672 | B2 * | 11/2018 | Inatsuka | H01L 23/5226 |
| 10,141,330 | B1 | 11/2018 | Lindsay et al. | |
| 10,170,570 | B1 * | 1/2019 | Sonehara | H10B 43/35 |
| 10,269,626 | B2 | 4/2019 | Ha et al. | |
| 10,373,970 | B2 * | 8/2019 | Lee | H01L 21/764 |
| 10,381,080 | B2 | 8/2019 | Pan et al. | |
| 10,580,795 | B1 | 3/2020 | Luo et al. | |
| 11,101,280 | B2 * | 8/2021 | Chandolu | H10B 43/10 |
| 11,217,601 | B2 | 1/2022 | Luo et al. | |
| 11,393,716 | B2 * | 7/2022 | Ha | H10B 43/27 |
| 2021/0265216 | A1 * | 8/2021 | Zhao | H01L 21/76822 |
| 2021/0265371 | A1 | 8/2021 | Luo et al. | |

OTHER PUBLICATIONS

Larsen et al., Methods of Forming Microelectronic Devices, and Related Microelectronic Devices, Memory Devices, and Electronic Systems, U.S. Appl. No. 17/249,552, filed Mar. 4, 2021, 63 pages.

Xu et al., Microelectronic Devices Including Staircase Structures, and Related Methods, Memory Devices, and Electronic Systems, U.S. Appl. No. 17/701,509, filed Mar. 22, 2022, 89 pages.

* cited by examiner

MICROELECTRONIC DEVICES INCLUDING CONTACT STRUCTURES, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices including staircase structures and conductive contacts in electrical communication with steps of the staircase structures, and to related memory devices, electronic systems, and methods of forming the microelectronic devices.

BACKGROUND

Microelectronic device designers often desire to increase the level of integration or density of features within a microelectronic device by reducing the dimensions of the individual features and by reducing the separation distance between neighboring features. In addition, microelectronic device designers often seek to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through one or more stack structures including tiers of conductive material and insulative material. Each string of memory cells may include at least one select device coupled thereto. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive material of the tiers of the stack structure(s) of the memory device and control logic devices (e.g., string drivers) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions for the conductive material of the tiers, upon which conductive contact structures can be positioned to provide electrical access to the conductive material. In turn, conductive routing structures can be employed to couple the conductive contact structures to the control logic devices. Forming the conductive contact structures includes etching through different vertical heights of an insulative material over the staircase structures. During formation of the conductive contact structures, the conductive contact structures may be formed to a tier vertically underlying a desired tier or neighboring conductive contact structures may inadvertently electrically connect to one another (e.g., short).

DETAILED DESCRIPTION

Figure 1A:
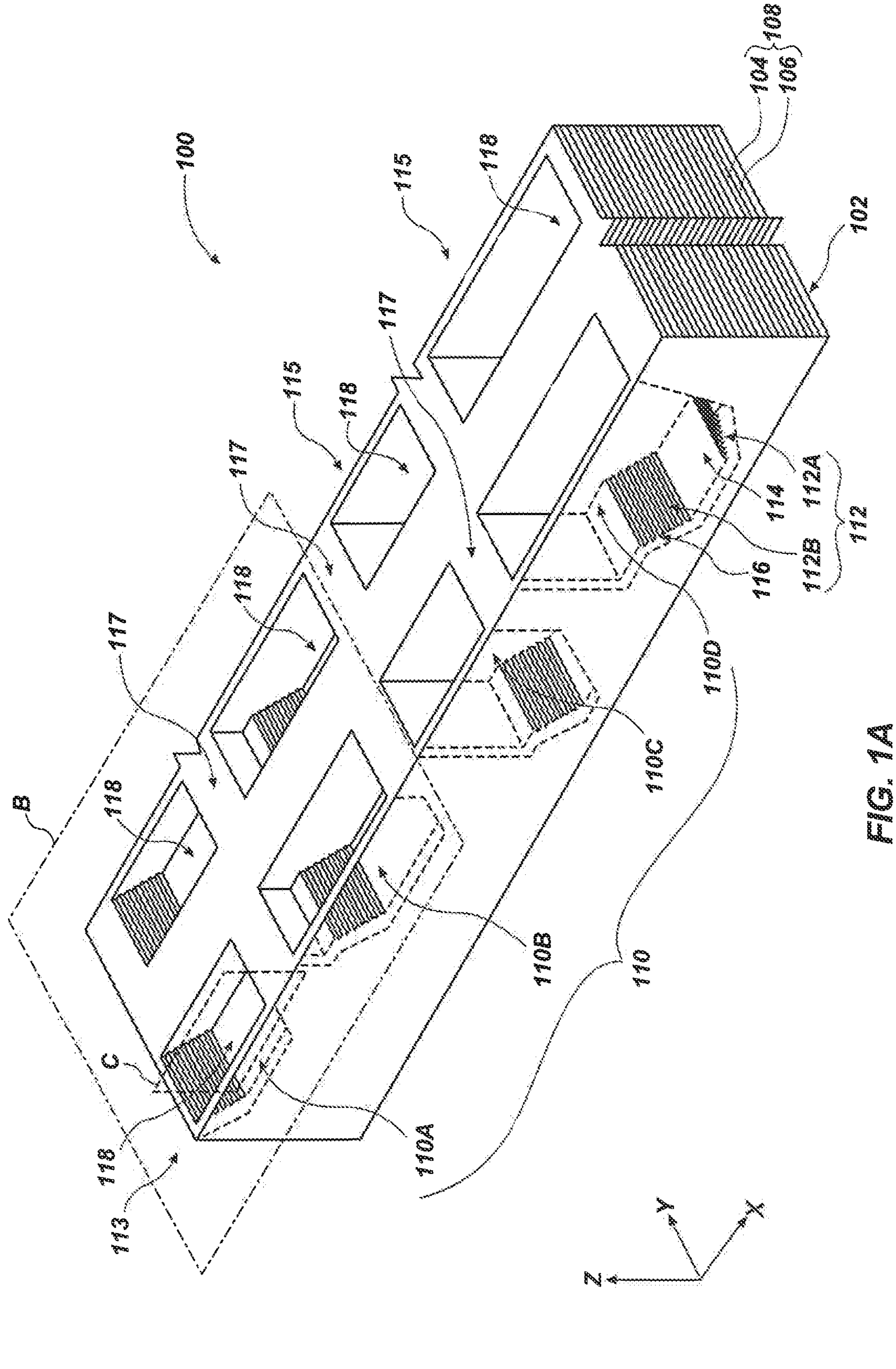
FIG. 1A is a simplified, partial perspective view of a microelectronic device structure at a processing stage of a method of forming a microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as NAND memory device), apparatus, memory device, or electronic system, or a complete microelectronic device, apparatus, memory device, or electronic system including conductive contact structures. The structures described below do not form a complete microelectronic device, apparatus, memory device, or electronic system. Only those process acts and structures necessary to understand the embodiments described herein are described in detail below. Additional acts to form a complete microelectronic device, apparatus, memory device, or electronic system from the structures may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

According to embodiments described herein, a microelectronic device comprises a stack structure comprising a vertically alternating sequence of insulative structures and conductive structures. Slot structures vertically extend through the stack structure and divide the microelectronic device into block structures, each block structure comprising stadium structures defining steps edges of tiers of alternating conductive structures and insulative structures. In some embodiments, each block structure includes a bridge region including a bridge structure. The bridge structure may comprise substantially an entire vertical height of the stack structure and may be located horizontally between steps of horizontally neighboring stadium structures. In some embodiments, the stadium structures are discontinuous, such that horizontally neighboring steps of a stadium structure within a block structure are separated from one another by a portion of the bridge structure. In some such embodiments, the steps may be located at least partially within horizontal boundaries of the bridge structure.

In some embodiments, the conductive structure of each step of the each stadium structure are in electrical communication with at least two conductive contact structures for electrically connecting the conductive structure of the step to a data line, such as to a digit line. The at least two conductive contact structures are located within horizontal boundaries of the step. At least a portion of a pillar structure may vertically extend through the stack structure horizontally between horizontally neighboring conductive contact structures within the horizontal boundaries of step. The at least two conductive contact structures facilitate improved electrical communication between the conductive structures defining the steps and data lines. In addition, the at least two conductive contact structures in electrical communication with the conductive structures may be formed substantially simultaneously with formation of the conductive structures.

The microelectronic device may be formed by forming rows of stadium structures in a stack structure comprising a vertically alternating sequence of insulative structures and sacrificial structures. The stadium structures each individually comprise steps at horizontal edges of tiers of the vertically alternating sequence of insulative structures and sacrificial structures. After forming the stadium structures a first liner material and a second liner material are formed over the stadium structures. After forming the first liner material and the second liner material, pillar structure are formed through the stack structure, each individually at least partially overlying and within horizontal boundaries of a step of the stadium structures. Each pillar structure vertically extends through portions of the first liner material and the second liner material to isolate different portions of the first liner material and the second liner material from one another. A slot is transferred through portions of the stadium structures to isolate the steps of the stadium structures from one another. In some embodiments, the slot at least partially removes portions of the first liner material and the second liner material. The sacrificial structures and the isolated portions of the second liner material are removed through the slots and replaced with conductive material to form conductive structures and isolated conductive contact structures in electrical communication with the conductive structures at the steps. In some embodiments, the conductive structure of each step is in electrical communication two of the isolated conductive contact structures at the step.

Forming the conductive contact structures substantially simultaneously with formation of the conductive structures (e.g., in-situ during formation of the conductive structures) reduces the number of processing acts (e.g., etching acts) to form conductive contacts in electrical communication with the conductive structures compared to conventional microelectronic devices. For example, conventional methods of forming microelectronic devices includes etching through an insulative material over the conductive structures after forming the conductive structures. Etching through the insulative material to different depths (e.g., due to the different vertical heights of the steps) in conventional methods of forming a microelectronic device may inadvertently result in over etching (e.g., contact punch through) and electrical shorting of vertically neighboring conductive structures to each other.

FIG. 1A through FIG. 6C are various views (described in further detail below) illustrating a microelectronic device structure at different processing stages of a method of forming a microelectronic device (e.g., a memory device, such as a 3D NAND Flash memory device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device.

Figure 1B:
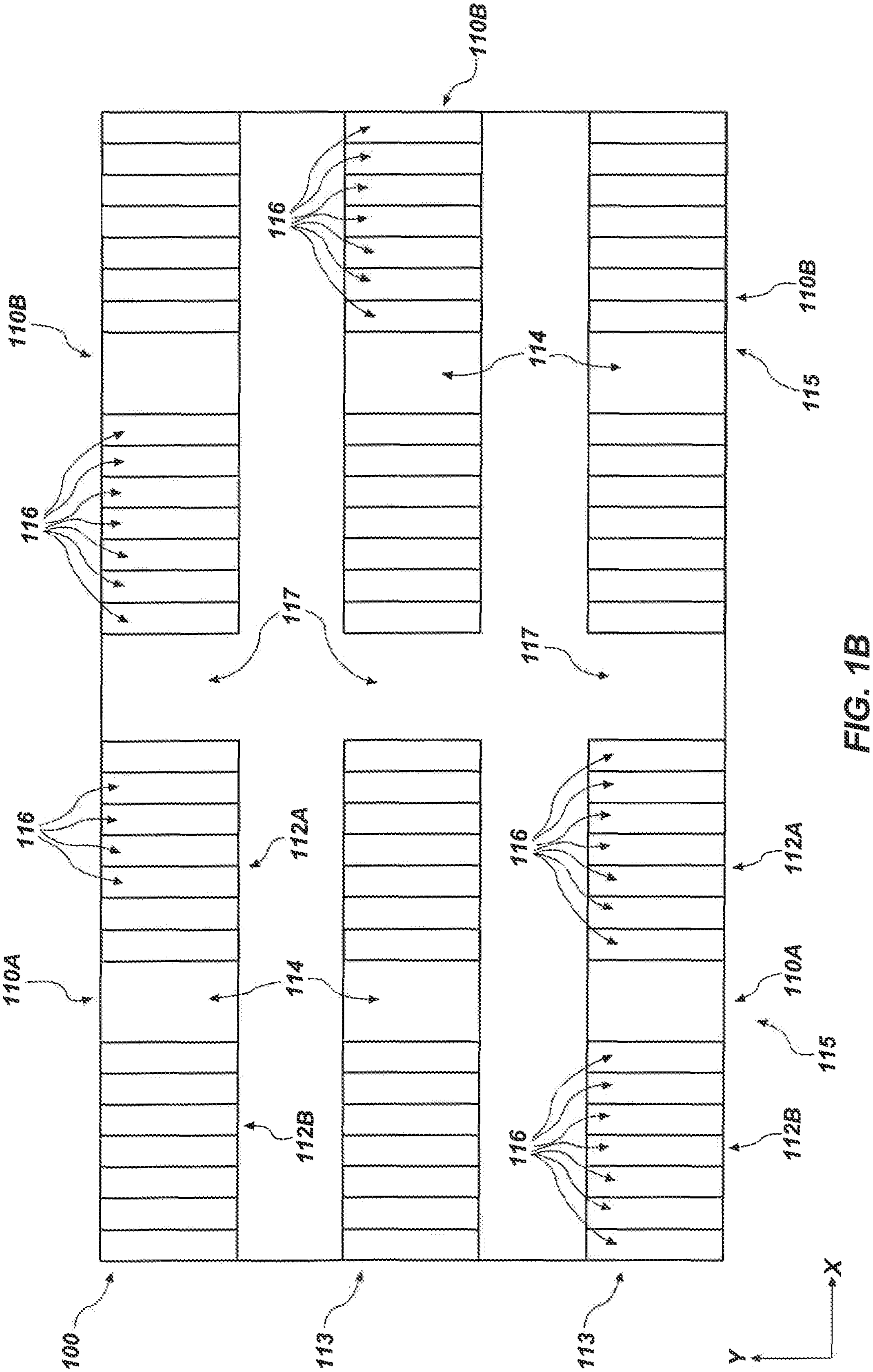
FIG. 1B is a simplified, partial top-down view of a portion of the microelectronic device structure (identified as portion B with dashed lines in FIG. 1A) of the microelectronic device structure at the processing stage of FIG. 1A.

FIG. 1A depicts a simplified, partial perspective view of a microelectronic device structure 100. As shown in FIG. 1A, the microelectronic device structure 100 may be formed to include a preliminary stack structure 102 including a vertically alternating (e.g., in a Z-direction) sequence of insulative structures 104 and sacrificial structure 106 arranged in tiers 108. Each of the tiers 108 of the preliminary stack structure 102 may individually include the sacrificial structure 106 vertically neighboring (e.g., directly vertically adjacent) the insulative structure 104. FIG. 1B is a simplified partial top-down view of a portion B (identified with dashed box B in FIG. 1A) of the microelectronic device structure 100 and illustrating only some components of the microelectronic device structure 100.

Figure 1C:
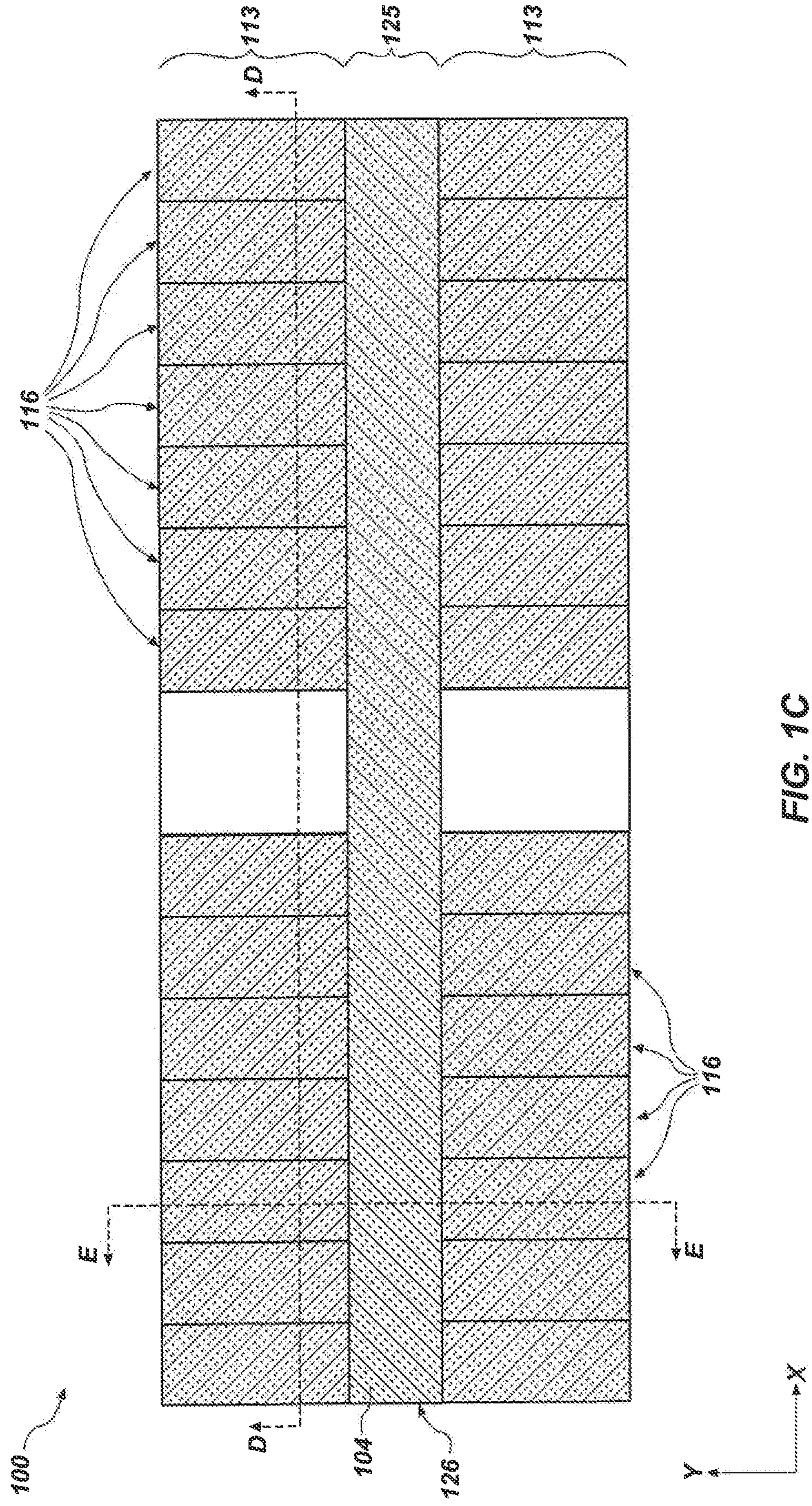
FIG. 1C is a simplified, partial top-down view of a portion of the microelectronic device structure (identified as portion C with dashed lines in FIG. 1A) of the microelectronic device structure at the processing stage after that illustrated in FIG. 1A.
Figure 1D:
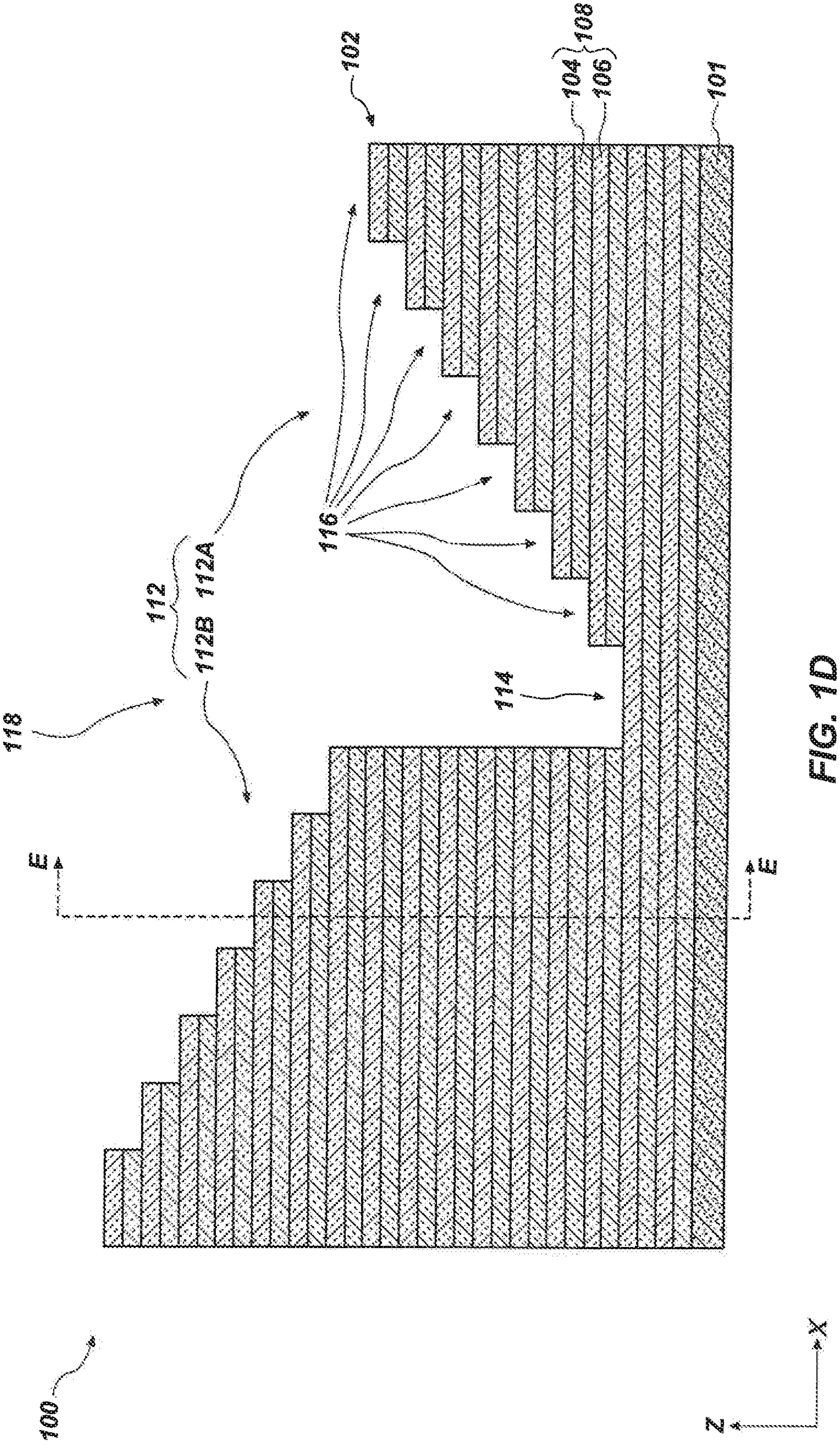
FIG. 1D is a simplified, partial cross-sectional view of a portion of the microelectronic device structure taken through section line D-D of FIG. 1C.
Figure 1E:
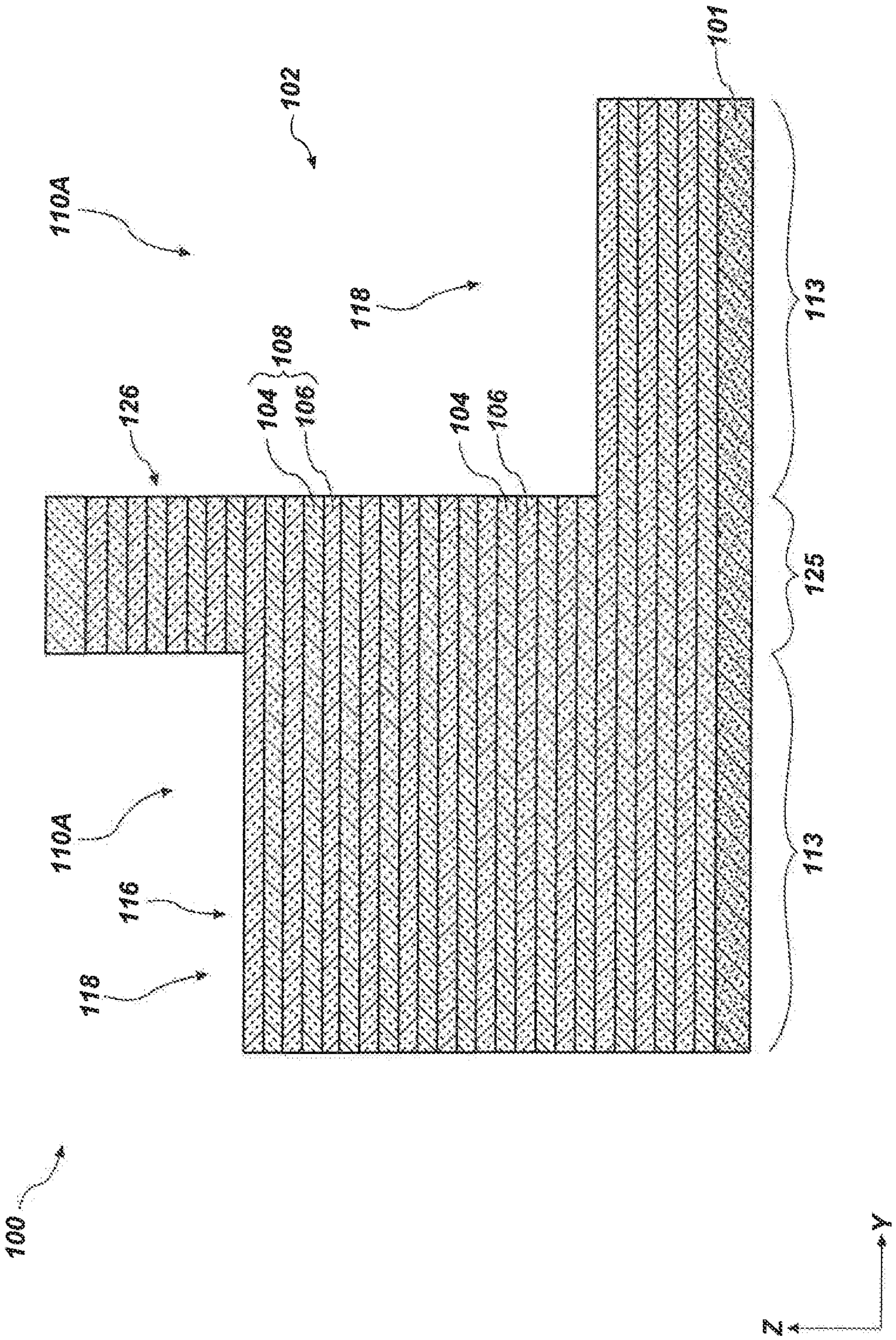
FIG. 1E is a simplified, partial cross-sectional view of a portion of the microelectronic device structure taken through section line E-E of FIG. 1C and FIG. 1D.

The tiers 108 of the vertically alternating (e.g., in a Z-direction) sequence of insulative structures 104 and sacrificial structures 106 may vertically overlie (e.g., in the Z-direction) a source structure 101 (FIG. 1D, FIG. 1E). The source structure 101 may comprise, for example, at least one conductive material, such as one or more of a metal (e.g., W, Ti, Mo, Nb, V, Hf, Ta, Cr, Zr, Fe, Ru, Os, Co, Rh, Ir, Ni, Pd, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy), a conductive metal-containing material (e.g., a conductive metal nitride, a conductive metal silicide, a conductive metal carbide, a conductive metal oxide), or a doped semiconductor material (e.g., a semiconductor material doped with one or more P-type dopants (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth)). In some embodiments, the source structure 101 comprises conductively-doped silicon.

In some embodiments, the source structure 101 further comprises one or more of metal silicide material (e.g., tungsten silicide ($WSi_x$)), metal nitride material (e.g., tungsten nitride), and metal silicon nitride material (e.g., tungsten silicon nitride ($WSi_xN_y$)).

The insulative structure 104 of each of the tiers 108 of the preliminary stack structure 102 may be formed of and include at least one insulative material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative structure 104 of each of the tiers 108 of the preliminary stack structure 102 is formed of and includes a dielectric oxide material, such as $SiO_x$ (e.g., $SiO_2$). The insulative structure 104 of each of the tiers 108 may be substantially homogeneous, or the insulative structure 104 of one or more (e.g., each) of the tiers 108 may be heterogeneous.

The sacrificial structure 106 of each of the tiers 108 of the preliminary stack structure 102 may be formed of and include at least one material (e.g., at least one insulative material) that may be selectively removed relative to the insulative structure 104. The sacrificial structure 106 may be selectively etchable relative to the insulative structure 104 during common (e.g., collective, mutual) exposure to a first etchant; and the insulative structure 104 may be selectively etchable to the sacrificial structure 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. By way of non-limiting example, depending on the material composition of the insulative structure 104, the sacrificial structure 106 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), at least one dielectric carboxynitride material (e.g., $SiO_xC_zN_y$), and at least one semiconductive material (e.g., polycrystalline silicon). In some embodiments, the sacrificial structure 106 of each of the tiers 108 of the preliminary stack structure 102 is formed of and includes a dielectric nitride material, such as $SiN_y$ (e.g., $Si_3N_4$). The sacrificial structure 106 may, for example, be selectively etchable relative to the insulative structure 104 during common exposure to a wet etchant comprising phosphoric acid ($H_3PO_4$).

The preliminary stack structure 102 may be formed to include any desired number of the tiers 108. By way of non-limiting example, the preliminary stack structure 102 may be formed to include greater than or equal to sixteen (16) of the tiers 108, such as greater than or equal to thirty-two (32) of the tiers 108, greater than or equal to sixty-four (64) of the tiers 108, greater than or equal to one hundred and twenty-eight (128) of the tiers 108, or greater than or equal to two hundred and fifty-six (256) of the tiers 108.

As shown in FIG. 1A and FIG. 1B, the preliminary stack structure 102 may include stadium structures 110 formed therein. The stadium structures 110 may be distributed throughout the preliminary stack structure 102. The preliminary stack structure 102 may include rows 113 of the stadium structures 110 extending in parallel in the X-direction, and columns 115 of the stadium structures 110 extending in the Y-direction orthogonal to the X-direction. FIG. 1A illustrates two (2) of the rows 113 of the stadium structures 110 and four (4) of the columns 115 of the stadium structures 110. FIG. 1B illustrates three (3) of the rows 113 of the stadium structures 110 and two (2) of the columns 115 of the stadium structures 110.

The rows 113 of the stadium structures 110 may individually include some of the stadium structures 110 at least partially (e.g., substantially) aligned with one another in the Y-direction. The columns 115 of the of the stadium structures 110 may individually include other of the stadium structures 110 at least partially (e.g., substantially) aligned with one another in the X-direction. Different rows 113 of the stadium structures 110 may be positioned within different horizontal areas of the preliminary stack structure 102 to be formed into blocks of a stack structure to be formed from the preliminary stack structure 102, as described in further detail below. In FIG. 1A, for clarity and ease of understanding the drawings and associated description, portions of the preliminary stack structure 102 are depicted as transparent to more clearly show some of the stadium structures 110 distributed within the preliminary stack structure 102.

Still referring to FIG. 1A and FIG. 1B, at least some (e.g., each) of the stadium structures 110 within an individual row 113 of the stadium structures 110 may be positioned at different vertical elevations in the Z-direction than one another. For example, as depicted in FIG. 1A, an individual row 113 of the stadium structures 110 may include a first stadium structure 110A, a second stadium structure 110B at a relatively lower vertical position (e.g., in the Z-direction) within the preliminary stack structure 102 than the first stadium structure 110A, a third stadium structure 110C at a relatively lower vertical position within the preliminary stack structure 102 than the second stadium structure 110B, and a fourth stadium structure 110D at a relatively lower vertical position within the row 113 than the third stadium structure 110C. In addition, within an individual row 113 of the stadium structures 110, horizontally neighboring (e.g., in the X-direction) stadium structures 110 may be substantially uniformly (e.g., equally, evenly) horizontally spaced apart from one another. In additional embodiments, one or more rows 113 of the stadium structures 110 may individually include a different quantity of stadium structures 110 and/or a different distribution of stadium structures 110 than that depicted in FIG. 1A. For example, an individual row 113 of the stadium structures 110 may include greater than four (4) of the stadium structures 110 (e.g., greater than or equal to five (5) of the stadium structures 110, greater than or equal to ten (10) of the stadium structures 110, greater than or equal to twenty-five (25) of the stadium structures 110, greater than or equal to fifty (50) of stadium structures 110), or less than four (4) of the stadium structures 110 (e.g., less than or equal to three (3) of the stadium structures 110, less than or equal to two (2) of the stadium structures 110, only one (1) of the stadium structures 110). As another example, within an individual row 113 of the stadium structures 110, at least some horizontally neighboring stadium structures 110 may be at least partially non-uniformly (e.g., non-equally, non-evenly) horizontally spaced, such that at least one of the stadium structures 110 of the row 113 is separated from at least two other of the stadium structures 110 of the row 113 horizontally neighboring the at least one stadium structure 110 by different (e.g., non-equal) distances. As an additional non-limiting example, within an individual row 113 of the stadium structures 110, vertical positions (e.g., in the Z-direction) of the stadium structures 110 may vary in a different manner (e.g., may alternate between relatively deeper and relatively shallower vertical positions) than that depicted in FIG. 1A.

With continued reference to FIG. 1A and FIG. 1B, the preliminary stack structure 102 may include crest regions 117 comprising vertically elevated (e.g., in the Z-direction) portions between horizontally neighboring (e.g., in the X-direction) columns 115 of the stadium structures 110. Each crest region 117 within a particular row 113 may horizontally neighbor (e.g., in the X-direction) at least one (e.g., two) of the stadium structures 110.

Each stadium structure 110 may include opposing staircase structures 112, and a central region 114 horizontally interposed between (e.g., in the X-direction) the opposing staircase structures 112. The opposing staircase structures 112 of each stadium structure 110 may include a forward staircase structure 112A and a reverse staircase structure 112B. A phantom line extending from a top of the forward staircase structure 112A to a bottom of the forward staircase structure 112A may have a positive slope, and another phantom line extending from a top of the reverse staircase structure 112B to a bottom of the reverse staircase structure 112B may have a negative slope. In additional embodiments, one or more of the stadium structures 110 may individually exhibit a different configuration than that depicted in FIG. 1A. As a non-limiting example, at least one stadium structure 110 may be modified to include a forward staircase structure 112A but not a reverse staircase structure 112B (e.g., the reverse staircase structure 112B may be absent), or at least one stadium structure 110 may be modified to include a reverse staircase structure 112B but not a forward staircase structure 112A (e.g., the forward staircase structure 112A may be absent). In such embodiments, the central region 114 horizontally neighbors a bottom of the forward staircase structure 112A (e.g., if the reverse staircase structure 112B is absent), or the central region 114 horizontally neighbors a bottom of the reverse staircase structure 112B (e.g., if the forward staircase structure 112A is absent).

The opposing staircase structures 112 (e.g., the forward staircase structure 112A and the reverse staircase structure 112B) of an individual stadium structure 110 each include steps 116 defined by edges (e.g., horizontal ends) of the tiers 108 of the preliminary stack structure 102. For the opposing staircase structures 112 of an individual stadium structure 110, each step 116 of the forward staircase structure 112A may have a counterpart step 116 within the reverse staircase structure 112B having substantially the same geometric configuration (e.g., shape, dimensions), vertical position (e.g., in the Z-direction), and horizontal distance (e.g., in the X-direction) from a horizontal center (e.g., in the X-direction) of the central region 114 of the stadium structure 110. In additional embodiments, at least one step 116 of the forward staircase structure 112A does not have a counterpart step 116 within the reverse staircase structure 112B having substantially the same geometric configuration (e.g., shape, dimensions), vertical position (e.g., in the Z-direction), and/or horizontal distance (e.g., in the X-direction) from horizontal center (e.g., in the X-direction) of the central region 114 of the stadium structure 110; and/or at least one step 116 of the reverse staircase structure 112B does not have a counterpart step 116 within the forward staircase structure 112A having substantially the same geometric configuration (e.g., shape, dimensions), vertical position (e.g., in the Z-direction), and/or horizontal distance (e.g., in the X-direction) from horizontal center (e.g., in the X-direction) of the central region 114 of the stadium structure 110.

Each of the stadium structures 110 of the preliminary stack structure 102 may individually include a desired quantity of steps 116. Each of the stadium structures 110 may include substantially the same quantity of steps 116 as each other of the stadium structures 110, or at least one of the stadium structures 110 may include a different quantity of steps 116 than at least one other of the stadium structures 110. In some embodiments, at least one of the stadium structures 110 includes a different (e.g., greater, lower) quantity of steps 116 than at least one other of the stadium structures 110. As shown in FIG. 1A, in some embodiments, the steps 116 of each of the stadium structures 110 are arranged in order, such that steps 116 directly horizontally adjacent (e.g., in the X-direction) one another correspond to tiers 108 of the preliminary stack structure 102 directly vertically adjacent (e.g., in the Z-direction) one another. In additional embodiments, the steps 116 of at least one of the stadium structures 110 are arranged out of order, such that at least some steps 116 of the stadium structure 110 directly horizontally adjacent (e.g., in the X-direction) one another correspond to tiers 108 of preliminary stack structure 102 not directly vertically adjacent (e.g., in the Z-direction) one another.

With continued reference to FIG. 1A, for an individual stadium structure 110, the central region 114 thereof may horizontally intervene (e.g., in the X-direction) between and separate the forward staircase structure 112A thereof from the reverse staircase structure 112B thereof. The central region 114 may horizontally neighbor a vertically lowermost step 116 of the forward staircase structure 112A, and may also horizontally neighbor a vertically lowermost step 116 of the reverse staircase structure 112B. The central region 114 of an individual stadium structure 110 may have desired horizontal dimensions. In addition, the central region 114 of each of the stadium structures 110 may have substantially the same horizontal dimensions as the central region 114 of each other of the stadium structures 110, or the central region 114 of at least one of the stadium structures 110 may have different horizontal dimensions than the central region 114 of at least one other of the stadium structures 110.

Each stadium structure 110 (including the forward staircase structure 112A, the reverse staircase structure 112B, and the central region 114 thereof) within the preliminary stack structure 102 may individually partially define boundaries (e.g., horizontal boundaries, vertical boundaries) of a trench 118 vertically extending (e.g., in the Z-direction) through the preliminary stack structure 102. The portions of the preliminary stack structure 102 horizontally neighboring an individual stadium structure 110 may also partially define the boundaries of the trench 118 associated with the stadium structure 110. The trench 118 may only vertically extend through tiers 108 of the preliminary stack structure 102 defining the forward staircase structure 112A and the reverse staircase structure 112B of the stadium structure 110; or may also vertically extend through additional tiers 108 of the preliminary stack structure 102 not defining the forward staircase structure 112A and the reverse staircase structure 112B of the stadium structure 110, such as additional tiers 108 of the preliminary stack structure 102 vertically overlying the stadium structure 110. Edges of the additional tiers 108 of the preliminary stack structure 102 may, for example, define one or more additional stadium structures vertically overlying and horizontally offset from the stadium structure 110. The trench 118 may subsequently be filled with one or more dielectric materials, as described in further detail below.

FIG. 1C is a simplified, partial top-down view of the microelectronic device structure 100 illustrating a portion of two rows 113 of the stadium structures 110 following the processing stage previously described with reference to FIG. 1A and FIG. 1B. FIG. 1D is a simplified, partial cross-sectional view of the microelectronic device structure 100 taken through section line D-D of the microelectronic device structure 100 of FIG. 1C; FIG. 1E is a simplified, partial cross-sectional view of the microelectronic device structure 100 taken through section line E-E of the microelectronic device structure 100 of FIG. 1C. While additional features (e.g., structures, materials) of the microelectronic device structure 100 are described hereinbelow with reference the views of FIG. 1C through FIG. 1E, such additional features may also be formed and included in additional portions of the microelectronic device structure 100, including additional portions encompassing additional stadium structures 110 of the preliminary stack structure 102 and additional regions of the preliminary stack structure 102 having boundaries defined by the additional stadium structures 110.

With collective reference to FIG. 1C through FIG. 1E, in some embodiments, a mask structure (e.g., a so-called chop mask structure) may be formed over a portion of each stadium structure 110, such as over one of the opposing staircase structures 112 while the other of the opposing staircase structures 112 remains exposed (e.g., uncovered) by the mask structure. The tiers 108 of the exposed portions of the stadium structures 110 may be removed to form steps 116 having a different vertical height (e.g., in the Z-direction) from the source structure 101 than the steps 116 of the opposing staircase structures 112 that are covered by the mask structure. In some embodiments, each of the steps 112 of a first opposing staircase structure 112 of a stadium structure 110 are formed to a different vertical level (e.g., in the Z-direction) than vertical levels of each of the steps 112 of a second opposing staircase structure 112 of the stadium structure 110. In some embodiments, the sacrificial structures 106 of the individual tiers 108 are exposed within the stadium structures 110.

With reference to FIG. 1C and FIG. 1E, the tiers 108 of the insulative structures 104 and the sacrificial structures 106 may remain within bridge regions 125 (FIG. 1C, FIG. 1E) horizontally between (e.g., in the Y-direction) rows 113 of the stadium structures 110. The bridge regions 125 horizontally between rows 113 of the stadium structures 110 may include bridge structures 126 (FIG. 1C, FIG. 1E) comprising the preliminary stack structure 102 of the tiers 108 of the insulative structures 104 and the sacrificial structures 106. In other words, the bridge structures 126 may comprise substantially an entire vertical height (e.g., in the Z-direction) of the preliminary stack structure 102 including the vertically alternating sequence of insulative structures 104 and sacrificial structures 106. The bridge structures 126 may also be referred to herein as "central bridge structures."

As shown in FIG. 1E, the insulative structure 104 and the sacrificial structure 106 of each tier 108 of the preliminary stack structure 102 having horizontal ends defining an individual stadium structure 110 (e.g., the first stadium structure 110A) within the preliminary stack structure 102 may continuously horizontally extend in the X-direction from sides of the stadium structure 110 opposing one another in the Y-direction to the bridge structure 126. In addition, for an individual stadium structure 110 within the preliminary stack structure 102, inner horizontal boundaries (e.g., inner sidewalls) of the preliminary stack structure 102 partially defining the trench 118 associated with (e.g., vertically overlying and within horizontal boundaries of) the stadium structure 110 may be oriented substantially perpendicular to uppermost vertical boundaries (e.g., uppermost surfaces) of the preliminary stack structure 102, or may be oriented substantially non-perpendicular to the uppermost vertical boundaries (e.g., uppermost surfaces) of the preliminary stack structure 102.

With continued reference to FIG. 1E, in some embodiments, the steps 116 of stadium structures 110 of horizontally neighboring (e.g., in the Y-direction) rows 113 of stadium structures 110 may be vertically offset (e.g., in the Z-direction) from one another. However, the disclosure is not so limited and the steps 116 of stadium structures 110 of horizontally neighboring (e.g., in the Y-direction) rows 113 of stadium structures 110 may be vertically aligned with one another.

Figure 2A:
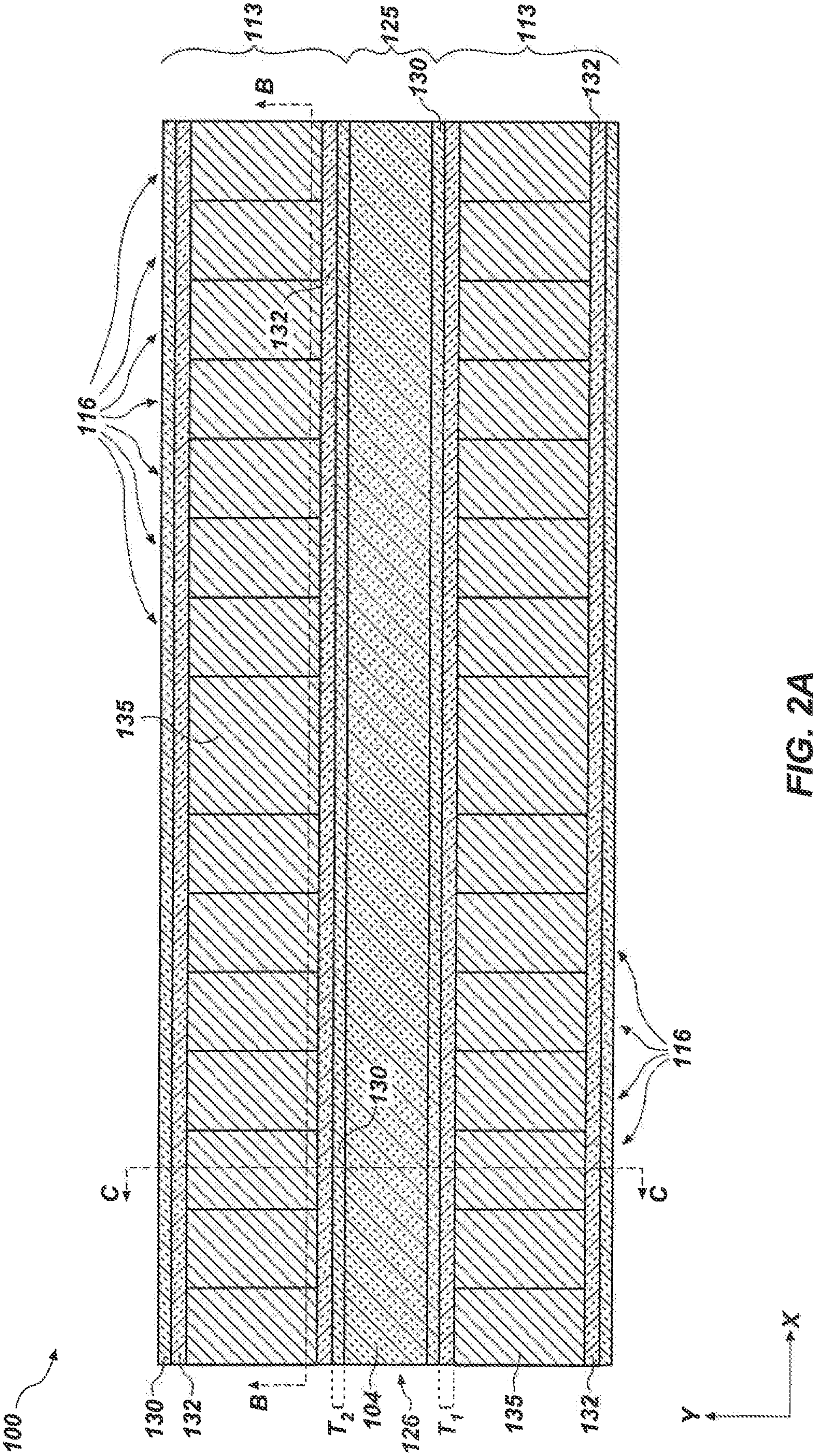
FIG. 2A through FIG. 2C are a partial top-down view (FIG. 2A) and simplified, partial cross-sectional views (FIG. 2B, FIG. 2C) of the microelectronic device structure at another processing stage of the method forming the microelectronic device structure following the processing stage of FIG. 1C through FIG. 1E.
Figure 2B:
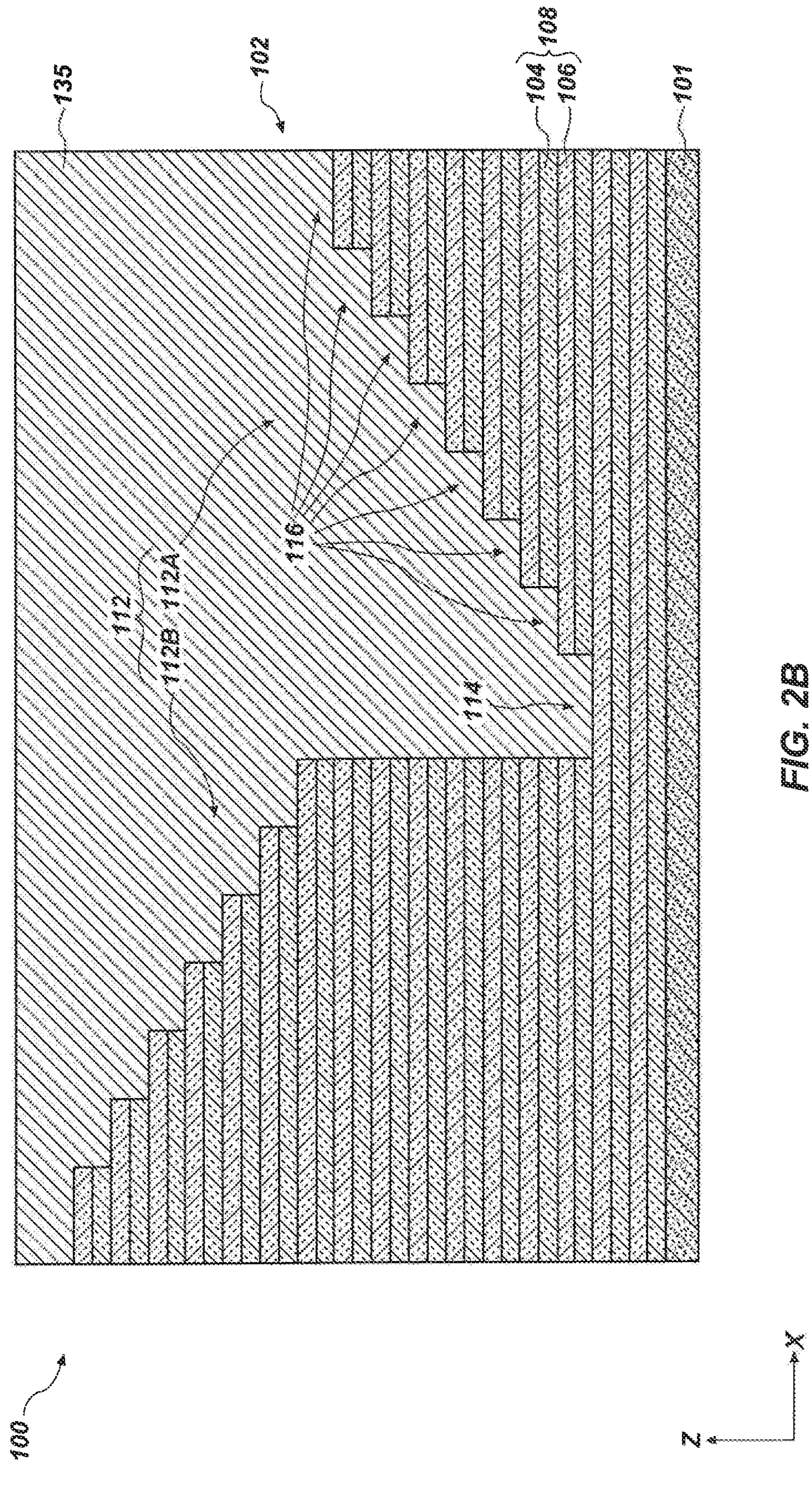
Figure 2C:
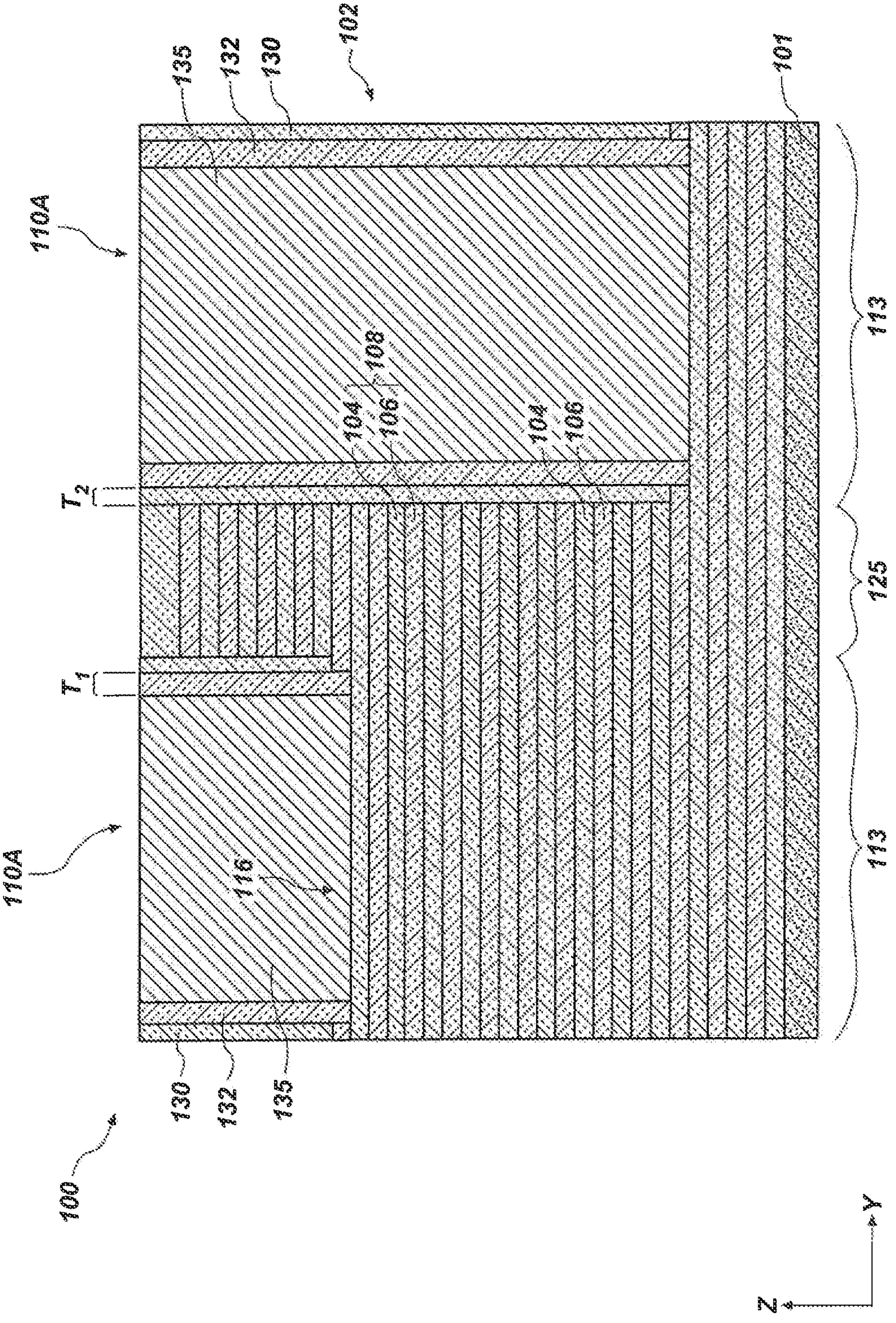

FIG. 2A a simplified, partial top-down view of the microelectronic device structure 100 illustrating the same view as that illustrated in FIG. 1C. FIG. 2B is a simplified, partial cross-sectional view of the microelectronic device structure 100 of FIG. 2A taken through section line B-B of FIG. 2A. FIG. 2C is a simplified, partial cross-sectional view of the microelectronic device structure 100 of FIG. 2A taken through section line C-C of FIG. 2A.

With reference to FIG. 2A and FIG. 2C, a first liner material 130 may be formed within the stadium structures 110 and may vertically extend (e.g., in the Z-direction) to the steps 116 of the stadium structures 110; and a second liner material 132 may be formed within the stadium structures 110 overlying the sidewalls of the first liner material 130 and may vertically extend (e.g., in the Z-direction) to the steps 116 of the stadium structures 110. The first liner material 130 and the second liner material 132 may be formed within the horizontal boundaries (e.g., in the X-direction, in the Y-direction) of the rows 113 of the stadium structures 110.

In some embodiments, the first liner material 130 and the second liner material 132 vertically extend (e.g., in the Z-direction) to the steps 116. Accordingly, a vertical height (e.g., in the Z-direction) of the first liner material 130 and the second liner material 132 may at least partially depend on the step 116 to which the first liner material 130 and the second liner material 132 extend. In other words, the vertical height of the first liner material 130 and the second liner material 132 within the horizontal boundaries (e.g., in the X-direction, in the Y-direction) of a particular step 116 may be based on the vertical height (e.g., in the Z-direction) of the particular step 116 (e.g., the first liner material 130 and the second liner material 132 may extend from the vertically uppermost (e.g., in the Z-direction) insulative structure 104 to the particular step 116).

In some embodiments, a thickness $T_1$ (FIG. 2A, FIG. 2C) of the second liner material 132 is greater than a thickness $T_2$ (FIG. 2A, FIG. 2C) of the first liner material 130. As described in further detail herein, the thickness $T_1$ of the second liner material 132 may determine a margin for forming conductive contact structures (conductive contact structures 156 (FIG. 5A, FIG. 5B)). For example, as described in further detail herein, at least a portion of the second liner material 132 may be replaced with a conductive material to form conductive contact structures during a gate replacement process.

The thickness $T_1$ of the second liner material 132 may be within a range of from about 50 nm to about 150 nm, such as from about 50 nm to about 75 nm, from about 75 nm to about 100 nm, from about 100 nm to about 125 nm, or from about 125 nm to about 150 nm. In some embodiments, the thickness $T_1$ of the second liner material 132 is within a range of from about 90 nm to about 110 nm, such as about 100 nm. In some embodiments, the thickness $T_1$ of the second liner material 132 may be about the same as the vertical thickness (e.g., in the Z-direction) of the sacrificial structures 106 between vertically neighboring (e.g., in the Z-direction) insulative structures 104.

The thickness $T_2$ of the first liner material 130 may be within a range of from about 30 nm to about 70 nm, such from about 30 nm to about 50 nm, or from about 50 nm to about 70 nm. In some embodiments, the thickness $T_2$ of the first liner material 130 is within a range of from about 40 nm to about 60 nm, such as about 50 nm.

The first liner material 130 may be formed of and include insulative material, such as one or more of the materials described above with reference to the insulative structures 104. In some embodiments, the first liner material 130 comprises substantially the same material composition as the insulative structures 104. In some embodiments, the first liner material 130 comprises silicon dioxide.

The second liner material 132 may exhibit an etch selectivity with respect to the first liner material 130 and the insulative structures 104. The second liner material 132 may be formed of and include one or more of the materials described above with reference to the sacrificial structures 106. In some embodiments, the second liner material 132 comprises substantially the same material composition as the sacrificial structures 106. In some embodiments, the second liner material 132 comprises silicon nitride.

In some embodiments, after forming the first liner material 130, horizontally extending portions (e.g., in the X-direction, in the Y-direction) of the first liner material 130 are selectively removed from portions of the microelectronic device structure 100, such as from over the steps 116 of the stadium structures 110. Similarly, after forming the second liner material 132, horizontally extending portions (e.g., in the X-direction, in the Y-direction) of the second liner material 132 are selectively removed from portions of the microelectronic device structure 100, such as from over the steps 116 of the stadium structures 110. In some embodiments, the exposed sacrificial structure 106 on each step 116 is removed substantially concurrently with removal of the horizontally extending portions of the second liner material 132 to expose the underlying tier 108 of the insulative structures 104.

With continued reference to FIG. 2A through FIG. 2C, after forming the first liner material 130 (FIG. 2A, FIG. 2C) and the second liner material 132 (FIG. 2A, FIG. 2C), an insulative material 135 is formed over the steps 116 of the stadium structures 110. The insulative material 135 may be formed of and include one more or more of the materials described above with reference to the insulative structures 104. In some embodiments, the insulative material 135 comprises substantially the same material composition as the first liner material 130. In some embodiments, the insulative material 135 comprises silicon dioxide.

Figure 3A:
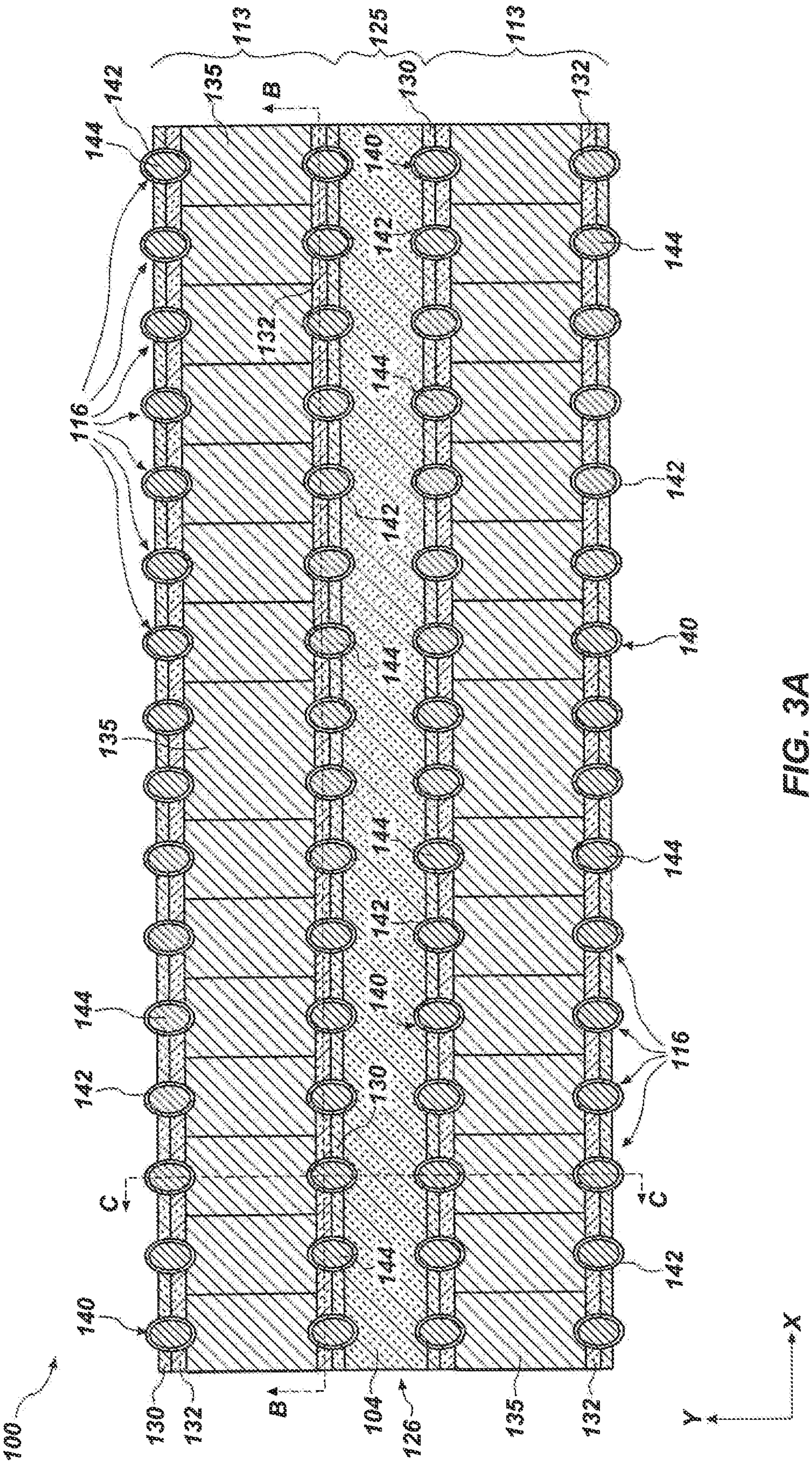
FIG. 3A through FIG. 3C are a partial top-down view (FIG. 3A) and simplified, partial cross-sectional views (FIG. 3B, FIG. 3C) of the microelectronic device structure at another processing stage of the method forming the microelectronic device structure following the processing stage of FIG. 2A through FIG. 2D.
Figure 3B:
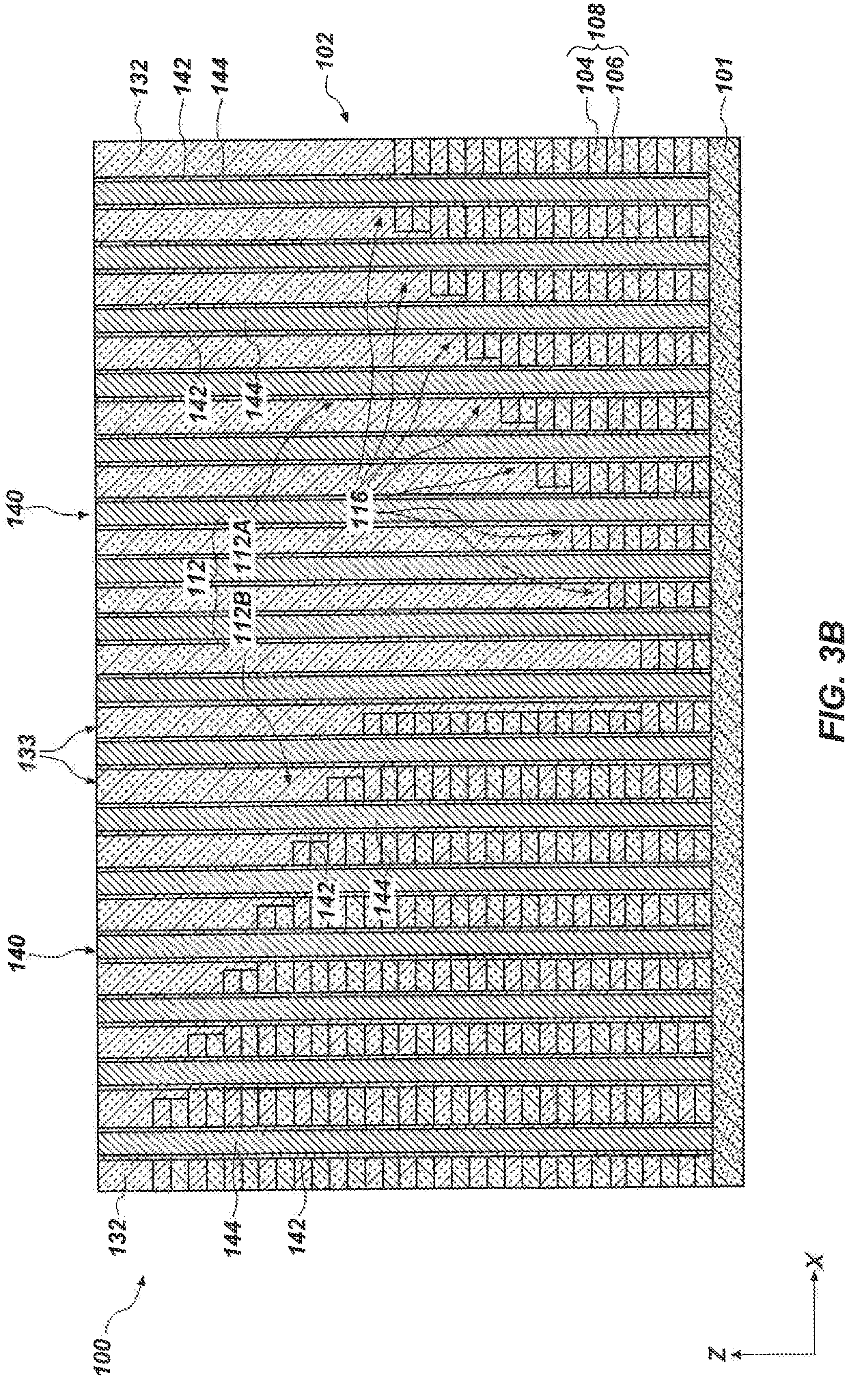
Figure 3C:
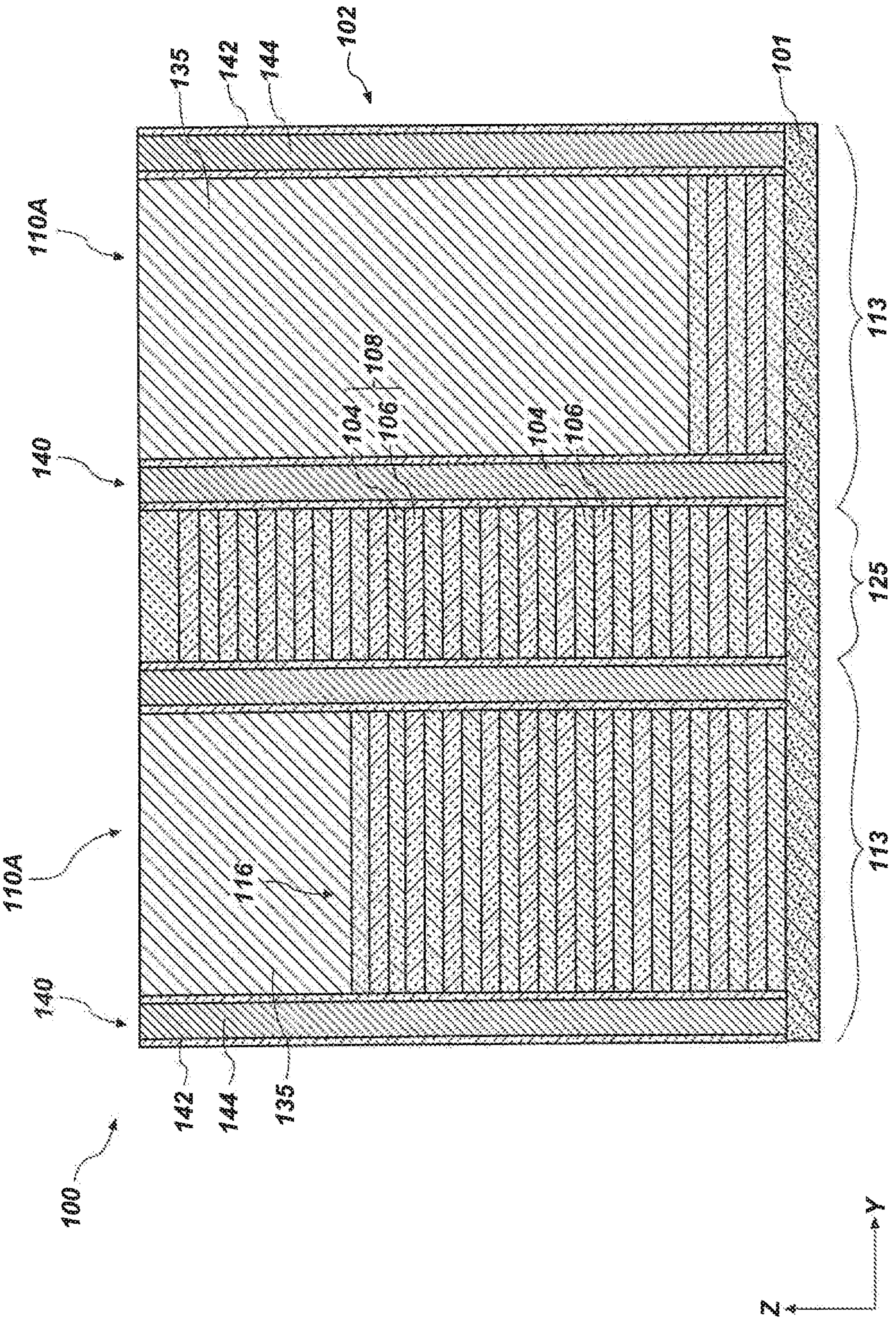

Referring next to FIG. 3A through FIG. 3C, which are a simplified, partial top-down view (FIG. 3A) and simplified, partial cross-sectional views (FIG. 3B and FIG. 3C) of the microelectronic device structure 100 following the processing stage previously described with reference to FIG. 2A through FIG. 2C, pillar structures 140 (e.g., contact structures, interconnect structures) may be formed within horizontal areas of the stadium structures. FIG. 3B is a simplified partial cross-sectional view of the microelectronic device structure 100 taken through section line B-B of FIG. 3A. FIG. 3C is a simplified partial cross-sectional view of the microelectronic device structure 100 taken through section line C-C of FIG. 3A.

With collective reference to FIG. 3A through FIG. 3C, after forming the first liner material 130, the second liner material 132, and the insulative material 135, the pillar structures 140 may be formed within the horizontal areas of the stadium structures 110. The pillar structures 140 may each individually be located within horizontal boundaries (e.g., in the X-direction, in the Y-direction) of a step 116 and may individually vertically extend (e.g., in the Z-direction) through the preliminary stack structure 102 and to the source structure 101.

In some embodiments, the pillar structures 140 individually vertically extend (e.g., in the Z-direction) through the second liner material 132 within the horizontal boundaries (e.g., in the X-direction, in the Y-direction) of the stadium structures 110. With reference to FIG. 3A and FIG. 3B, forming the pillar structures 140 may isolate portions of the second liner material 132 within the horizontal boundaries of the stadium structures 110. The isolated portions of the second liner material 132 within horizontal boundaries (e.g., in the X-direction, in the Y-direction) of a particular step 116 may be separated from one another by a horizontally intervening (e.g., in the X-direction) pillar structure 140 located within the horizontal boundaries of the step 116. In some embodiments, each pillar structure 140 is individually located within horizontal boundaries (e.g., in the X-direction) of a particular step 116. In some embodiments, each pillar structure 140 is individually horizontally centrally located (e.g., in the X-direction) within a particular step 116 (e.g., centrally located between the horizontal edges (e.g., in the X-direction) of a first step 116 and the horizontal edges of the step 116 through which the pillar structure 140 vertically extends).

The pillar structures 140 may each individually comprise a first material 144 vertically extending through the preliminary stack structure 102 and to the source structure 101, and a liner material 142 on sidewalls (e.g., vertically extending surfaces) of the first material 144. The liner material 142 may substantially surround (e.g., substantially horizontally and vertically cover) sidewalls of the first material 144. In some embodiments, at least some of the pillar structures 140 are in electrical communication with a structure (e.g., a CMOS structure) underlying the source structure 101.

The first material 144 may be formed of and include at least one conductive material, such as such as one or more of at least one metal (e.g., W, Ti, Mo, Nb, V, Hf, Ta, Cr, Zr, Fe, Ru, Os, Co, Rh, Jr, Ni, Pd, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), at least one conductive metal-containing material (e.g., a conductive metal nitride, a conductive metal silicide, a conductive metal carbide, a conductive metal oxide), and at least one conductively-doped semiconductor material (e.g., conductively-doped Si, conductively-doped Ge, conductively-doped SiGe). In some embodiments, the first material 144 of each of the pillar structures 140 has substantially the same material composition.

In other embodiments, the first material 144 is formed of and includes at least one insulative material. In some such embodiments, the first material 144 is formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first material 144 comprise silicon dioxide. In some embodiments, such as where the first material 144 comprises an insulative material, the microelectronic device structure 100 does not include the liner material 142 on sidewalls of the first material 144 and the pillar structures 140 may comprise only the first material 144 (e.g., the insulative material).

The pillar structures 140 may each individually exhibit a desired geometric configuration (e.g., dimensions and shape) and spacing. The geometric configurations and spacing of the pillar structures 140 may be selected at least partially based on the configurations and positions of other components (e.g., the steps 116 of the staircase structures 112, conductive contact structures to be formed in contact with the steps 116 of the staircase structures 112, the source structure 101) of the microelectronic device structure 100. For example, the pillar structures 140 may each individually have a geometric configuration and spacing permitting the pillar structure 140 to vertically-extend (e.g., in the Z-direction) through the preliminary stack structure 102 and physically contact (e.g., land on) a structure of the source structure 101 to facilitate a predetermined function (e.g., an electrical interconnection function, a support function) of the pillar structure 140. In other embodiments, the pillar structures 140 do not include an electrical interconnection function and serve primarily (e.g., only) a support function. Each of the pillar structures 140 may exhibit substantially the same geometric configuration (e.g., the same dimensions and the same shape) and horizontal spacing (e.g., in the X-direction) as each of the other pillar structures 140, or at least some of the pillar structures 140 may exhibit a different geometric configuration (e.g., one or more different dimensions, a different shape) and/or different horizontal spacing than at least some other of the pillar structures 140. In some embodiments, the pillar structures 140 are at least partially uniformly spaced in the X-direction and in the Y-direction.

The pillar structures 140 may serve as support structures during and/or after the formation of one or more components of the microelectronic device structure 100. For example, the pillar structures 140 may serve as support structures for the formation of conductive structures (e.g., conductive structures 146 (FIG. 5B, FIG. 5C)) during at least partial replacement of the sacrificial structures 106 to form the conductive structures, as will be described herein. The pillar structures 140 may impede (e.g., substantially prevent) tier collapse during the selective removal of the sacrificial structures 106.

The liner material 142 may be horizontally interposed between each of the first materials 144 of the pillar structures 140 and the tiers 108 (including the insulative structures 104 and the sacrificial structures 106 thereof) of the preliminary stack structure 102.

The liner material 142 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner material 142 comprises $SiO_2$. In some embodiments, the liner material 142 has a different material composition than one or both of the insulative structures 104 and the first liner material 130. In other embodiments, the liner material 142 has the same material composition as one or both of the insulative structures 104 and the first liner material 130. In some embodiments, the liner material 142 comprises a material composition that is not substantially removed responsive to exposure to etch chemistries formulated and configured to remove silicon nitride.

Figure 4A:
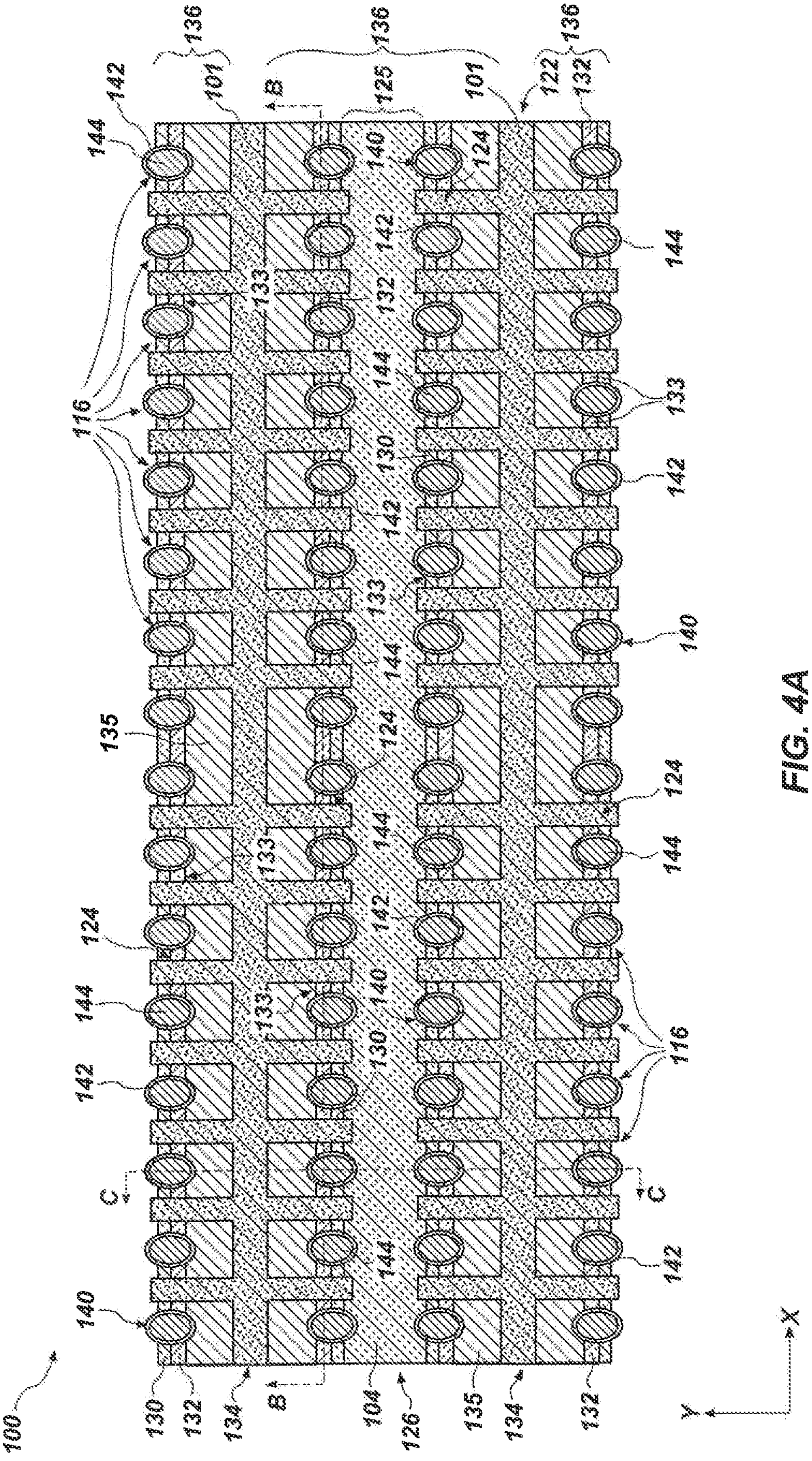
FIG. 4A through FIG. 4C are a partial top-down view (FIG. 4A) and simplified, partial cross-sectional views (FIG. 4B, FIG. 4C) of the microelectronic device structure at another processing stage of the method forming the microelectronic device structure following the processing stage of FIG. 3A through FIG. 3C.
Figure 4B:
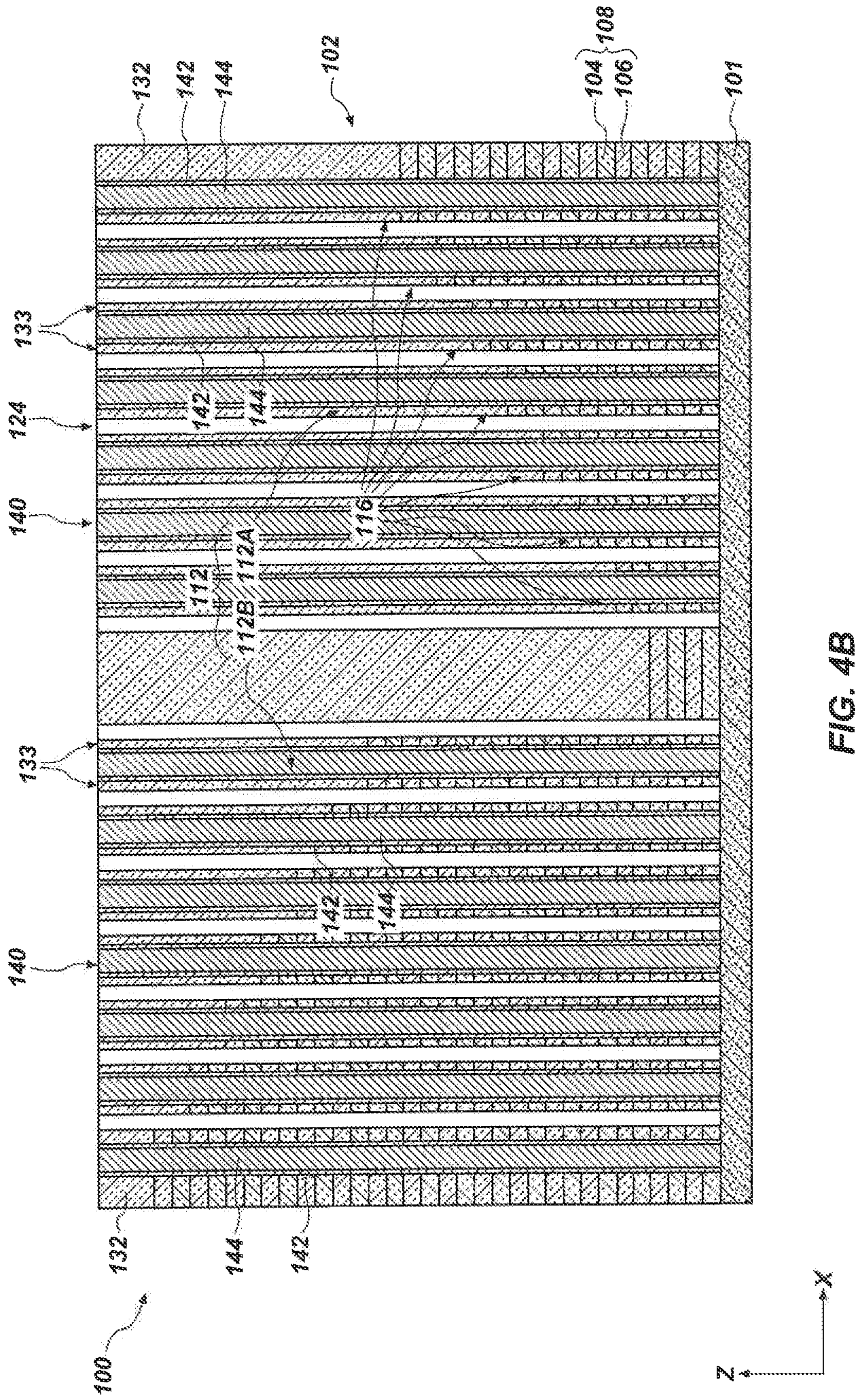
Figure 4C:
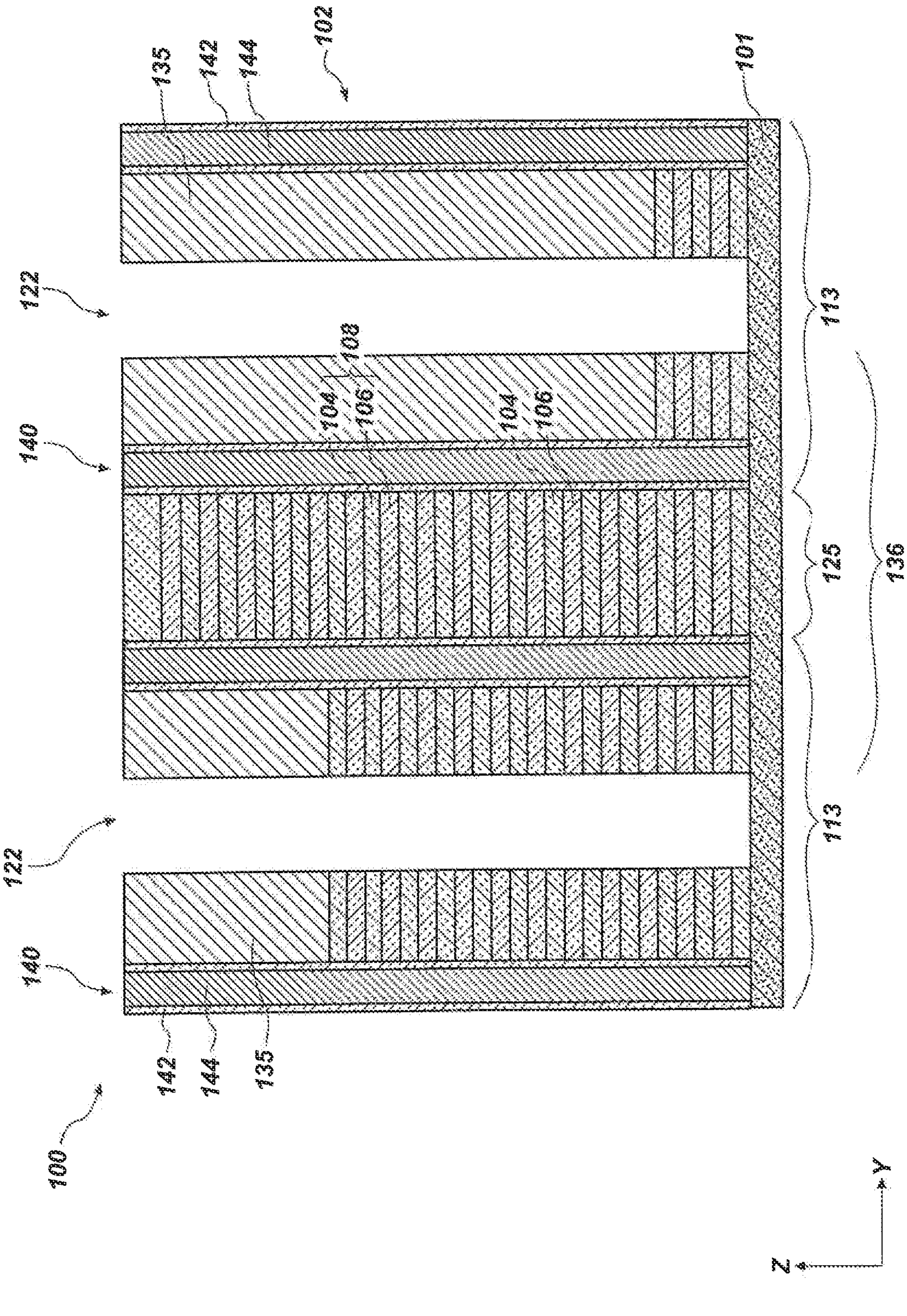

FIG. 4A through FIG. 4C are a simplified, partial top-down view (FIG. 4A) and simplified partial cross-sectional views (FIG. 4B and FIG. 4C), of the microelectronic device structure 100 following the processing stage previously described with reference to FIG. 3A through FIG. 3C. FIG. 4B is a simplified partial cross-sectional view of the microelectronic device structure 100 taken through section line B-B of FIG. 4A. FIG. 4C is a simplified partial cross-sectional view of the microelectronic device structure 100 taken through section line C-C of FIG. 4A.

With collective reference to FIG. 4A through FIG. 4C, after forming the pillar structures 140, a slot 134 (also referred to as a "replacement gate slot") (e.g., trench) may be formed at least partially within the staircase structures 112 of the stadium structures 110 to form block structures 136 (also referred to as "dielectric block structures") within the rows of the stadium structures 110. In some embodiments, the block structures 136 are horizontally spaced (e.g., in the Y-direction) from one another by at least a portion of a slot 134, such as a central portion 122 of a slot 134.

The slots 134 may be formed by forming a mask material over the rows 113 of the stadium structures 110 and removing the first liner material 130, the second liner material 132, and the tiers 108 of the insulative structures 104 and the sacrificial structures 106 exposed through the mask material to form the block structures 136.

In some embodiments, each block structure 136 includes a bridge structure 126 in a horizontally central (e.g., in the Y-direction) of the block structure 136 and steps 116 of staircase structures 112 horizontally neighboring (e.g., in the Y-direction) each horizontal boundary (e.g., in the Y-direction) of the bridge structure 126.

In some embodiments, the slots 134 each individually include a horizontally central (e.g., in the Y-direction) portion 122 and horizontally extending portions 124 horizontally extending (e.g., in the Y-direction) from the horizontally central portion 122. A longitudinal axis of each of the horizontally extending portions 124 may be substantially perpendicular to a longitudinal axis of the central portion 122. In some embodiments, the slot 134 may exhibit a so-called "zipper" shape and the horizontally extending portions 124 may be referred to as "teeth" of the zipper. Accordingly, the slots 134 each individually exhibit a zipper shape including the central portion 122 and the horizontally extending portions 124 extending from the central portion 122.

The horizontally central portion 122 of the slot 134 is horizontally between (e.g., in the Y-direction) horizontally neighboring (e.g., in the Y-direction) block structures 136 of the stadium structures 110 and the horizontally central portion 122 is located outside of the horizontal boundaries (e.g., in the Y-direction) of the block structures 136. In some embodiments, the horizontally central portion 122 of the slots 134 may be located horizontally between (e.g., in the Y-direction) neighboring rows of the block structures 136. In some embodiments, the horizontally extending portions 124 each individually extend from the horizontally central portion 122 to horizontal boundaries (e.g., in the Y-direction) of the bridge region 125. Thus, in some embodiments, the horizontally extending portions 124 extend through the block structures 136, such as through the forward staircase structures 112A and the reverse staircase structures 112B of the stadium structures 110, and to the bridge region 125.

In some embodiments, each of the horizontally extending portions 124 individually horizontally extends (e.g., in the X-direction, in the Y-direction) through horizontal edges (e.g., in the Y-direction) of the steps 116 and horizontally extends (e.g., in the X-direction) over and between two horizontally neighboring (e.g., in the X-direction) steps 116. In some embodiments, the horizontally extending portions 124 are individually horizontally centered (e.g., in the X-direction) between horizontally neighboring (e.g., in the X-direction) steps 116. In some embodiments, each of the horizontally extending portion 124 are located along a horizontal edge (e.g., in the X-direction) of a step 116. In some embodiments, each pillar structure 140 is located horizontally between (e.g., in the X-direction) horizontally neighboring (e.g., in the X-direction) horizontally extending portion 124.

With continued reference to FIG. 4A through FIG. 4C, removing the portions of the preliminary stack structure 102, the first liner material 130, and the second liner material 132 to form the slots 134 exposes portions of the source structure 101. In other words, the source structure 101 may be exposed through the slots 134.

The slots 134 may be formed by removing portions of the first liner material 130, the second liner material 132, the insulative material 135, and portions of the tiers 108 of the insulative structures 104 and the sacrificial structures 106, such as by exposing the preliminary stack structure 102 to one or more of carbon tetrafluoride ($CF_4$), trifluoromethane ($CHF_3$), octafluorocyclobutane ($C_4F_8$), chlorine trifluoride ($ClF_3$), sulfur hexafluoride ($SF_6$), ammonia ($NH_3$), nitrogen trifluoride ($NF_3$), hydrogen ($H_2$), and oxygen ($O_2$). However, the disclosure is not so limited and the portions of first liner material 130, the second liner material 132, and the tiers 108 of the preliminary stack structure 102 may be removed by one or more other materials.

With reference to FIG. 4A, in some embodiments, the horizontally extending portions 124 of the slots 134 isolate portions of the first liner material 130 and the second liner material 132 vertically overlying (e.g., in the Z-direction) different steps 116 of the staircase structures 112. In other words, portions of the first liner material 130 and the second liner material 132 within horizontal boundaries (e.g., in the X-direction, in the Y-direction) of a step 116 may be isolated from portions of the first liner material 130 and the second liner material 132 located within horizontal boundaries (e.g., in the X-direction, in the Y-direction) of a horizontally neighboring (e.g., in the X-direction) step 116. In some embodiments, the horizontally extending portions 124 of the slots 134 form isolated portions 133 of the second liner material 132. In some embodiments, two isolated portions 133 of the second liner material 132 are located within the horizontal boundaries (e.g., in the X-direction) and vertically over (e.g., in the Z-direction) of each step 116.

Although FIG. 4A illustrates only two slots 134 and portions of three block structures 136, the disclosure is not so limited. The microelectronic device structure 100 may include a plurality of (e.g., five, six, eight, more than eight) block structures 136, each separated from horizontally neighboring (e.g., in the Y-direction) block structures 136 by a slot 134. In other words, the slots 134 may divide the microelectronic device structure 100 into any desired number of block structures 136.

Figure 5A:
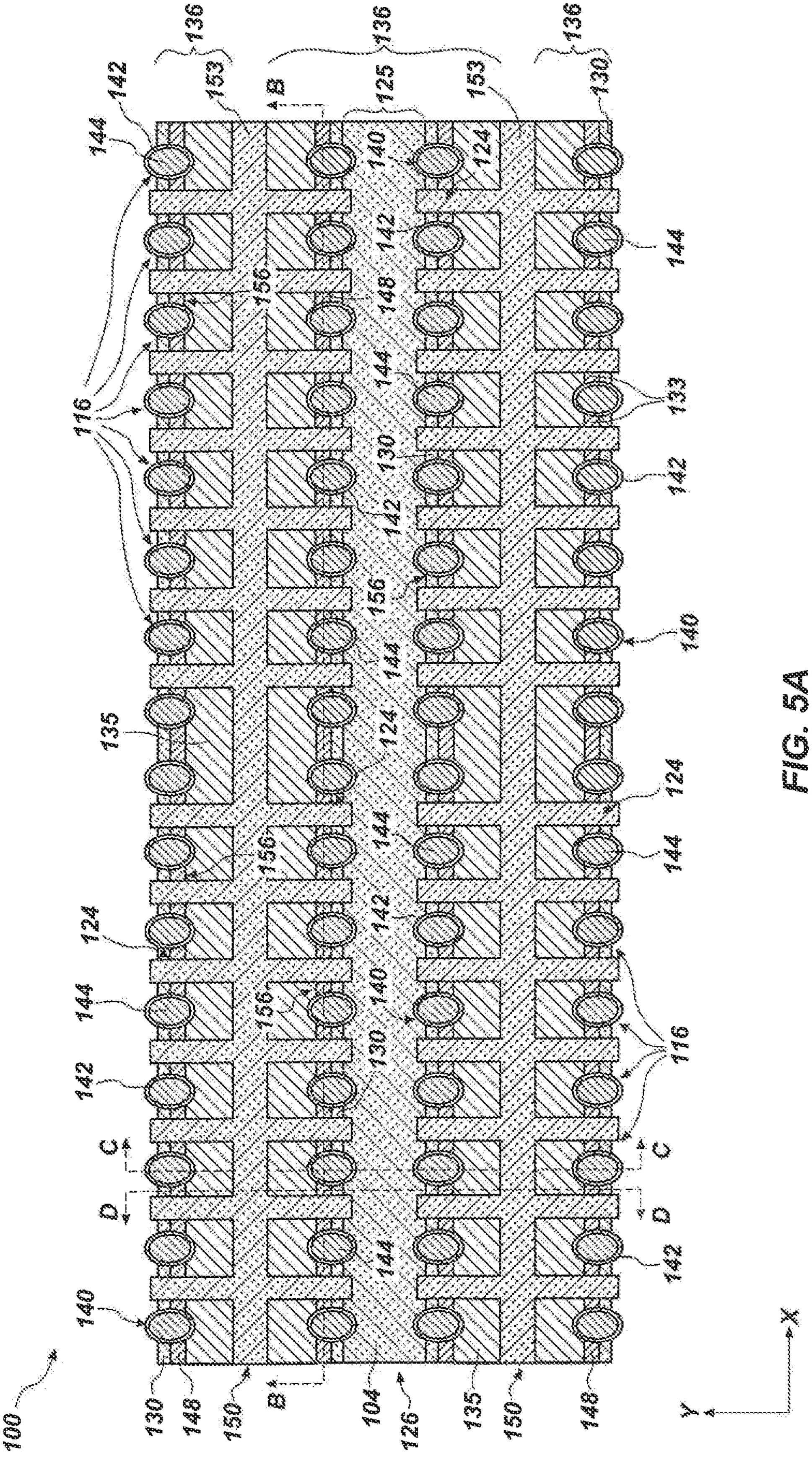
FIG. 5A through FIG. 5D are a partial top-down view (FIG. 5A) and simplified, partial cross-sectional views (FIG. 5B through FIG. 5D) of the microelectronic device structure at another processing stage of the method forming the microelectronic device structure following the processing stage of FIG. 4A through FIG. 4C.
Figure 5B:
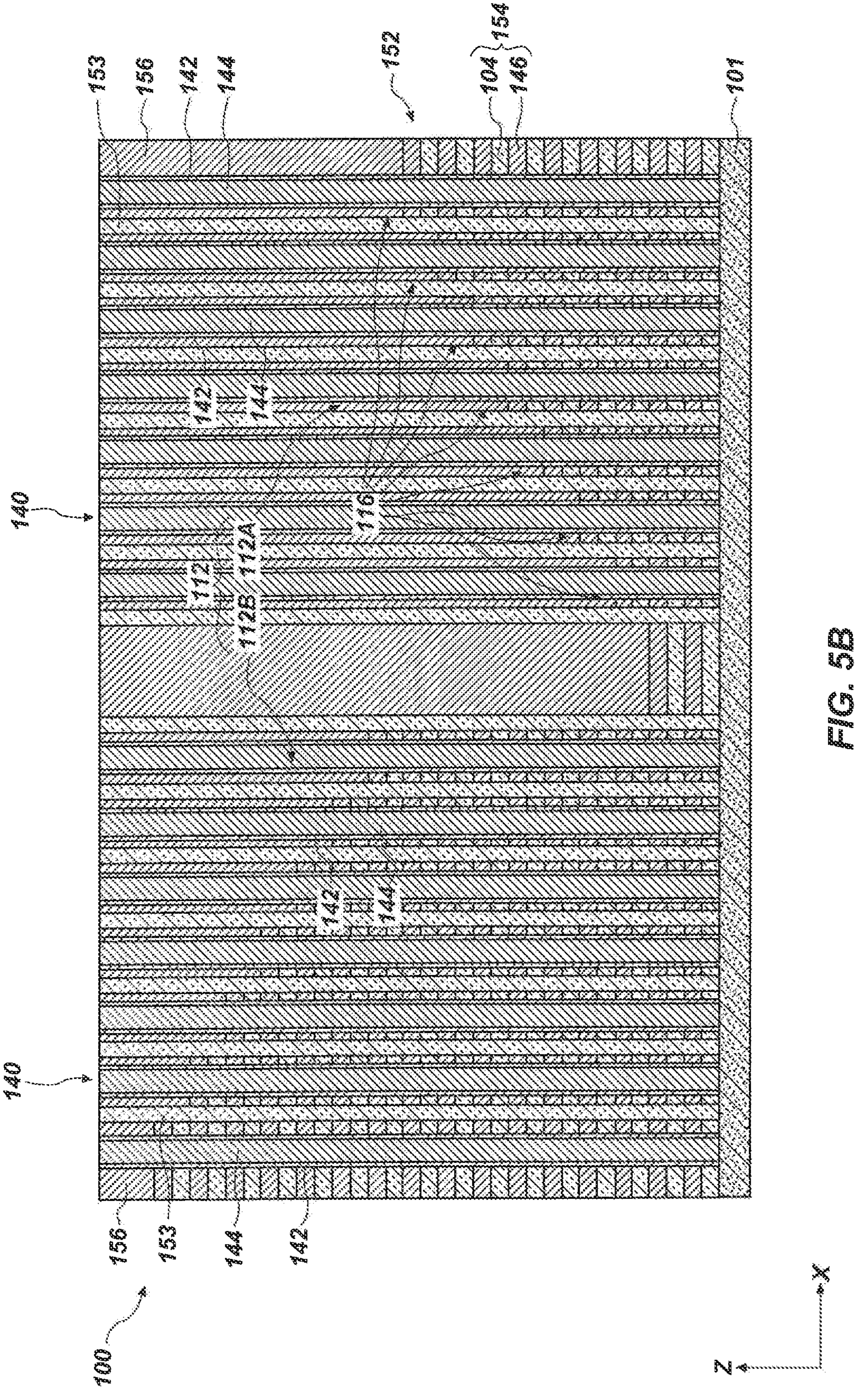
Figure 5C:
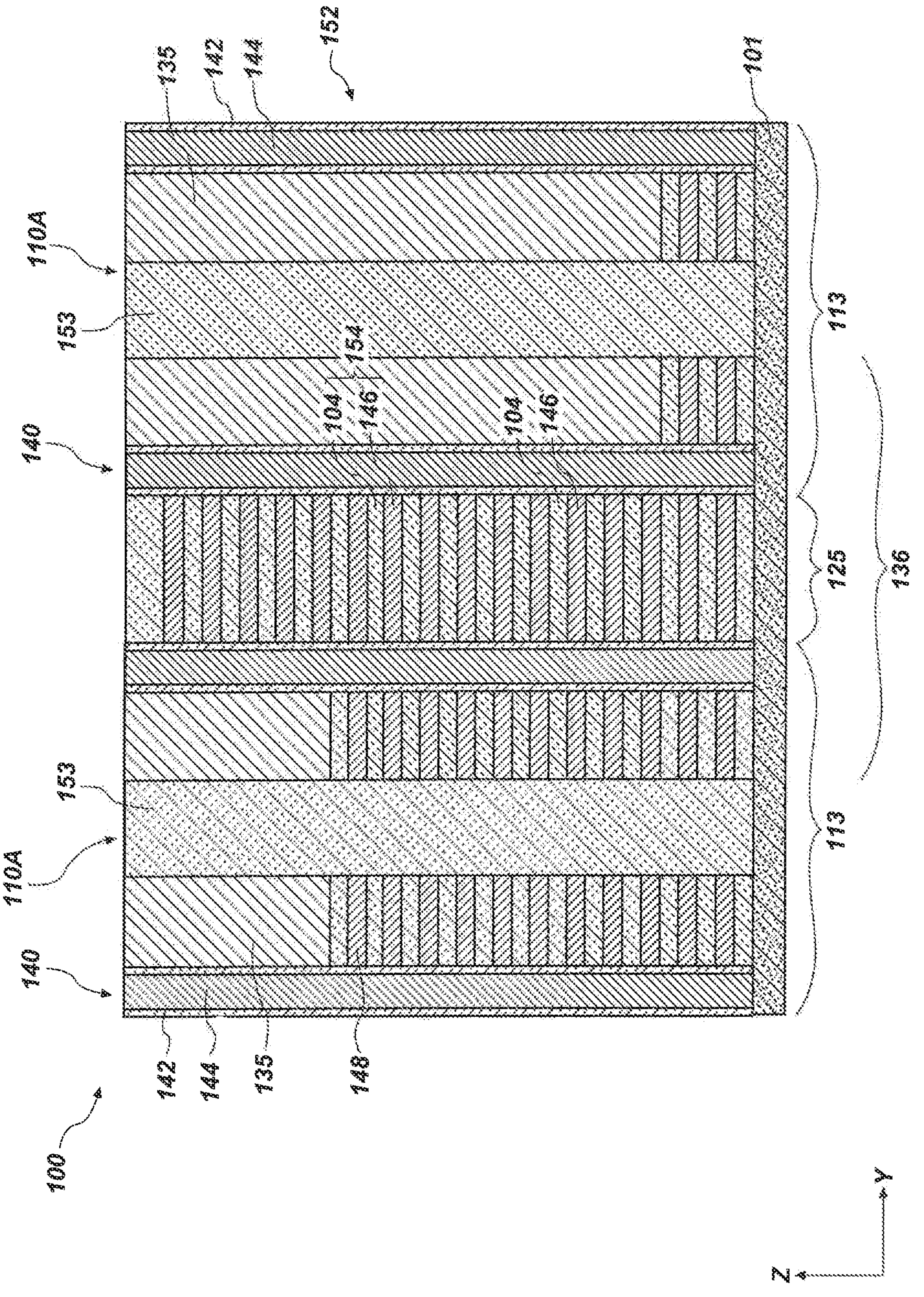
Figure 5D:
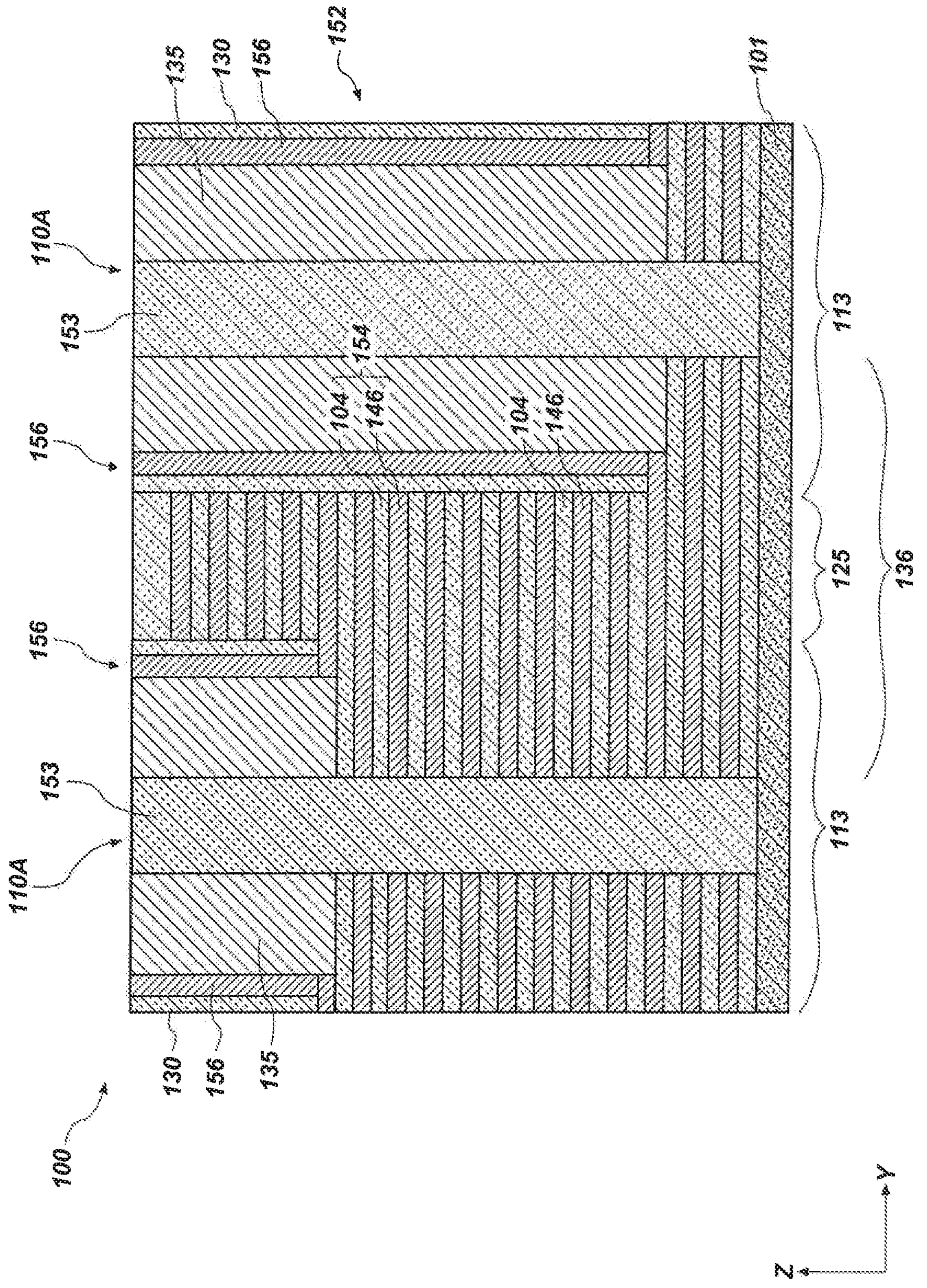

FIG. 5A through FIG. 5D are a simplified, partial top-down view (FIG. 5A) and simplified, partial cross-sectional views (FIG. 5B through FIG. 5D) of the microelectronic device structure 100 following the processing stage previously described with reference to FIG. 4A through FIG. 4C. FIG. 5B is a simplified partial cross-sectional view of the microelectronic device structure 100 taken through section line B-B of FIG. 5A. FIG. 5C is a simplified partial cross-sectional view of the microelectronic device structure 100 taken through section line C-C of FIG. 5A. FIG. 5D is a simplified partial cross-sectional view of the microelectronic device structure 100 taken through section line D-D of FIG. 5A.

With collective reference to FIG. 5A though FIG. 5D, the slots 134 (FIG. 4A) may facilitate at least partial replacement of the sacrificial structures 106 (FIG. 4B, FIG. 4C) to form conductive structures 146 comprising a conductive material 148 through so-called "replacement gate" or "gate last" processing acts.

The sacrificial structures 106 (FIG. 4B, FIG. 4C) may be selectively removed (e.g., exhumed) through the slots 134 (FIG. 4A). Spaces between vertically neighboring (e.g., in the Z-direction) insulative structures 104 may be filled with the conductive material 148 to form the conductive structures 146 and a stack structure 152 including tiers 154 of the insulative structures 104 and the conductive structures 146 comprising the conductive material 148. The conductive structures 146 may be located at locations corresponding to the locations of the sacrificial structures 106 removed through the slots 134.

At least one lower level of the conductive structures 146 of the stack structure 152 may be employed as at least one lower select gate (e.g., at least one source side select gate (SGS)) of the microelectronic device structure 100. In some embodiments, a single (e.g., only one) conductive structures 146 of a vertically lowermost tier 154 of the stack structure 152 is employed as a lower select gate (e.g., a SGS) of the microelectronic device structure 100. In addition, upper conductive level(s) of the conductive structures 146 of the stack structure 152 may be employed as upper select gate(s) (e.g., drain side select gate(s) (SGDs)) of the microelectronic device structure 100. In some embodiments, horizontally-neighboring conductive structures 146 of a vertically uppermost tier 154 of the stack structure 152 (e.g., separated from each other by additional slots 134) are employed as upper select gates (e.g., SGDs) of the microelectronic device structure 100. In some embodiments, more than one (e.g., two, four, five, six) conductive structures 146 are employed as an upper select gate (e.g., a SGD) of the microelectronic device structure 100.

The conductive material 148 of the conductive structures 146 may be formed of and include at least one conductive material, such as at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively-doped semiconductor material (e.g., conductively-doped polysilicon, conductively-doped germanium (Ge), conductively-doped silicon germanium (SiGe)), at least one conductive metal-containing material (e.g., a conductive metal nitride, a conductive metal silicide, a conductive metal carbide, a conductive metal oxide), or combinations thereof. In some embodiments, the conductive material 148 is formed of and include tungsten.

The conductive material 148 of each of the conductive structures 146 may individually include a substantially homogeneous composition, or a substantially heterogeneous composition. In some embodiments, the conductive material 148 of each of the conductive structures 146 of each of the tiers 154 of the stack structure 152 exhibits a substantially homogeneous composition. In additional embodiments, at least one of the conductive structures 146 of at least one of the tiers 154 of the stack structure 152 exhibits a substantially heterogeneous composition. The conductive material 148 may, for example, be formed of and include at least two different conductive materials. The conductive structures 146 of each of the tiers 154 of the stack structure 152 may each be substantially planar, and may each exhibit a desired thickness.

In some embodiments, a conductive liner material vertically intervenes (e.g., in the Z-direction) between the conductive material 148 of the conductive structures 146 and the vertically neighboring insulative structures 104. In some such embodiments, the conductive liner material is in contact with the insulative structures 104 and is located, for example, between the insulative structures 104 and the conductive material 148 of the conductive structures 146. The conductive liner material may be formed of and include, for example, a seed material from which the conductive structures 146 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride. In some embodiments, the conductive liner material comprises a first portion comprising a first material in contact with the insulative structures 104 and a second portion comprising a second material in contact with and between the first material and the conductive material 148. In some embodiments, the first material comprises aluminum oxide and the second material comprises titanium nitride.

In some embodiments, during replacement of the sacrificial structures 106 (FIG. 4B, FIG. 4C) through the slots 134 (FIG. 4A), the second liner material 132 (FIG. 4A, FIG. 4B) is replaced with the conductive material 148 to form isolated conductive contact structures 156 (also referred to as "conductive contact structures") comprising the conductive material 148 vertically extending (e.g., in the Z-direction). By way of non-limiting example, the second liner material 132 may be removed (e.g., exhumed) substantially concurrently with removal of the sacrificial structures 106 (FIG. 4B, FIG. 4C) through the slots 134.

With reference to FIG. 5A, in some embodiments, for each of the pillar structures 140, the microelectronic device structure 100 includes multiple (e.g., two, at least two) of the conductive contact structures 156. The conductive contact structures 156 may horizontally neighbor (e.g., in the X-direction) the pillar structures 140. In some embodiments, the pillar structure 140 within horizontal boundaries of a particular step 116 is horizontally between (e.g., in the X-direction) two conductive contacts 156 within the horizontal boundaries of the particular step 116. In some embodiments, and with reference to FIG. 5A and FIG. 5D, the conductive contact structures 156 are located at a horizontal boundary (e.g., in the Y-direction) of the steps 116.

In some embodiments, each step 116 of each staircase structure 112 of each block structure 136 includes two of the conductive contact structures 156 directly horizontally neighboring (e.g., in the Y-direction) each slot 134 (FIG. 4A). In other embodiments, every other step 116 includes two of the conductive contact structures 156 at a first horizontal end (e.g., in the Y-direction) and does not include conductive contact structures 156 at a second, opposite horizontal end (e.g., in the Y-direction) of the step 116.

With collective reference to FIG. 5B and FIG. 5D, the conductive contact structures 156 vertically extend (e.g., in the Z-direction) through the insulative material 135 and to the conductive material 148 of the conductive structures 146 of the steps 116. The conductive contact structures 156 may individually be in electrical communication with the conductive structures 146 of the step 116 that the particular conductive contact structures 156 vertically overlie (e.g., in the Z-direction). In some embodiments, the conductive contact structures 156 are in electrical communication with the conductive structures 146 of the steps 116 at the horizontal edges (e.g., in the Y-direction) of the steps 116. In some embodiments, each conductive structure 146 within a block structure 136 (FIG. 5A) is in electrical communication with at least two of the conductive contact structures 156.

In some embodiments, the conductive contact structures 156 comprise substantially the same material composition as the conductive structures 146. In some embodiments, the conductive contact structures 156 individually comprise tungsten.

With reference to FIG. 5A and FIG. 5C, after forming the conductive structures 46 (FIG. 5B, FIG. 5C) and the conductive contact structures 156 (FIG. 5A, FIG. 5B), the slots 134 (FIG. 4A) may be filled with an insulative material 153 to form slot structures 150 (also referred to as "dielectric slot structures") separating the horizontally neighboring (e.g., in the Y-direction) block structures 136. The insulative material 153 may be formed of and include insulative material, such as one or more of the materials described above with reference to the insulative structures 104. In some embodiments, the insulative material 153 comprises substantially the same material composition as the insulative structures 104. In some embodiments, the insulative material 153 comprises silicon dioxide.

Figure 6A:
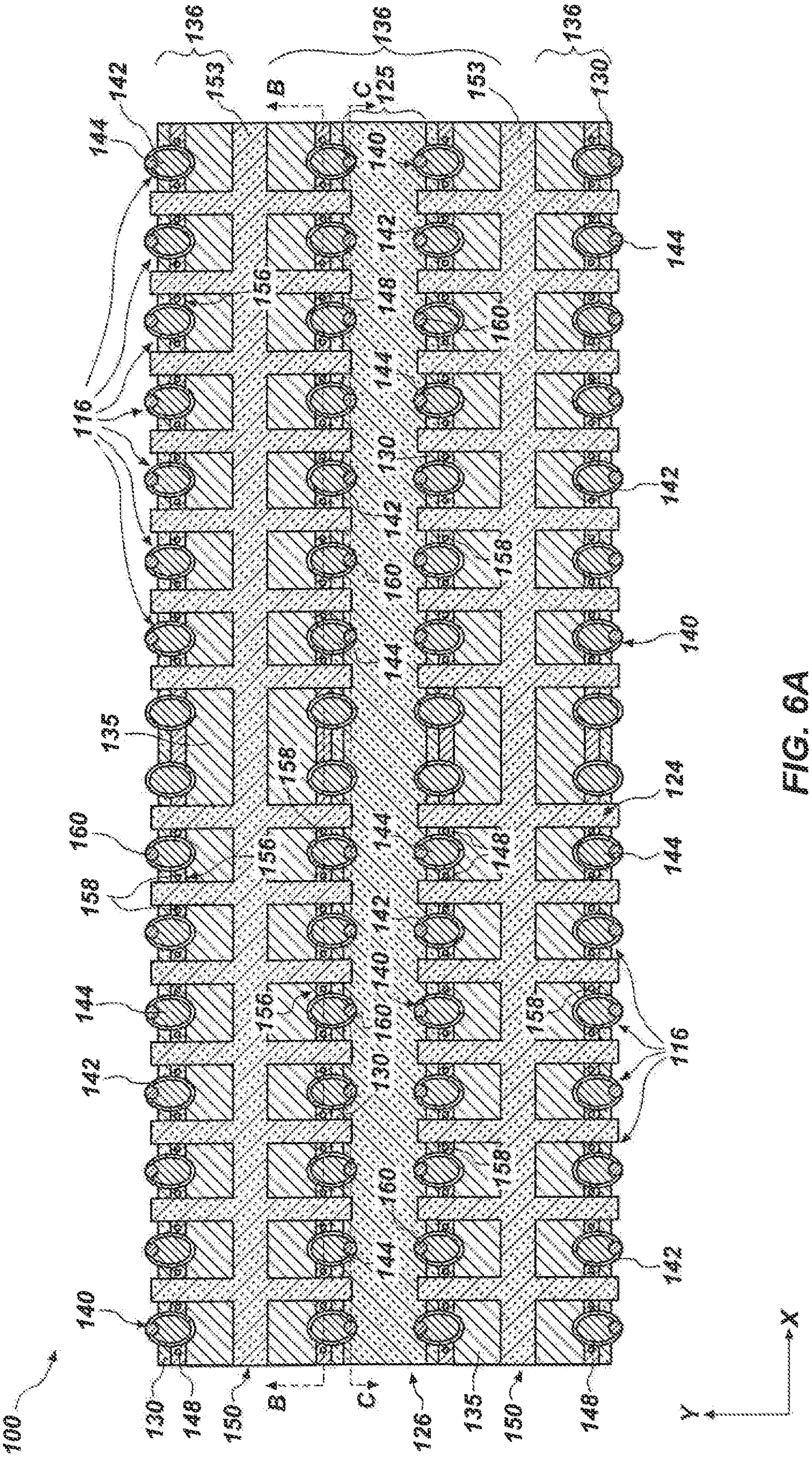
FIG. 6A through FIG. 6C are a partial top-down view (FIG. 6A) and a simplified, partial cross-sectional views (FIG. 6B, FIG. 6C) of the microelectronic device structure at another processing stage of the method forming the microelectronic device structure following the processing stage of FIG. 5A through FIG. 5D.
Figure 6B:
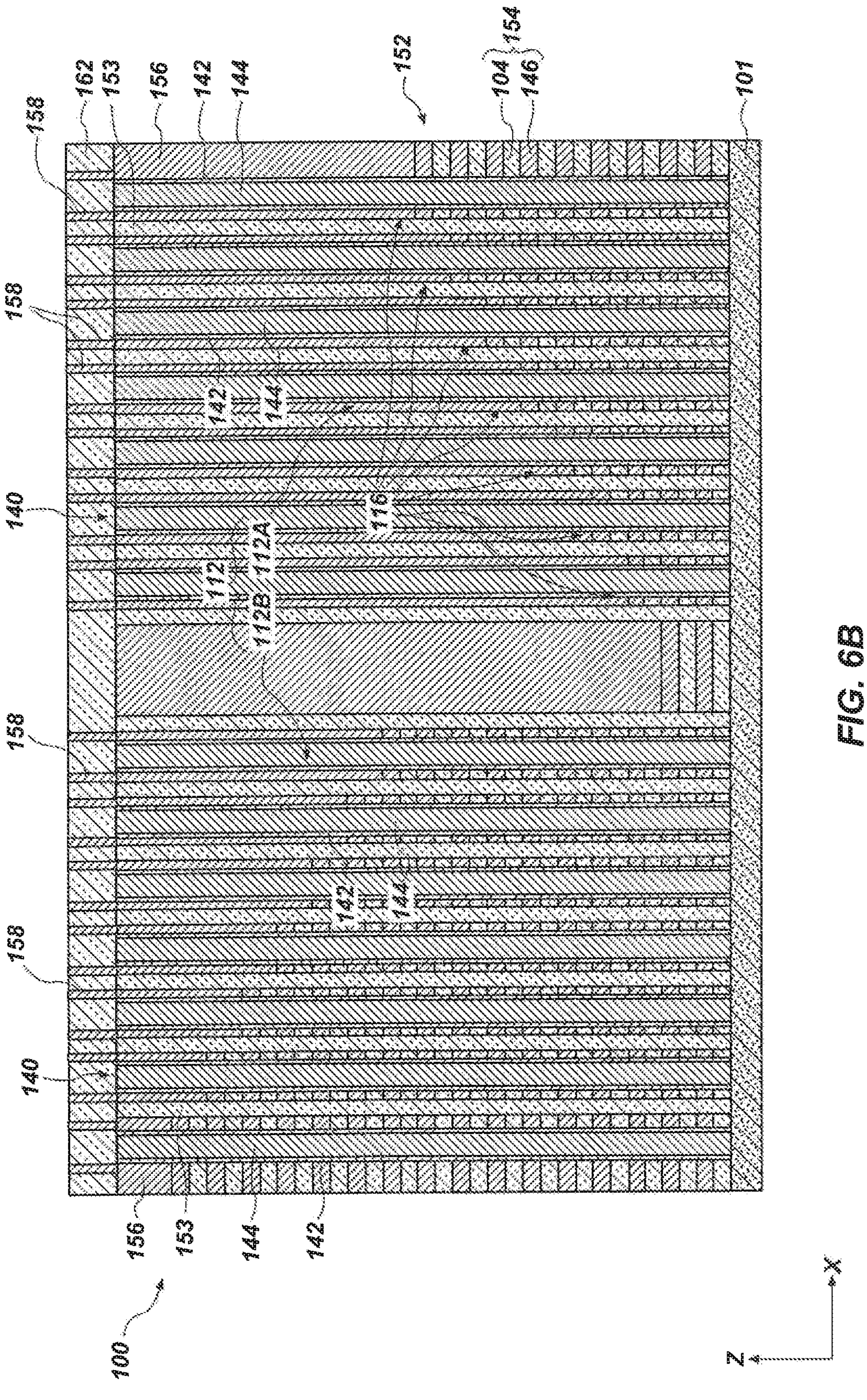
Figure 6C:
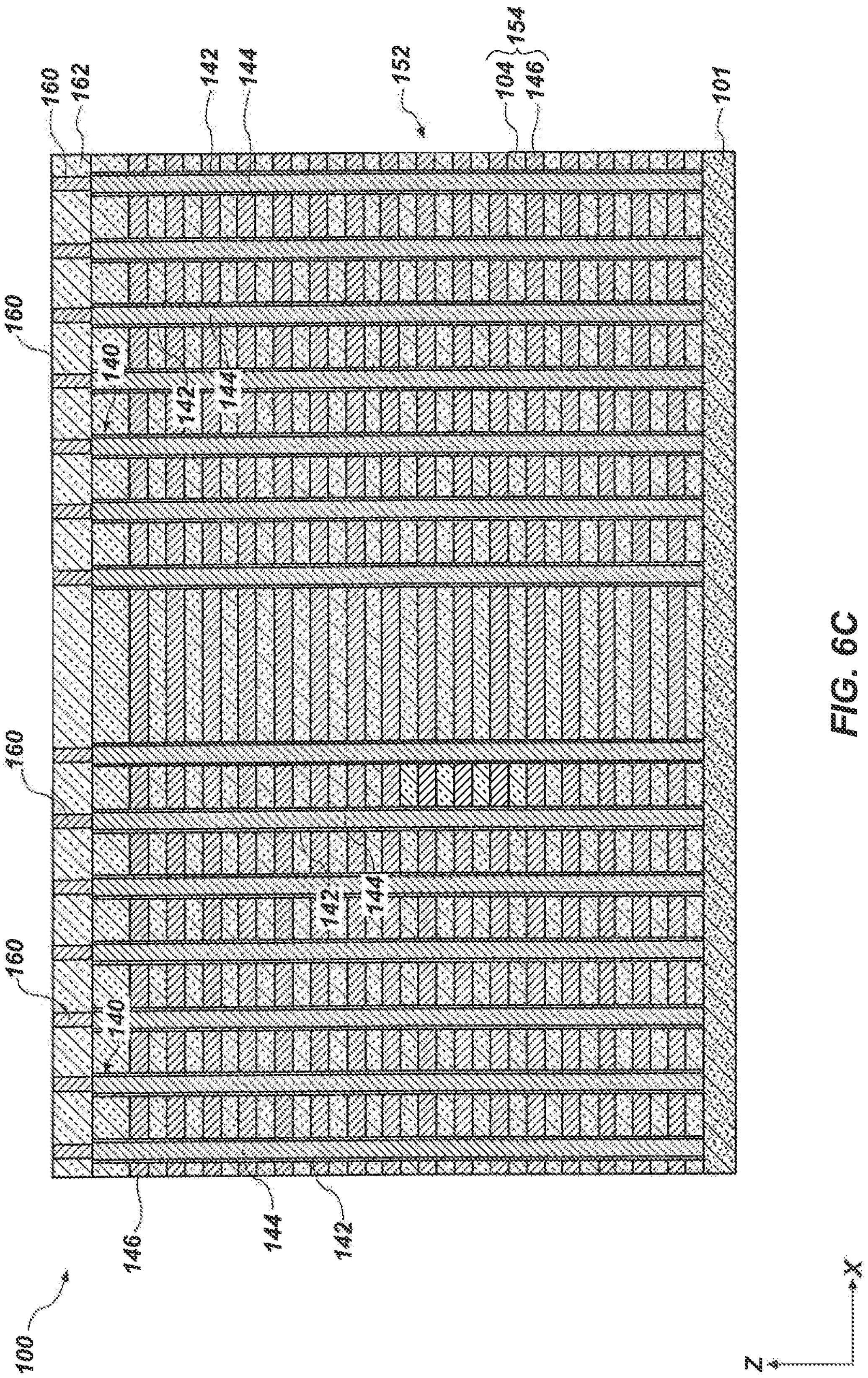

FIG. 6A is a simplified, partial top-down view of the microelectronic device structure 100 following the processing stage previously described with reference to FIG. 5A through FIG. 5C. FIG. 6B is a simplified, partial cross-sectional view of the microelectronic device structure 100 taken through section line B-B of FIG. 6A. FIG. 6C is a simplified, partial cross-sectional view of the microelectronic device structure 100 taken through section line C-C of FIG. 6A.

With collective reference to FIG. 6A through FIG. 6C, first conductive interconnect structures 158 (FIG. 6A, FIG. 6B) are formed in electrical communication with the conductive contact structures 156, and second conductive interconnect structures 160 (FIG. 6A, FIG. 6C) are formed in electrical communication with the first material 144 of the pillar structures 140. The first conductive interconnect structures 158 and the second conductive interconnect structures 160 may be formed within and electrically isolated from one another by a dielectric material 162. In some embodiments, the first conductive interconnect structures 158 are each individually horizontally aligned (e.g., in the Y-direction) with one another and horizontally offset (e.g., in the Y-direction, in the X-direction) from the second conductive interconnect structures 160.

In some embodiments, the first conductive interconnect structures 158 are configured to be in electrical communication with data lines (e.g., bit lines, digit lines). The first conductive interconnect structures 158 in electrical communication with an individual conductive structure 146 (e.g., by means of the conductive contact structures 156) may be in electrical communication with the same data line. The multiple first conductive interconnect structures 158 and the multiple conductive contact structures 156 facilitate redundancy in the formation of a conductive path between the conductive structures 146 and the data lines. In addition, the multiple first conductive interconnect structures 158 and the multiple conductive contact structures 156 reduces the electrical resistivity between the data lines and the conductive structures 146.

Each of the first conductive interconnect structures 158 and the second conductive interconnect structures 160 are individually formed of and include conductive material, such as one or more of the materials described above with reference to the conductive material 148. In some embodiments, the first conductive interconnect structures 158 and the second conductive interconnect structures 160 are individually formed of and include tungsten.

Although FIG. 1A through FIG. 6C have been described and illustrated as forming the conductive contact structures 156 by forming the pillar structures 140 through the first liner material 130 and the second liner material 132 and forming the slots 134 including the horizontally central portion 122 and the horizontally extending portions 124 through the portions of the first liner material 130 and the second liner material 132, the disclosure is not so limited. In other embodiments, the conductive contact structures 156 are formed by additional methods.

FIG. 7A through FIG. 12D are various views (described in further detail below) illustrating a microelectronic device structure at different processing stages of a method of forming a microelectronic device (e.g., a memory device, such as a 3D NAND Flash memory device), in accordance with additional embodiments of the disclosure. In FIG. 7A through FIG. 12D and the associated description, functionally similar features (e.g., structures, materials) to those of FIG. 1A through FIG. 6C are referred to with similar reference numerals incremented by 100. To avoid repetition, not all features shown in FIG. 7A through FIG. 12D are described in detail herein. Rather, unless described otherwise below, a feature designated by a reference numeral that is a 100 increment of the reference numeral of a previously described feature will be understood to be substantially similar to the previously described feature.

Figure 7A:
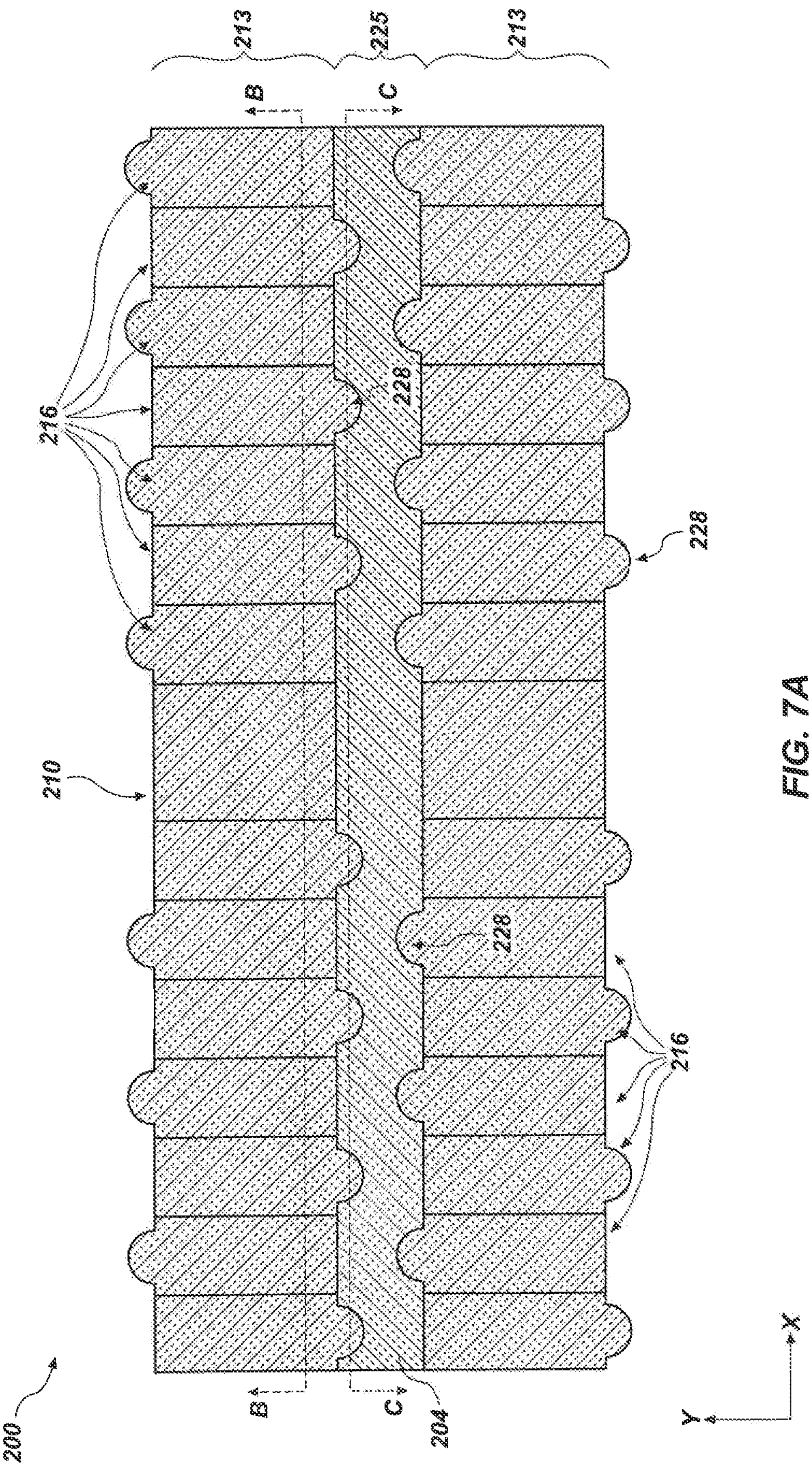
FIG. 7A through FIG. 7C are a simplified, partial top-down view (FIG. 7A) and a simplified, partial cross-sectional views (FIG. 7B, FIG. 7C) at a processing stage of a method of forming a microelectronic device, in accordance with embodiments of the disclosure.
Figure 7B:
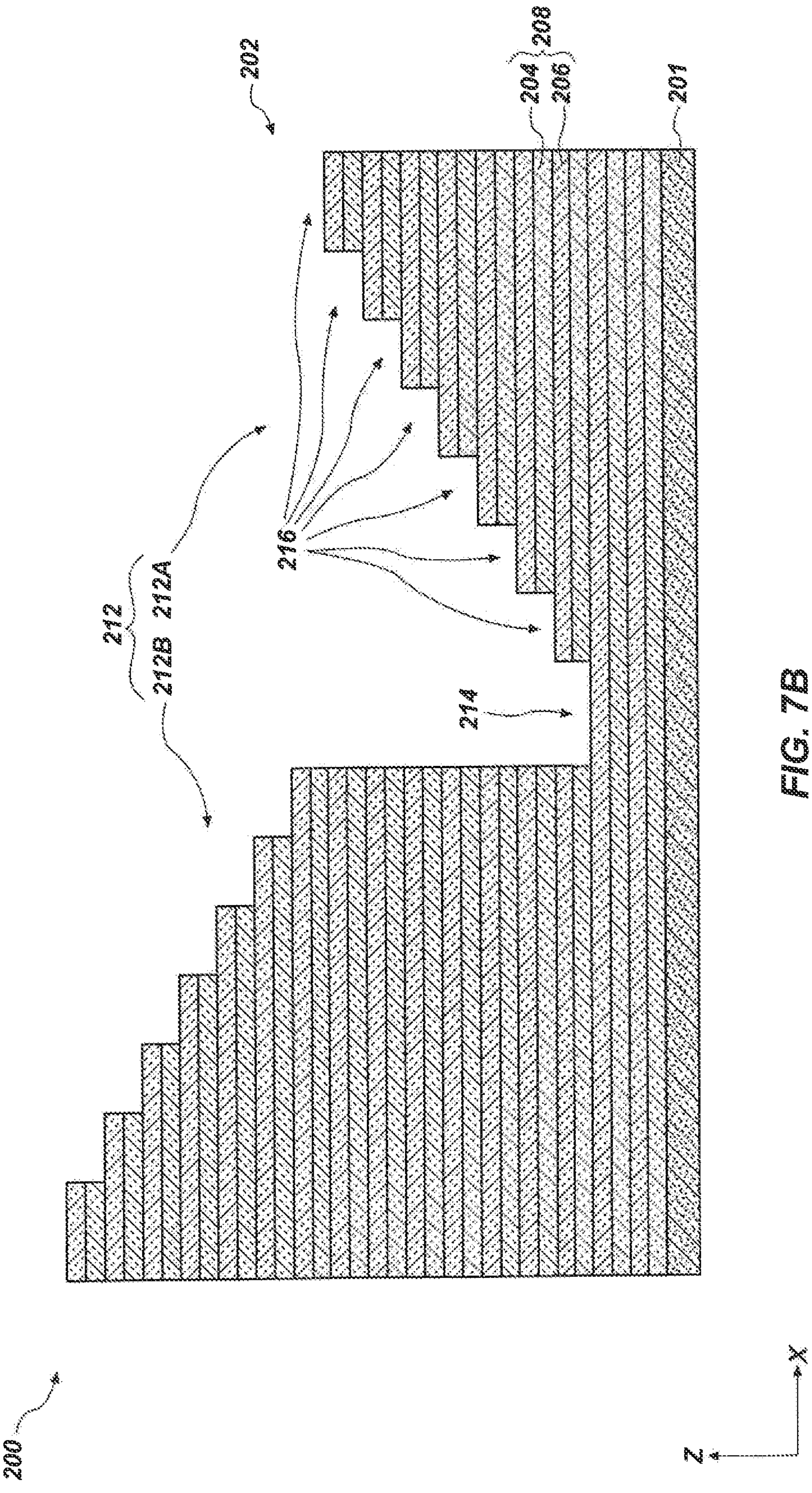
Figure 7C:
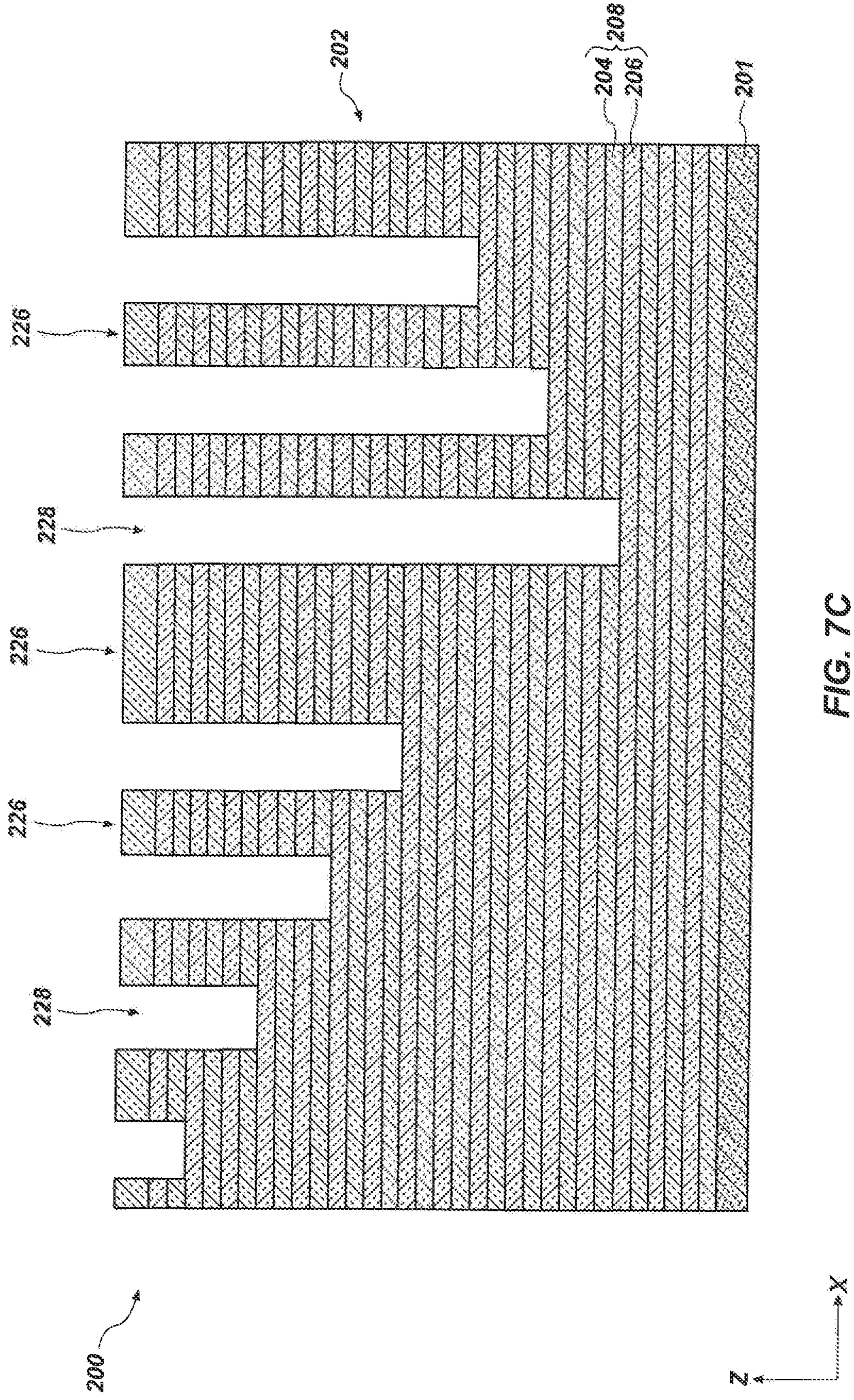

With reference to FIG. 7A through FIG. 7C, a microelectronic device structure 200 may be formed substantially as described above with reference to FIG. 1A through FIG. 1E, except that during formation of stadium structures 210, including opposing staircase structures 212, each step 216 of the stadium structures 210 may include arcuate portions 228 horizontally extending (e.g., in the Y-direction) into the bridge region 225 horizontally between (e.g., in the Y-direction) horizontally neighboring rows 213 of the stadium structures 210.

FIG. 7A is a partial, simplified top-down view of the microelectronic device structure 200; FIG. 7B is a partial, simplified cross-sectional view of the microelectronic device structure 200 taken through section line B-B of FIG. 7A; and FIG. 7C is a partial, simplified cross-sectional view of the microelectronic device structure 200 taken through section line C-C of FIG. 7A. With collective reference to FIG. 7A and FIG. 7C, the arcuate portions 228 of the steps 216 horizontally extend (e.g., in the Y-direction) into horizontal boundaries (e.g., in the Y-direction) of the bridge region 225. In some embodiments, the sacrificial structure 206 of the step 216 is exposed through the arcuate portions 228.

In some embodiments, each step 216 exhibits a horizontal width (e.g., in the Y-direction) greater within horizontal boundaries (e.g., in the X-direction) of the arcuate portions 228 than outside horizontal boundaries (e.g., in the X-direction) of the arcuate portions 228.

At least a portion of each of the arcuate portions 228 may be located at a horizontal boundary (e.g., in the Y-direction) between the rows 213 of the stadium structures 210 and the bridge region 225 horizontally between (e.g., in the Y-direction) neighboring rows 213 of the stadium structures 210. In some embodiments, each arcuate portion 228 is horizontally centered (e.g., in the X-direction) between horizontal edges (e.g., in the X-direction) of the step 216 partially defined by the arcuate portion 228.

In some embodiments, every other step 216 of the stadium structures 210 includes an arcuate portion 228 at a first horizontal end (e.g., the Y-direction) and the other steps 216 of the every other steps 216 of the stadium structures 210 include an arcuate portion 228 at a second, opposite horizontal end (e.g., in the Y-direction). In some such embodiments, the arcuate portions 228 within a stadium structure 210 are staggered such that arcuate portions 228 horizontally neighboring (e.g., in the X-direction) one another in a first horizontal direction are offset from one another in a second horizontal direction (e.g., in the Y-direction). In other embodiments, each step 216 includes two arcuate portions 228, one at each horizontal end (e.g., in the Y-direction) thereof.

Although the arcuate portions 228 have been described and illustrated as exhibiting a semi-circular cross-sectional shape when viewed from the XY plane, the disclosure is not so limited. In other embodiments, a cross-sectional shape of the arcuate portions 228 may be semi-elliptical, square, rectangular, or triangular. In some embodiments, the cross-sectional shape of the arcuate portions 228 is semi-circular. In additional embodiments, the cross-sectional shape of the arcuate portions 228 is semi-elliptical. In some embodiments, the size and shape of the arcuate portions 228 may be modified to facilitate formation of conductive contact structures (e.g., conductive contact structures 256 (FIG. 11A, FIG. 11B)) having desired dimensions and properties (e.g., electrical conductivity, resistance).

In some embodiments, the arcuate portions 228 are formed substantially concurrently with formation of the opposing staircase structures 212 of the stadium structures 210. In some embodiments, the arcuate portions 228 are formed through a chop mask through which the opposing staircase structures 212 are formed. By way of non-limiting example, in some embodiments, the stadium structures 210 including the arcuate portions 228 are formed using multi-level resist (MLR) patterning, such as with a spin-on carbon mask structure. However, the disclosure is not so limited and the stadium structures 210 including the arcuate portions 228 may be formed by other methods.

With reference to FIG. 7C, in some embodiments, the portions of the stadium structures 210 defined by the arcuate portions 228 horizontally extend (e.g., in the Y-direction) into the horizontal boundaries (e.g., in the Y-direction) of the bridge region 225. In some such embodiments, in the cross-section illustrated in FIG. 7C, horizontally neighboring (e.g., in the X-direction) steps 216 may be separated from one another by portions of the bridge structure 226 comprising substantially the entire vertical height (e.g., in the Z-direction) of the preliminary stack structure 202 of the tiers 208 of the insulative structures 204 and the sacrificial structures 206.

Figure 8A:
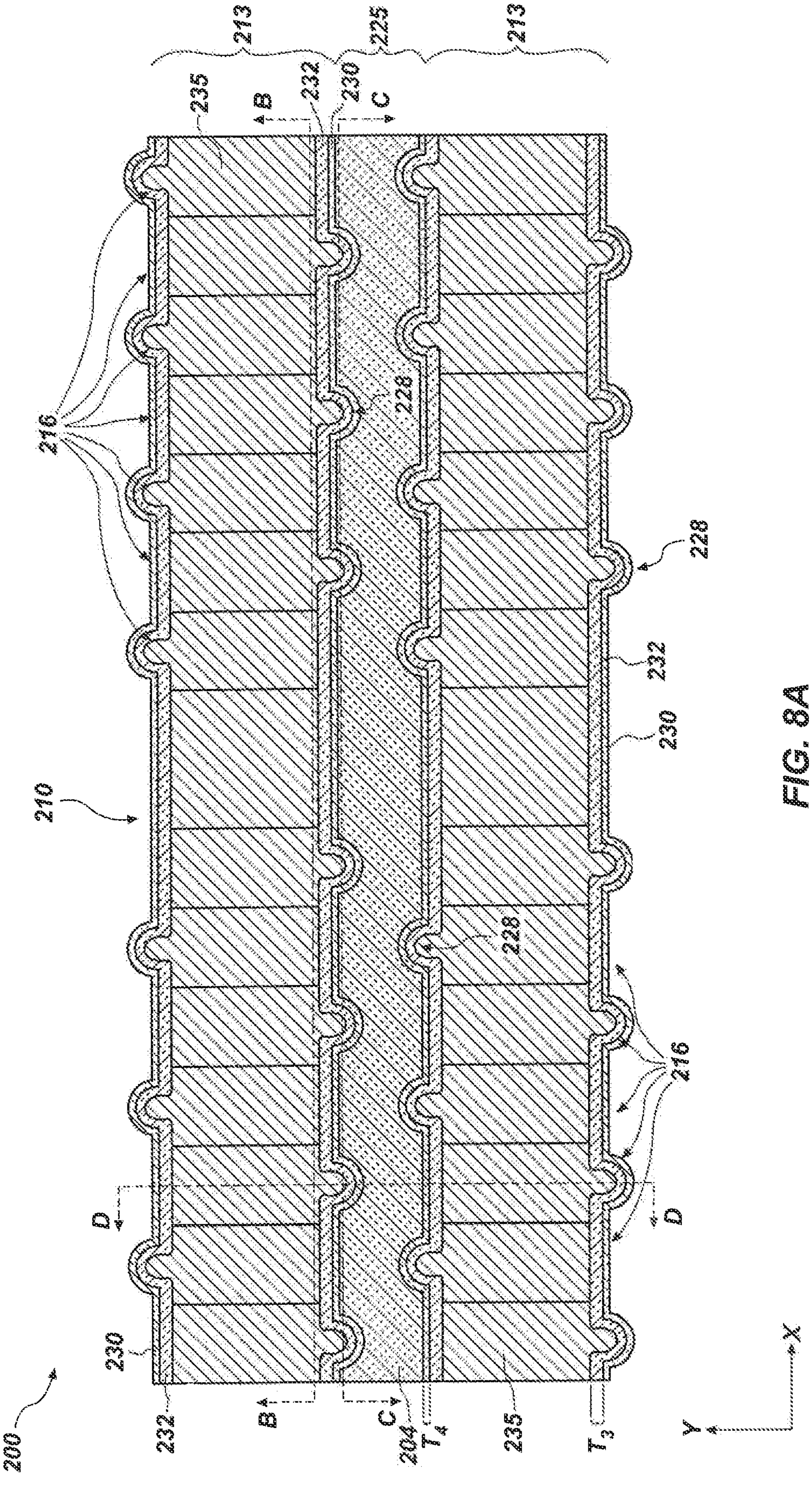
FIG. 8A through FIG. 8D are a partial top-down view (FIG. 8A) and simplified, partial cross-sectional views (FIG. 8B through FIG. 8D) of the microelectronic device structure at another processing stage of the method forming the microelectronic device structure following the processing stage of FIG. 7A through FIG. 7C.
Figure 8B:
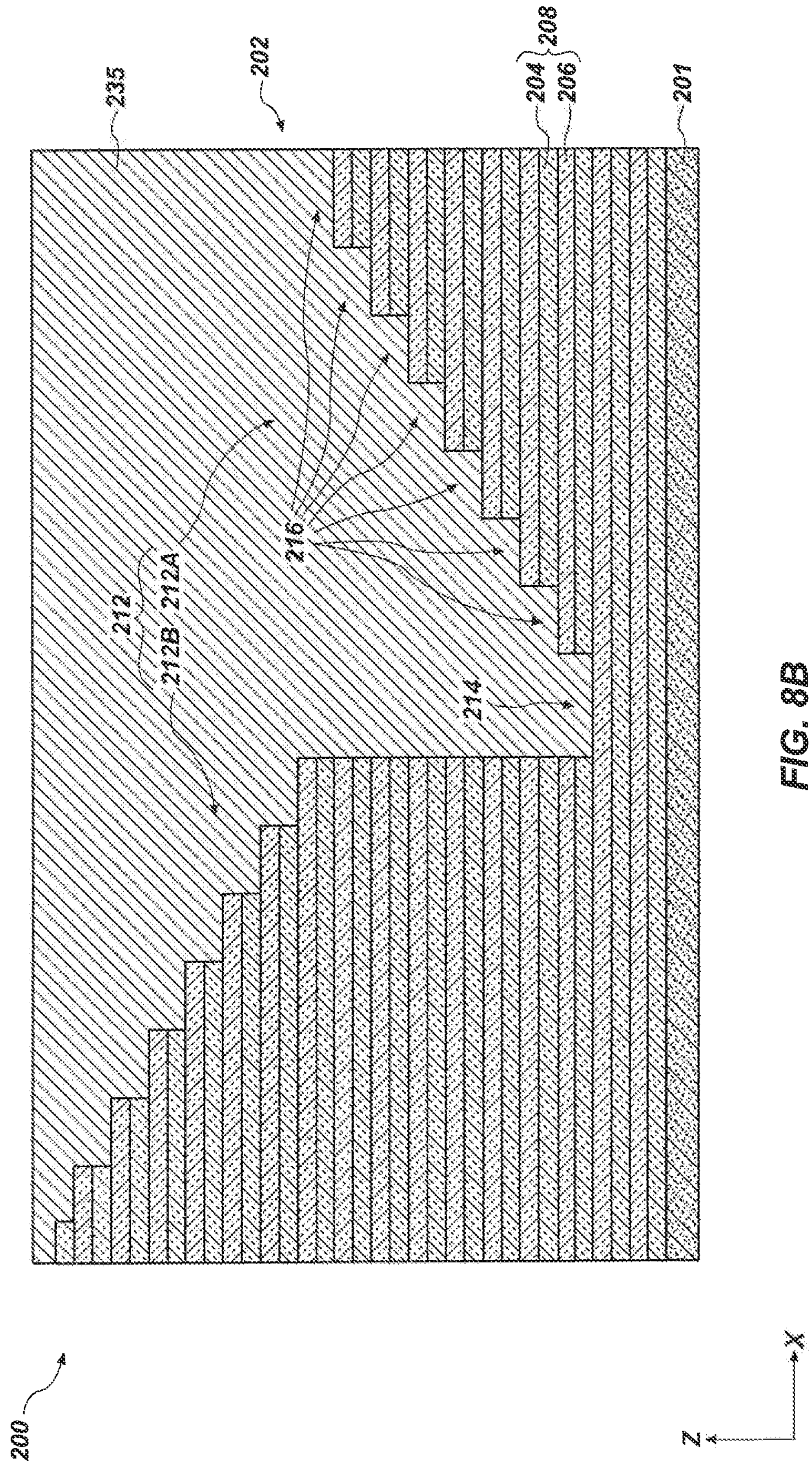
Figure 8C:
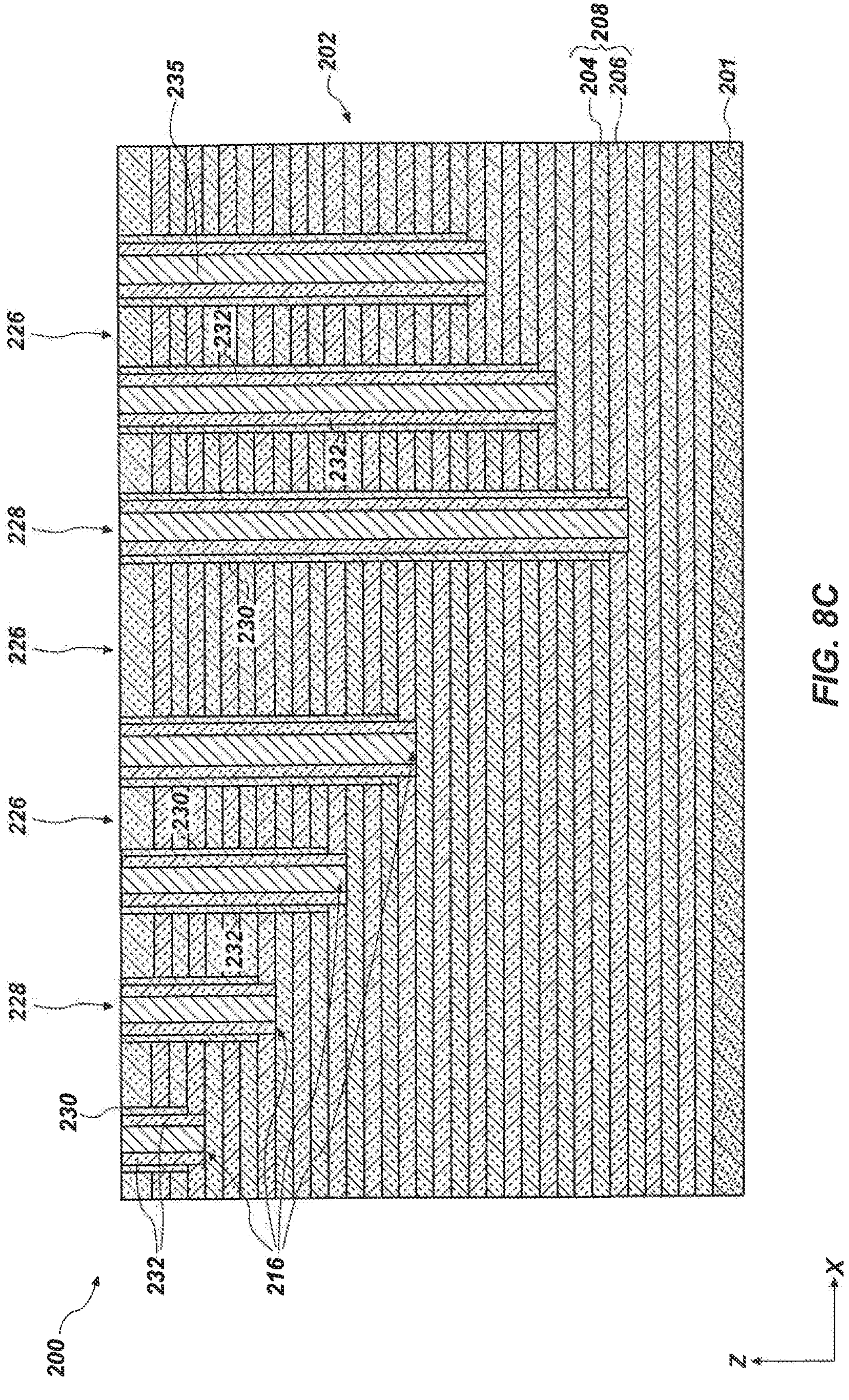
Figure 8D:
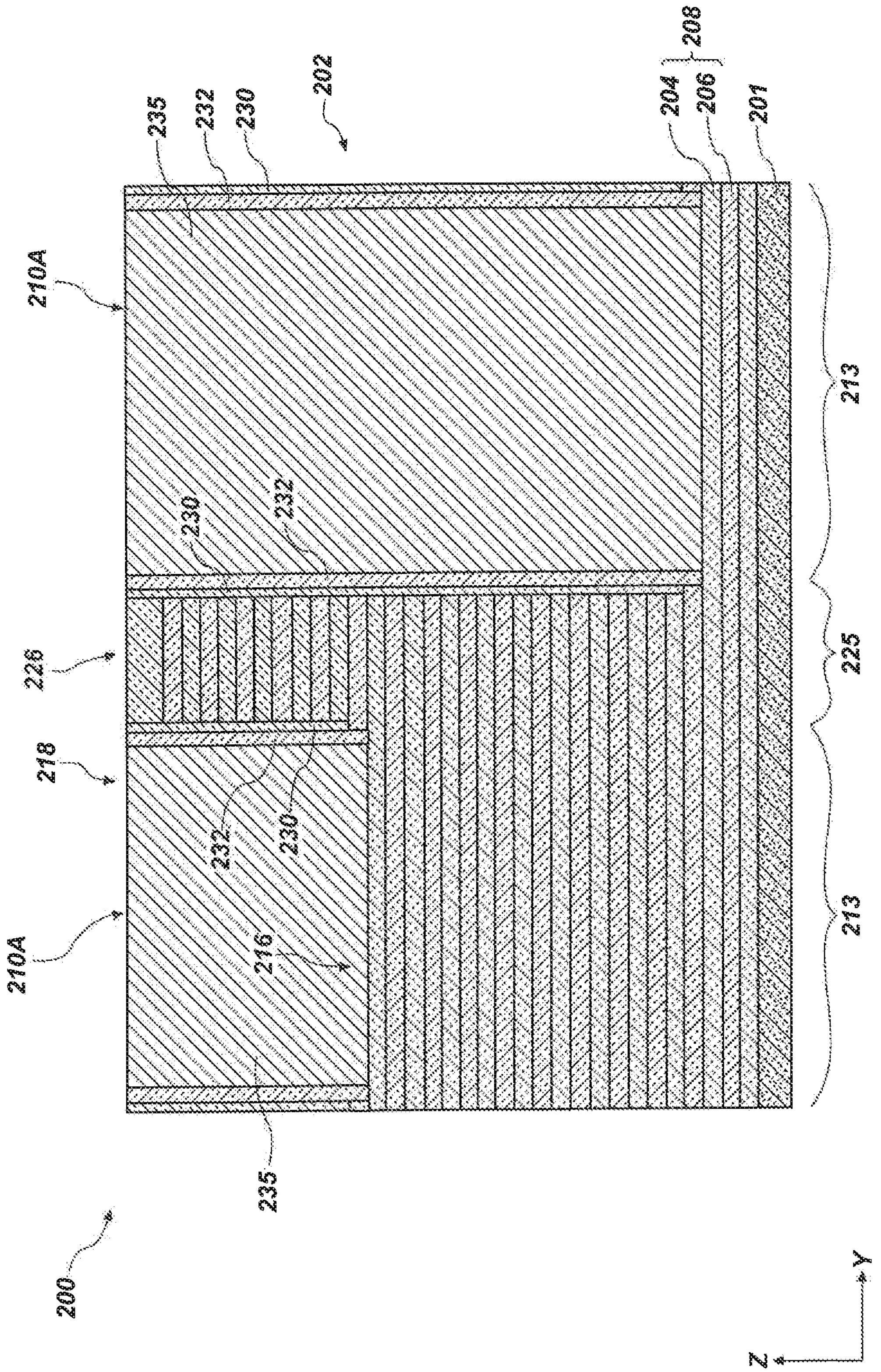

FIG. 8A through FIG. 8D are a simplified, partial top-down view (FIG. 8A) and simplified, partial cross-sectional views (FIG. 8B through FIG. 8D) of the microelectronic device structure 200 following the processing stage previously described with reference to FIG. 7A through FIG. 7C. FIG. 8B is a simplified partial cross-sectional view of the microelectronic device structure 200 taken through section line B-B of FIG. 8A. FIG. 8C is a simplified partial cross-sectional view of the microelectronic device structure 200 taken through section line C-C of FIG. 8A. FIG. 8D is a simplified partial cross-sectional view of the microelectronic device structure 200 taken through section line D-D of FIG. 8A.

With reference to FIG. 8A through FIG. 8D, after forming the stadium structures 210 including the steps 216 at least partially defined by the arcuate portions 228, a first liner material 230 may be formed within the staircase structures 212. The first liner material 230 may be formed vertically over (e.g., in the Z-direction) the steps 216 and the sidewalls of the preliminary stack structure 202 at the interface between the stadium structures 210 and the bridge region 225. The first liner material 230 may be formed on sidewalls of the preliminary stack structure 202 at the interface between the bridge structure 226 and the arcuate portions 228. Portions of the first liner material 230 may horizontally extend (e.g., in the X-direction, in the Y-direction) within the arcuate portions 228 of the steps 216 and within the horizontal boundaries (e.g., in the Y-direction) of the bridge region 225.

After forming the first liner material 230, horizontally extending portions (e.g., in the X-direction, in the Y-direction) of the first liner material 230 may be removed, such as from over surfaces of the steps 216. In some embodiments, removing the first liner material 230 from horizontally extending surfaces of the steps 216 exposes the sacrificial structure 206 of the tiers 208 of each step 216.

After forming the first liner material 230 and removing the horizontally extending portions of the first liner material 230, a second liner material 232 may be formed over surfaces of the first liner material 230 within the staircase structures 212 and within the arcuate portions 228. In some embodiments, after forming the second liner material 232, horizontally extending portions (e.g., in the X-direction, in the Y-direction) of the second liner material 232 are removed, such as from over surfaces of the steps 216. In some embodiments, removal of the horizontally extending portions of the second liner material 232 may remove the portions of the sacrificial structures 206 exposed at each step 216 to expose the vertically underlying (e.g., in the Z-direction) insulative structure 204.

The first liner material 230 and the second liner material 232 may be formed of and include one or more of the materials described above with reference to the first liner material 130 and the second liner material 132, respectively. In some embodiments, the first liner material 230 comprises substantially the same material composition as the insulative structures 204. In some embodiments, the first liner material 230 comprises silicon dioxide. In some embodiments, the second liner material 232 comprises substantially the same material composition as the sacrificial structures 206. In some embodiments, the second liner material 232 comprises silicon nitride.

With reference to FIG. 8A, and as described above with reference to the thickness $T_1$ of the second liner material 132 (FIG. 3B), a thickness $T_3$ of the second liner material 232 may be selected to determine a size of conductive contact structures (e.g., conductive contact structures 256 (FIG. 11A, FIG. 11B)) to be formed during replacement of the second liner material 232 with a conductive material. In some embodiments, the thickness $T_3$ of the second liner material 232 is greater than a thickness $T_4$ of the first liner material 230.

The thickness $T_3$ of the second liner material 232 may be within a range of from about 50 nm to about 150 nm, such as from about 50 nm to about 75 nm, from about 75 nm to about 100 nm, from about 100 nm to about 125 nm, or from about 125 nm to about 150 nm. In some embodiments, the thickness $T_3$ of the second liner material 232 is within a range of from about 90 nm to about 110 nm, such as about 100 nm. In some embodiments, the thickness $T_3$ of the second liner material 232 may be about the same as the vertical thickness (e.g., in the Z-direction) of the sacrificial structures 206 between vertically neighboring (e.g., in the Z-direction) insulative structures 204.

The thickness $T_4$ of the first liner material 230 may be within a range of from about 30 nm to about 70 nm, such from about 30 nm to about 50 nm, or from about 50 nm to about 70 nm. In some embodiments, the thickness $T_4$ of the first liner material 230 is within a range of from about 40 nm to about 60 nm, such as about 50 nm.

With reference to FIG. 8C and FIG. 8D, within the stadium structures 210 and the arcuate portions 228, each of the first liner material 230 and the second liner material 232 may individually vertically extends (e.g., in the Z-direction) to the upper surface of the steps 216, such as to the upper surface of the insulative structure 204 of each step 216.

With continued reference to FIG. 8A through FIG. 8D, after forming the first liner material 230 and the second liner material 232, an insulative material 235 may be formed over the steps 216 of the staircase structures 212 of the stadium structures 210.

The insulative material 235 may be formed of and include one more or more of the materials described above with reference to the insulative structures 204. In some embodiments, the insulative material 235 comprises substantially the same material composition as the first liner material 230. In some embodiments, the insulative material 235 comprises silicon dioxide.

Figure 9A:
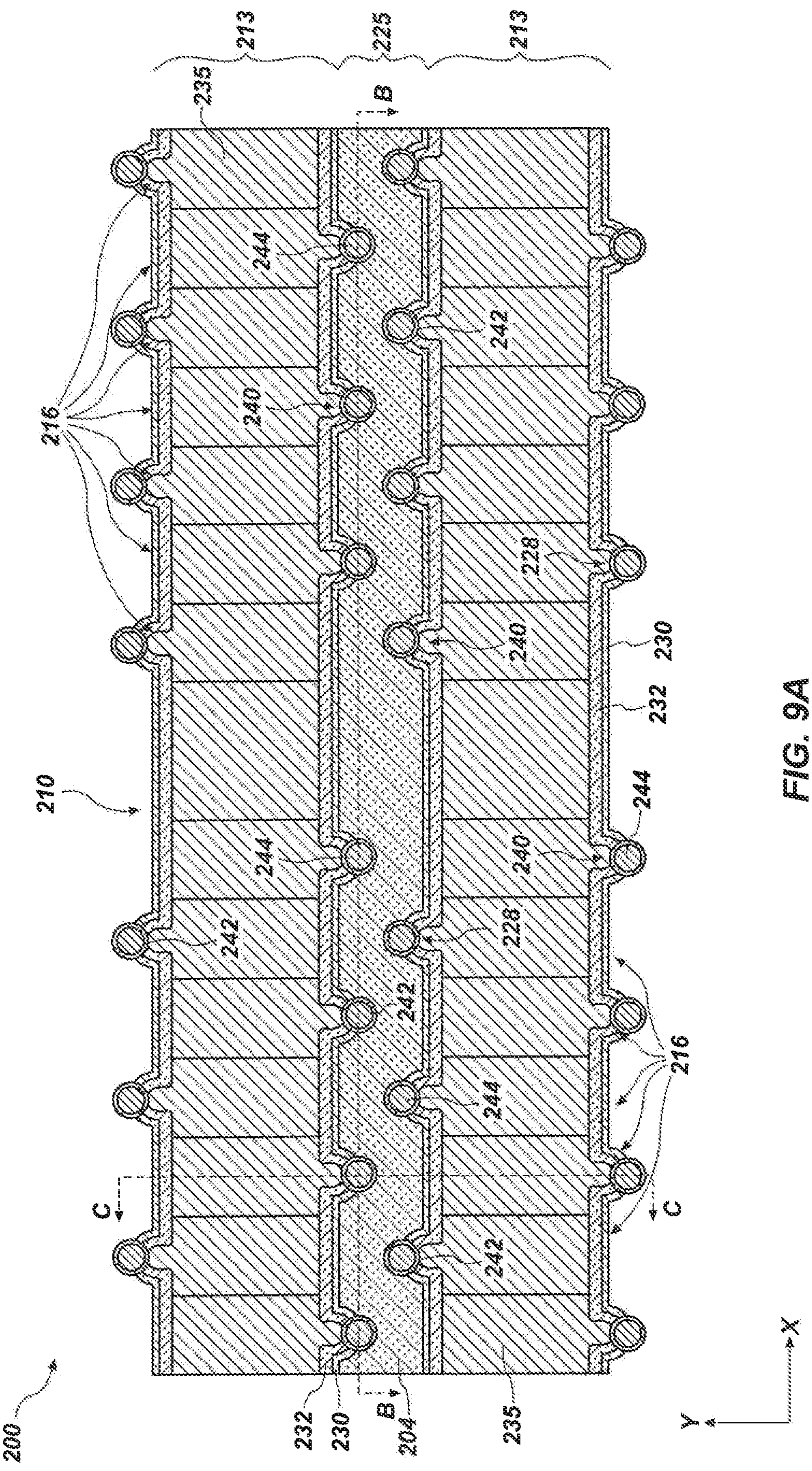
FIG. 9A through FIG. 9C are a partial top-down view (FIG. 9A) and simplified, partial cross-sectional views (FIG. 9B, FIG. 9C) of the microelectronic device structure at another processing stage of the method forming the microelectronic device structure following the processing stage of FIG. 8A through FIG. 8D.
Figure 9B:
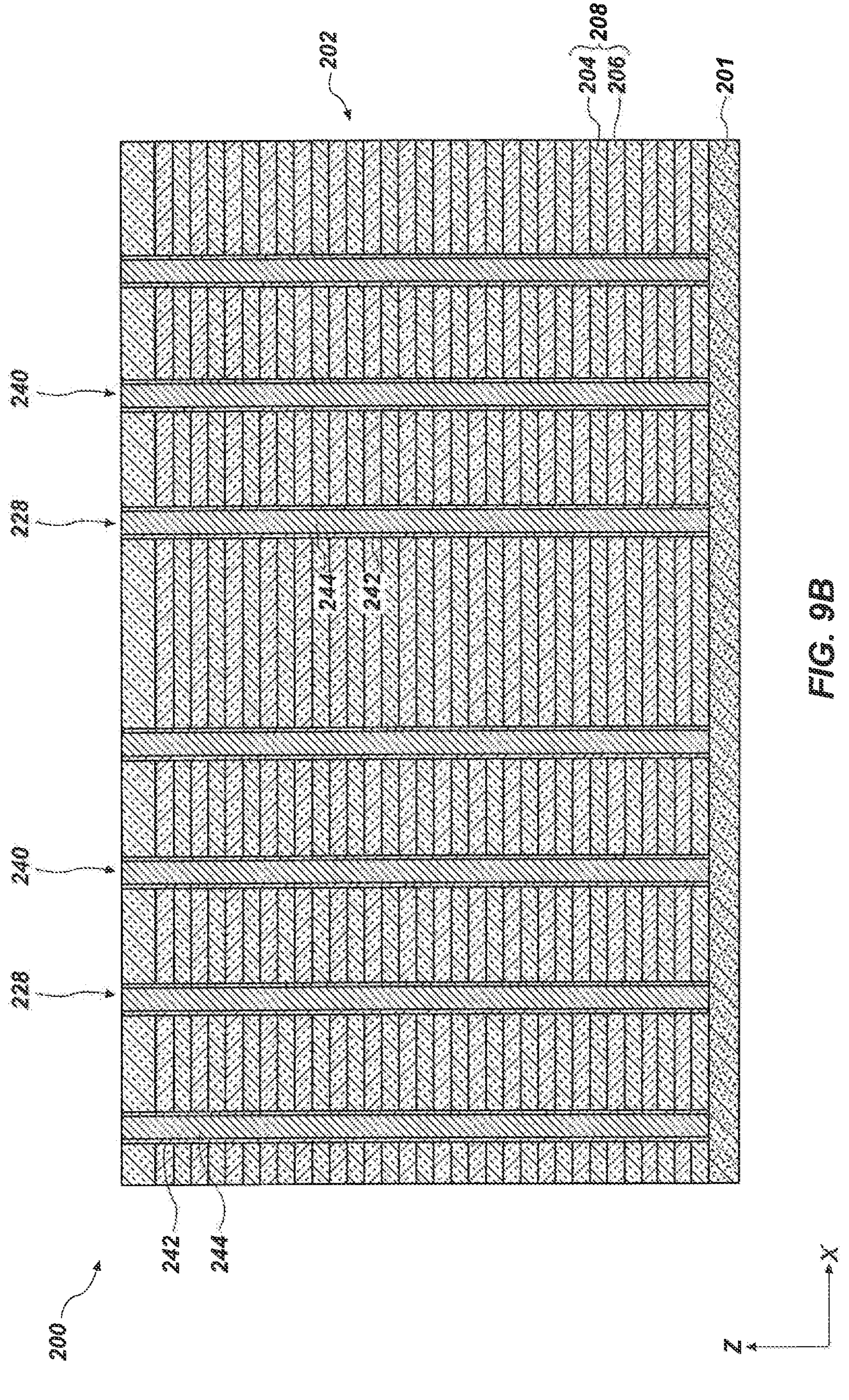
Figure 9C:
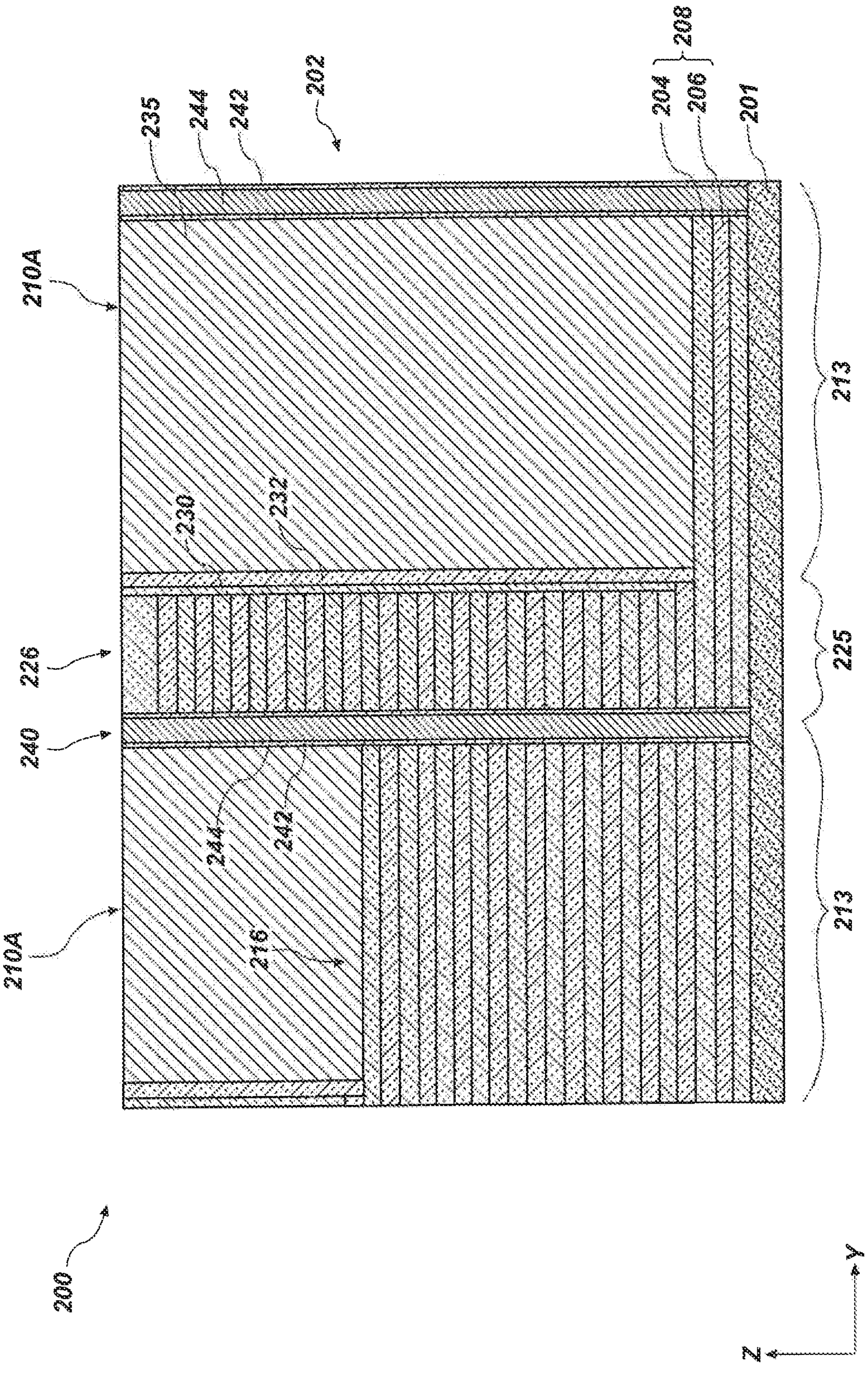

With collective reference to FIG. 9A through FIG. 9C, after forming the insulative material 235, pillar structures 240 may be formed through the microelectronic device structure 200, such as through the preliminary stack structure 202, as described above with reference to the pillar structures 140 (FIG. 3A through FIG. 3C). FIG. 9A is a simplified, partial top-down view of the microelectronic device structure 200 at a processing stage subsequent to that illustrated in FIG. 8A through FIG. 8D. FIG. 9B is a simplified, partial cross-sectional view of the microelectronic device structure 200 taken through section line B-B of FIG. 9A and illustrates a different cross-sectional view than that illustrated in FIG. 8B and FIG. 8C. FIG. 9C is a simplified, partial cross-sectional view of the microelectronic device structure 200 taken through section line C-C of FIG. 9A.

The pillar structures 240 may be substantially similar to the pillar structures 140. For example, the pillar structures 240 may each individually comprise a first material 244 vertically extending through the preliminary stack structure 202 and to the source structure 201, and a liner material 242 on sidewalls of the first material 244. The liner material 242 may substantially surround (e.g., substantially horizontally and vertically cover) sidewalls of the first material 244. In some embodiments, at least some of the pillar structures 240 are in electrical communication with a structure (e.g., a CMOS structure) underlying the source structure 101.

Each of the liner material 242 and the first material 244 may be formed of and include one or more of the materials described above with reference to the liner material 142 (FIG. 3A, FIG. 3B) and the first material 144 (FIG. 3A, FIG. 3B), respectively. In some embodiments, the liner material 242 comprises silicon dioxide. In some embodiments, the first material 244 comprises a conductive material, such as tungsten. In other embodiments, the first material 244 comprises an insulative material. In some embodiments, at least some of the pillar structures 240 include a first material 244 having a different material composition than the first material 244 of at least other pillar structures 240.

In some embodiments, at least a portion of each of the pillar structures 240 is located within horizontal boundaries (e.g., in the X-direction, in the Y-direction) of the arcuate portions 228. With reference to FIG. 9A, the pillar structures 240 vertically extend (e.g., in the Z-direction) through at least a portion of the second liner material 232 within the stadium structures 210 (such as within the arcuate portions 228) to isolate different portions of the second liner material 232 vertically overlying the steps 216 and separate (e.g., isolate) portions the second liner material 232 within the stadium structures 210. In other words, forming the pillar structures 240 includes forming the pillar structures 240 through portions of the second liner material 232 to isolate portions of the second liner material 232. In some embodiments, two isolated portions of the second liner material 232 vertically overlie (e.g., in the Z-direction) each step 216. The isolated portions of the second liner material 232 on each step 216 may be horizontally spaced (e.g., in the X-direction) from one another and separated from one another by the pillar structure 240 on the step 216. As described in further detail herein, the isolated portions of the second liner material 232 are replaced with a conductive material to form conductive contact structures (e.g., conductive contact structures 256 (FIG. 11A, FIG. 11B)) for forming electrical connections to conductive structures of the steps 216 and electrically connecting the conductive structures to a data line.

Figure 10A:
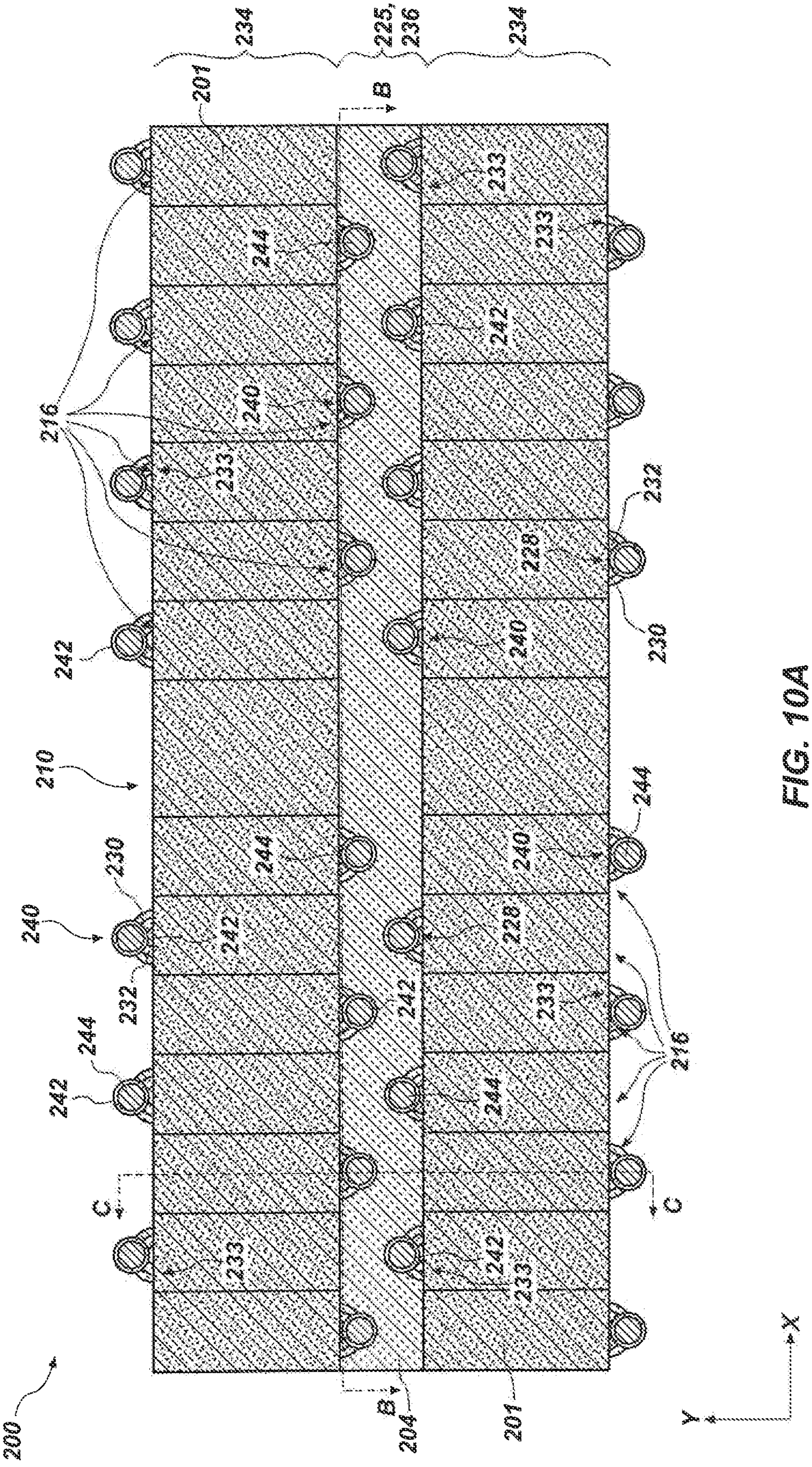
FIG. 10A through FIG. 10C are a partial top-down view (FIG. 10A) and simplified, partial cross-sectional views (FIG. 10B, FIG. 10C) of the microelectronic device structure at another processing stage of the method forming the microelectronic device structure following the processing stage of FIG. 9A through FIG. 9C.
Figure 10B:
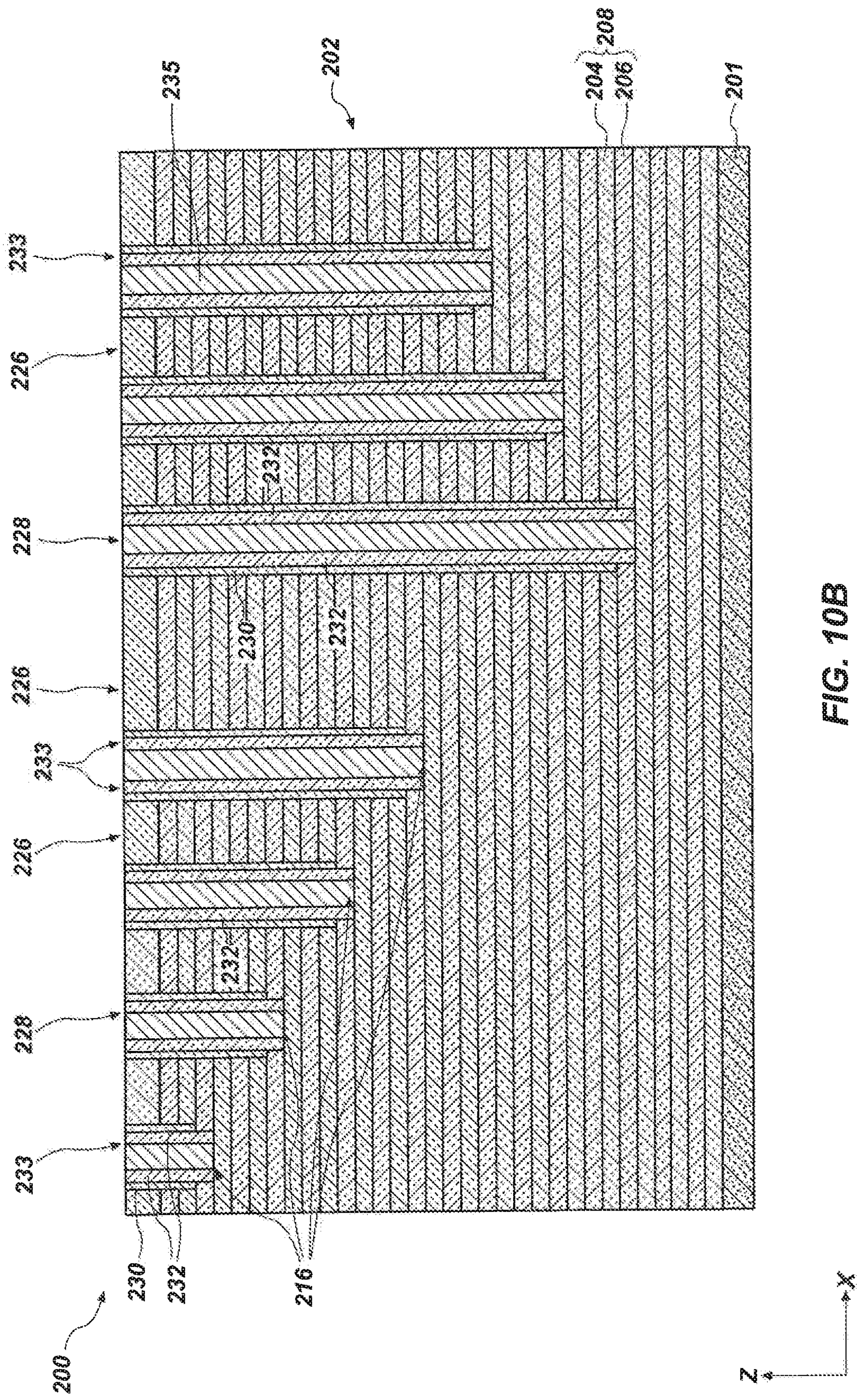
Figure 10C:
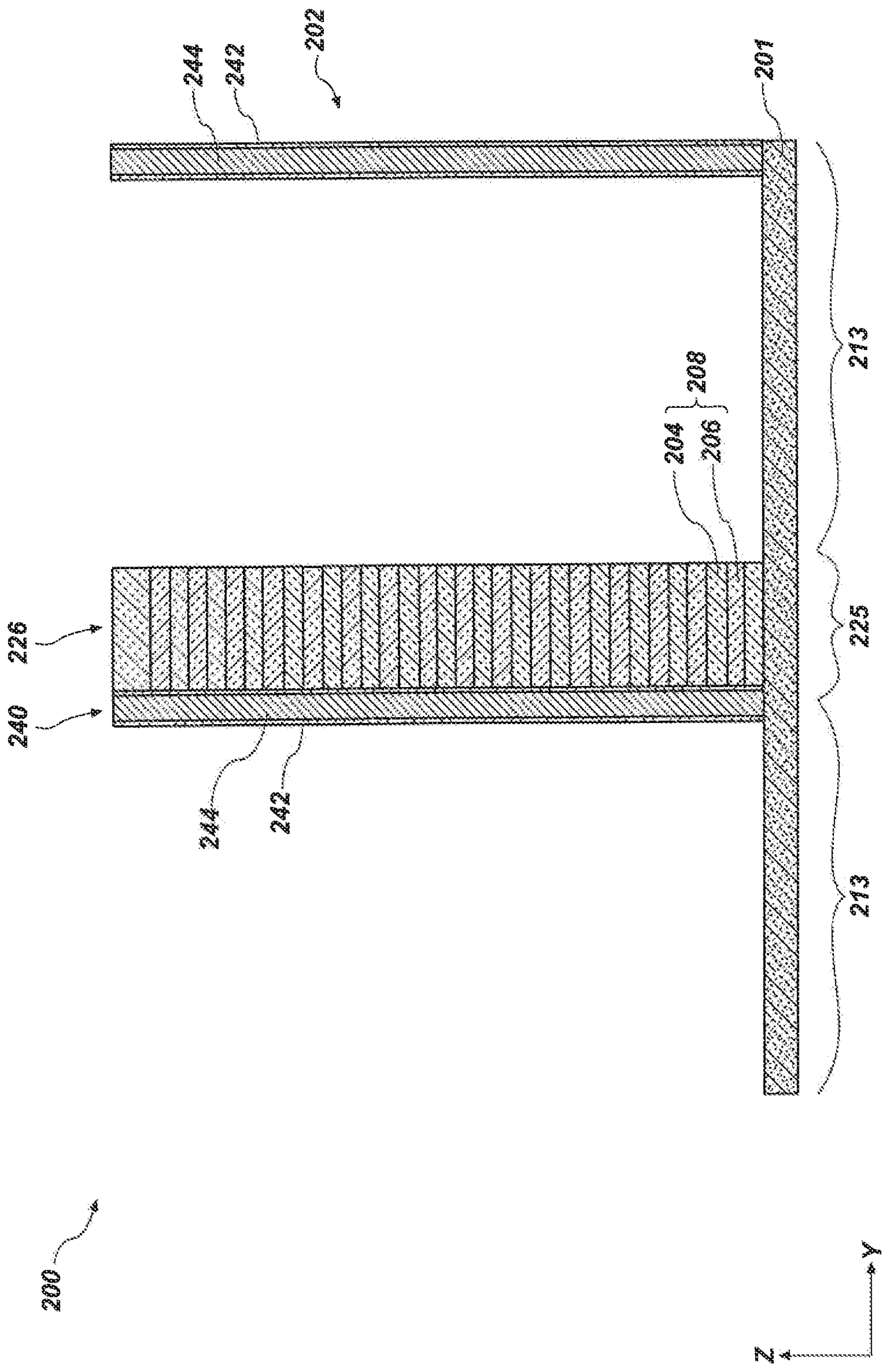

FIG. 10A through FIG. 10C are a simplified, partial top-down view (FIG. 10A) and simplified, partial cross-sectional views (FIG. 10B and FIG. 10C) of the microelectronic device structure 200 following the processing stage previously described with reference to FIG. 9A through FIG. 9C. FIG. 10B is a simplified partial cross-sectional view of the microelectronic device structure 200 taken through section line B-B of FIG. 10A. FIG. 10C is a simplified partial cross-sectional view of the microelectronic device structure 200 taken through section line C-C of FIG. 10A.

With reference to FIG. 10A through FIG. 10C, after forming the pillar structures 240, slots 234 may be formed within the rows 213 (FIG. 9A) of the stadium structures 210. The slots 234 may be formed by removing portions of the first liner material 230, the second liner material 232, the insulative material 235, and the tiers 208 of the insulative structures 204 and the sacrificial structures 206 within the rows 213 of the stadium structures 210. In some embodiments, the slots 234 are formed horizontally between (e.g., in the Y-direction) the bridge structures 226. In some such embodiments, the slots 234 horizontally extend (e.g., in the Y-direction) from a horizontal boundary (e.g., in the Y-direction) of a first one of the bridge structures 226 to a horizontal boundary (e.g., in the Y-direction) of a second one of the bridge structures 226.

In some embodiments, the slots 234 are formed vertically through (e.g., in the Z-direction) the preliminary stack structure 202 within the horizontal boundaries (e.g., in the X-direction, in the Y-direction) of the rows 213 of the stadium structures 210. Stated another way, the slots 234 are formed within the horizontal boundaries (e.g., in the X-direction, in the Y-direction) of the rows 213 of the stadium structures 210. In some embodiments, the slots 234 are formed outside the horizontal boundaries (e.g., in the X-direction, in the Y-direction) of the bridge region 225.

Formation of the slots 234 may separate the microelectronic device structure 200 into block structures 236 (also referred to as "dielectric block structures") horizontally separated (e.g., in the Y-direction) from one another by a slot 234. In some embodiments, the block structures 236 are located within horizontal boundaries (e.g., in the Y-direction) of the bridge region 225. In some embodiments, the block structures 236 are substantially horizontally coextensive with the bridge structures 226.

In some embodiments, removal of the first liner material 230 and the second liner material 232 within the rows 213 (FIG. 9A) during formation of the slots 234 substantially removes portions of the staircase structures 212 of the stadium structures 210. By way of non-limiting example, formation of the slots 234 removes the staircase structures 212 other than portions of the steps 216 that are located within the horizontal boundaries (e.g., in the Y-direction) of the bridge region 225 (e.g., the portions of the steps 216 defined by the arcuate portions 228). With reference to FIG. 10B, in the cross-section of FIG. 10B, each step 216 may be separated from one another by a portion of the preliminary stack structure 202 within the bridge region 225. In some such embodiments, the staircase structures 212 may be referred to as "discontinuous stairstep structures" wherein the horizontal edges (e.g., in the X-direction) of the steps 216 are separated from a horizontally neighboring (e.g., in the X-direction) step 216 by the preliminary stack structure 202.

Removal of second liner material 232 may isolate portions of the second liner material 232 of horizontally neighboring (e.g., in the X-direction) from one another to form isolated portions 233 of the second liner material 232. In some embodiments, two isolated portions 233 of the second liner material 232 vertically overlie (e.g., in the Z-direction) each step 216, such as the arcuate portions 228. With reference to FIG. 10A and FIG. 10B, the isolated portions 233 may each individually vertically extend (e.g., in the Z-direction) to a step 216. In some embodiments, each step 216 is in contact with two of the isolated portions 233 of the second liner material 232.

Figure 11A:
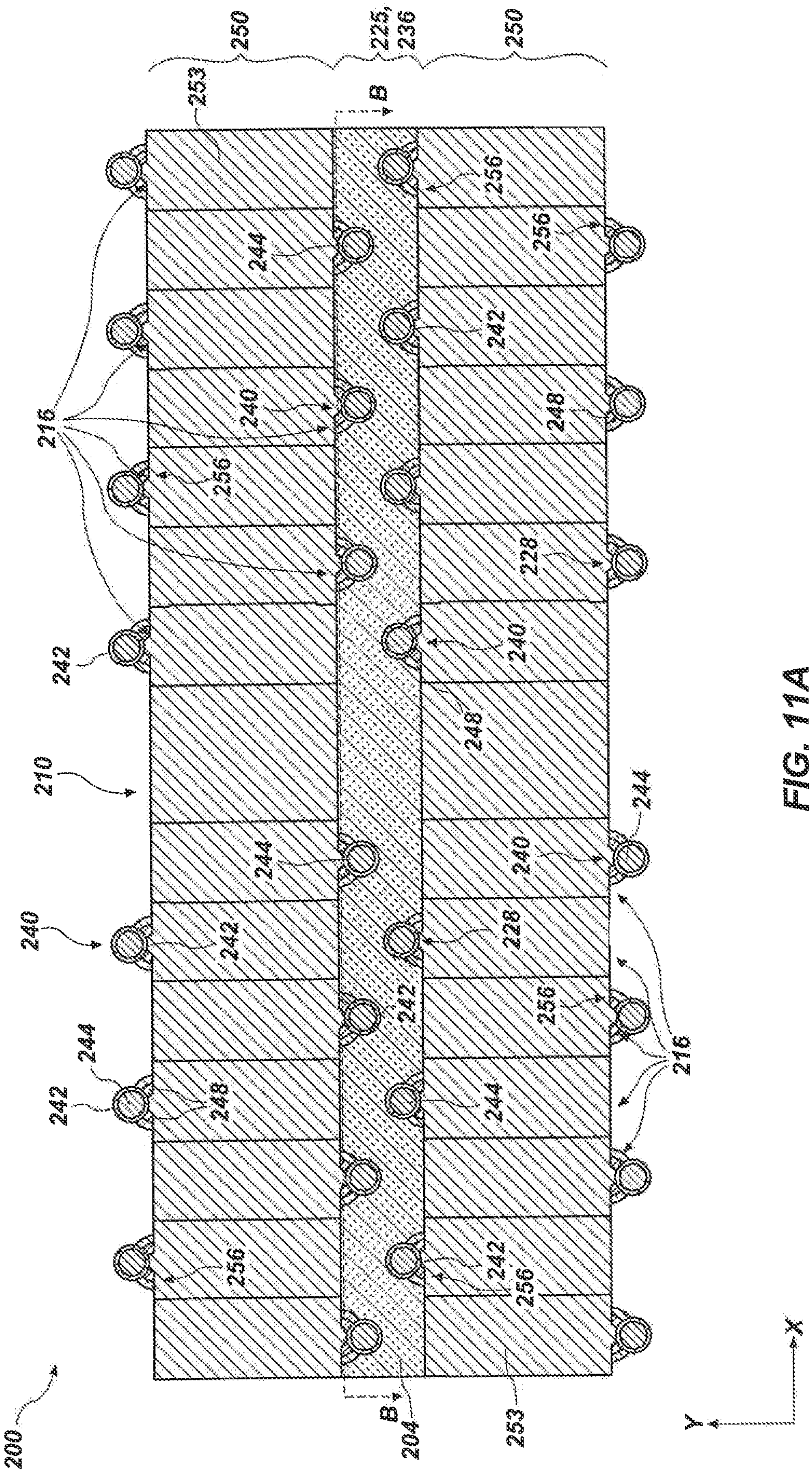
FIG. 11A and FIG. 11B are a partial top-down view (FIG. 11A) and simplified, a partial cross-sectional view (FIG. 11B) of the microelectronic device structure at another processing stage of the method forming the microelectronic device structure following the processing stage of FIG. 10A through FIG. 10C.
Figure 11B:
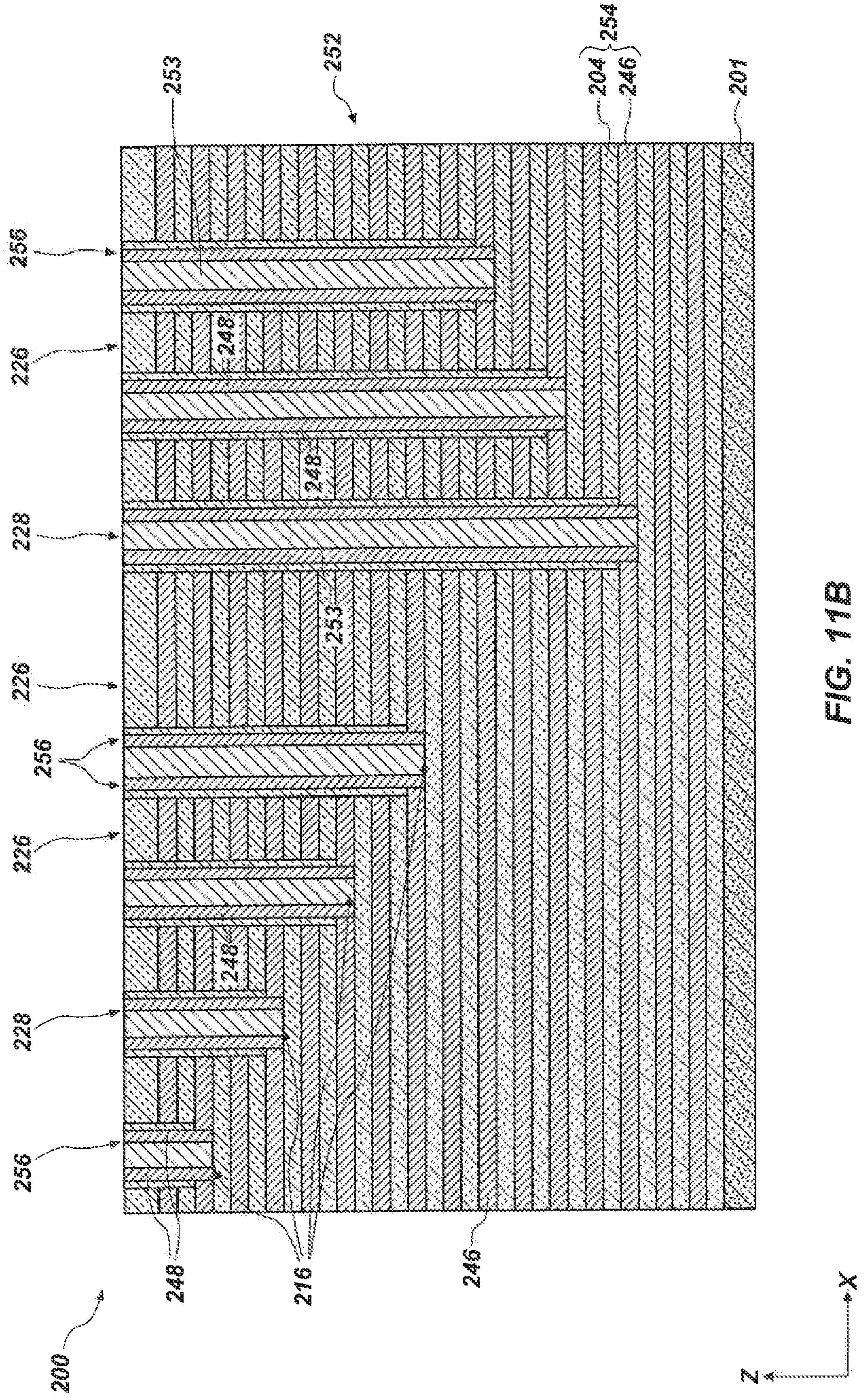

With reference to FIG. 11A and FIG. 11B, after formation of the slots 234 and removal of the portions of the first liner material 230, the second liner material 232, and portions of the preliminary stack structure 202 within the rows 213, the portions of the second liner material 232 and the sacrificial structures 206 may be selectively removed (e.g., exhumed) through the slots 234 (FIG. 10A), as described above with respect to removal of the sacrificial structures 106 (FIG. 4B, FIG. 4C) and the second liner material 132 (FIG. 5A, FIG. 4B). In some embodiments, the isolated portions 233 of the second liner material 232 are removed substantially concurrently with removal of the sacrificial structures 206.

Spaces between vertically neighboring (e.g., in the Z-direction) insulative structures 204 may be filled with the conductive material 248 to form the conductive structures 246 and a stack structure 252 including tiers 254 of the insulative structures 204 and the conductive structures 246 comprising the conductive material 248. The conductive structures 246 may be located at locations corresponding to the locations of the sacrificial structures 206 removed through the slots 234.

The conductive structures 246 and the conductive material 248 may be substantially the same as the conductive structures 146 and the conductive material 148 described above with reference to FIG. 5A. The conductive material 248 may be formed of and include one or more of the materials described above with reference to the conductive material 148. In some embodiments, the conductive material 248 comprises tungsten.

Replacement of the isolated portions 233 (FIG. 10A, FIG. 10B) of the second liner material 232 (FIG. 10A, FIG. 10B, FIG. 9C) with the conductive material 248 may form isolated conductive contact structures 256 comprising the conductive material 248, as described above with reference to the conductive contact structures 156 (FIG. 5A, FIG. 5B). In some embodiments, the conductive material 248 of the isolated conductive contact structures 256 comprises substantially the same material composition as the conductive material 248 of the conductive structures 246.

In some embodiments, each step 216 includes two of the isolated conductive contact structures 256 directly horizontally neighboring (e.g., in the Y-direction) the stack structure 252 in the bridge region 225 at a first horizontal end (e.g., in the Y-direction) of the block structure 236. In some embodiments, every other step 216 includes two of the isolated conductive contact structures 256 at a first horizontal end (e.g., in the Y-direction) of the block structure 236 and the other steps 216 include two of the isolated conductive contact structures 256 at a second, opposite horizontal end (e.g., in the Y-direction) of the block structure 236.

With reference to FIG. 11B, the isolated conductive contact structures 256 vertically extend (e.g., in the Z-direction) through the stack structure 252 and to the conductive material 248 of the conductive structures 246 of the steps 216. The conductive contact structures 256 may individually be in electrical communication with the conductive structures 246 in which they are in contact with. As described above with reference to FIG. 10B, horizontally neighboring (e.g., in the X-direction) steps 216 are separated by the stack structure 252. In other words, horizontally neighboring steps 216 are separated from one another by the height of the stack structure 252 including the vertically alternating tiers 254 of the levels of the insulative structures 204 and the conductive structures 246.

With reference to FIG. 11A, the isolated conductive contact structures 256 may each individually comprise a first arcuate (e.g., curved) surface and a second arcuate (e.g., curved) surface. In some embodiments, since the isolated portions 233 (FIG. 10A) of the second liner material 232 (FIG. 10A) (which are replaced by the isolated conductive contact structures 256) are formed from the second liner material 232 formed on the arcuate portions 228 (FIG. 7A) (which may include arcuate surfaces (e.g., since the arcuate portions 228 may be semi-circular or semi-elliptical)) and subsequently divided by the pillar structures 240, the isolated conductive contact structures 256 may include arcuate surfaces. In some embodiments, each of the isolated conductive contact structures 256 includes a first arcuate surface at least partially defining a first diameter and a second arcuate surface at least partially defining a second diameter smaller than the first diameter. In some embodiments, the first arcuate surface and the second arcuate surface are concentric (e.g., the center of the circle having the first diameter and the center of the circle having the second diameter have the same center). In some embodiments, each step 216 includes two of the isolated conductive contact structures 256 and the isolated conductive contact structures 256 of each step 216 are mirror images of one another in a first horizontal direction (e.g., in the X-direction along the Y-axis).

With reference to FIG. 11A, after forming the conductive structures 246 (FIG. 11B) and the isolated conductive contact structures 256, the slot 234 (FIG. 10A) may be filled with an insulative material 253 to form slot structures 250 separating the horizontally neighboring (e.g., in the Y-direction) block structures 236. The insulative material 253 may be formed of and include insulative material, such as one or more of the materials described above with reference to the insulative structures 204. In some embodiments, the insulative material 253 comprises substantially the same material composition as the insulative structures 204. In some embodiments, the insulative material 253 comprises silicon dioxide.

Figure 12A:
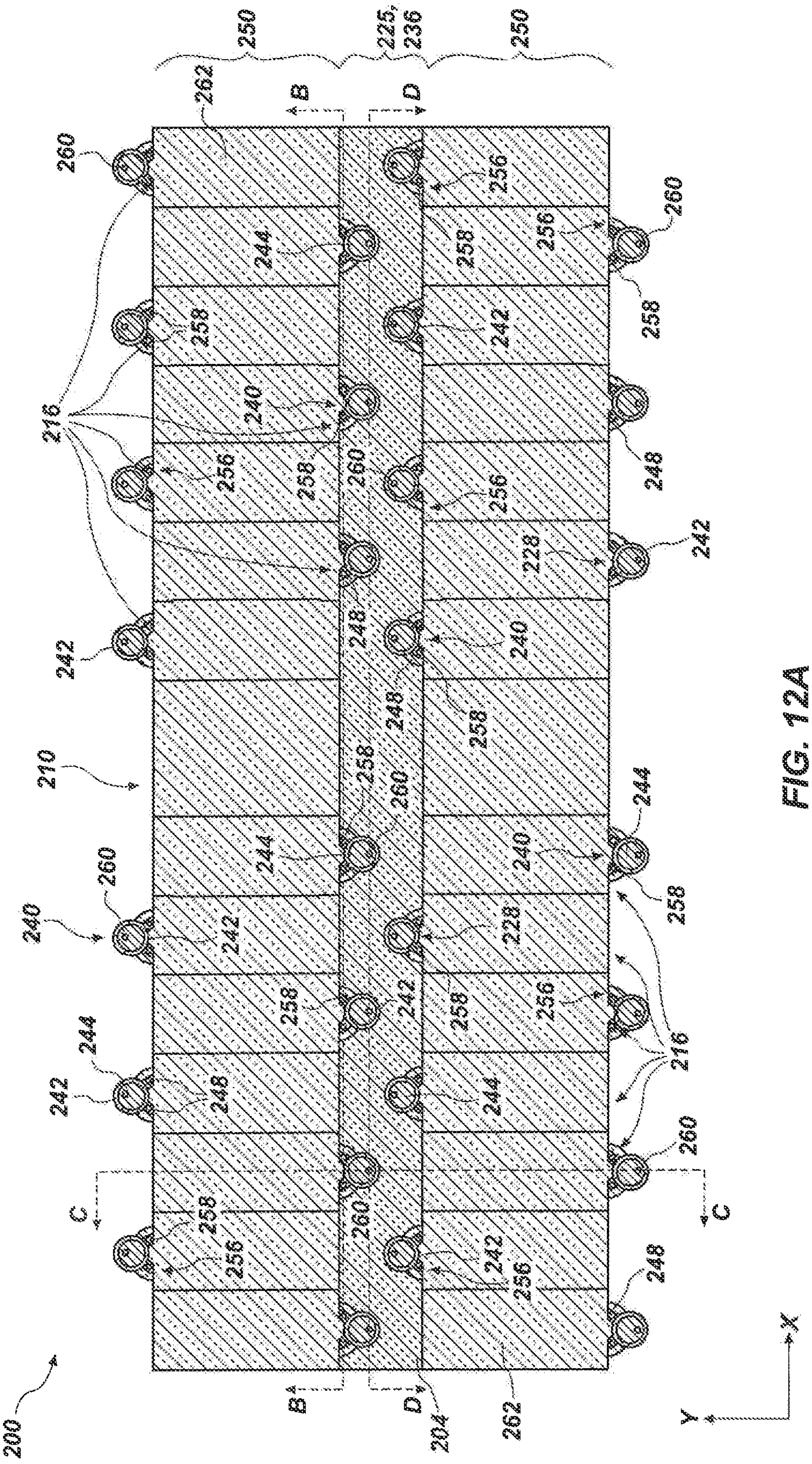
FIG. 12A through FIG. 12D are a partial top-down view (FIG. 12A) and simplified, partial cross-sectional views (FIG. 12B through FIG. 12D) of the microelectronic device structure at another processing stage of the method forming the microelectronic device structure following the processing stage of FIG. 11A and FIG. 11B.
Figure 12B:
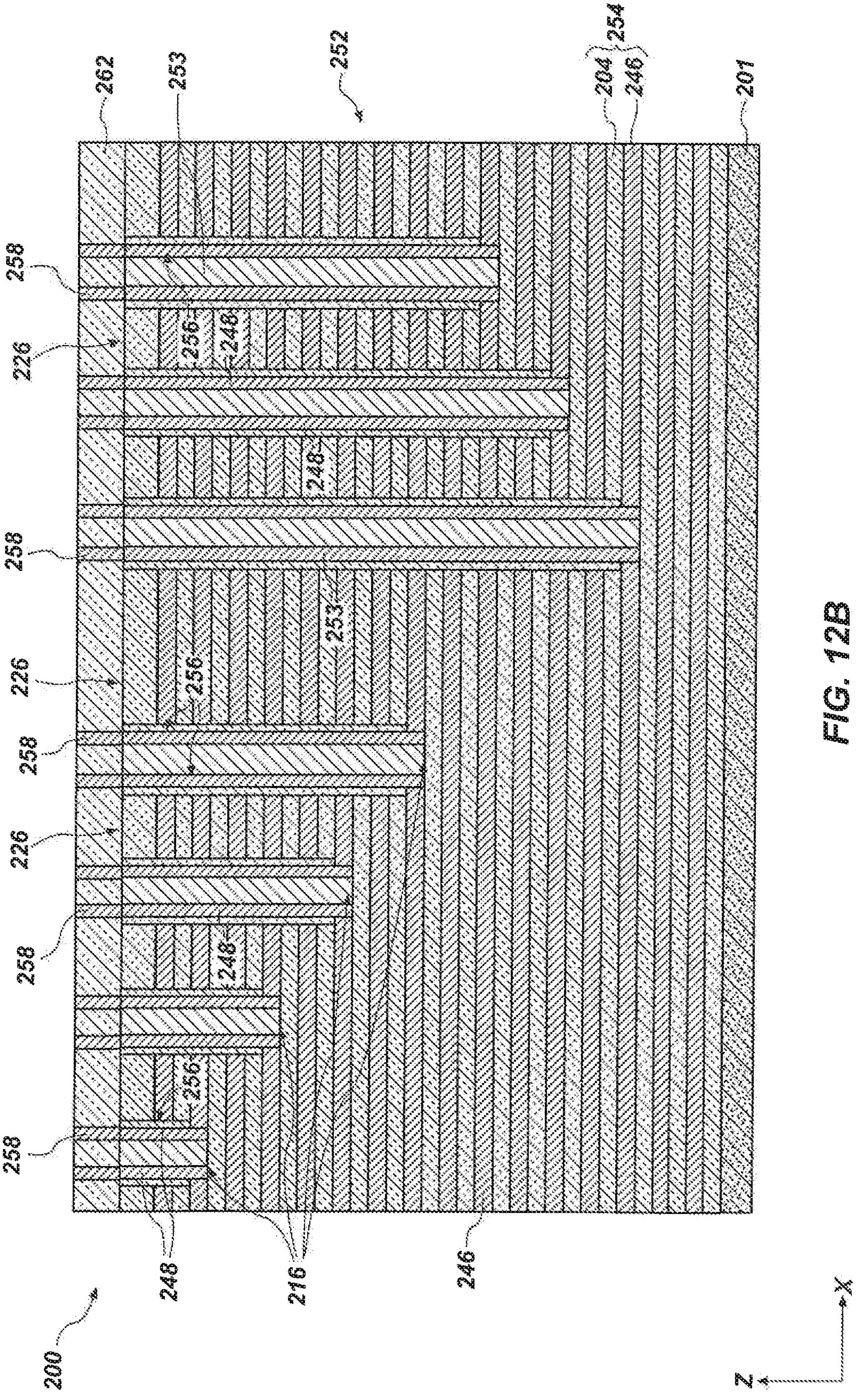
Figure 12C:
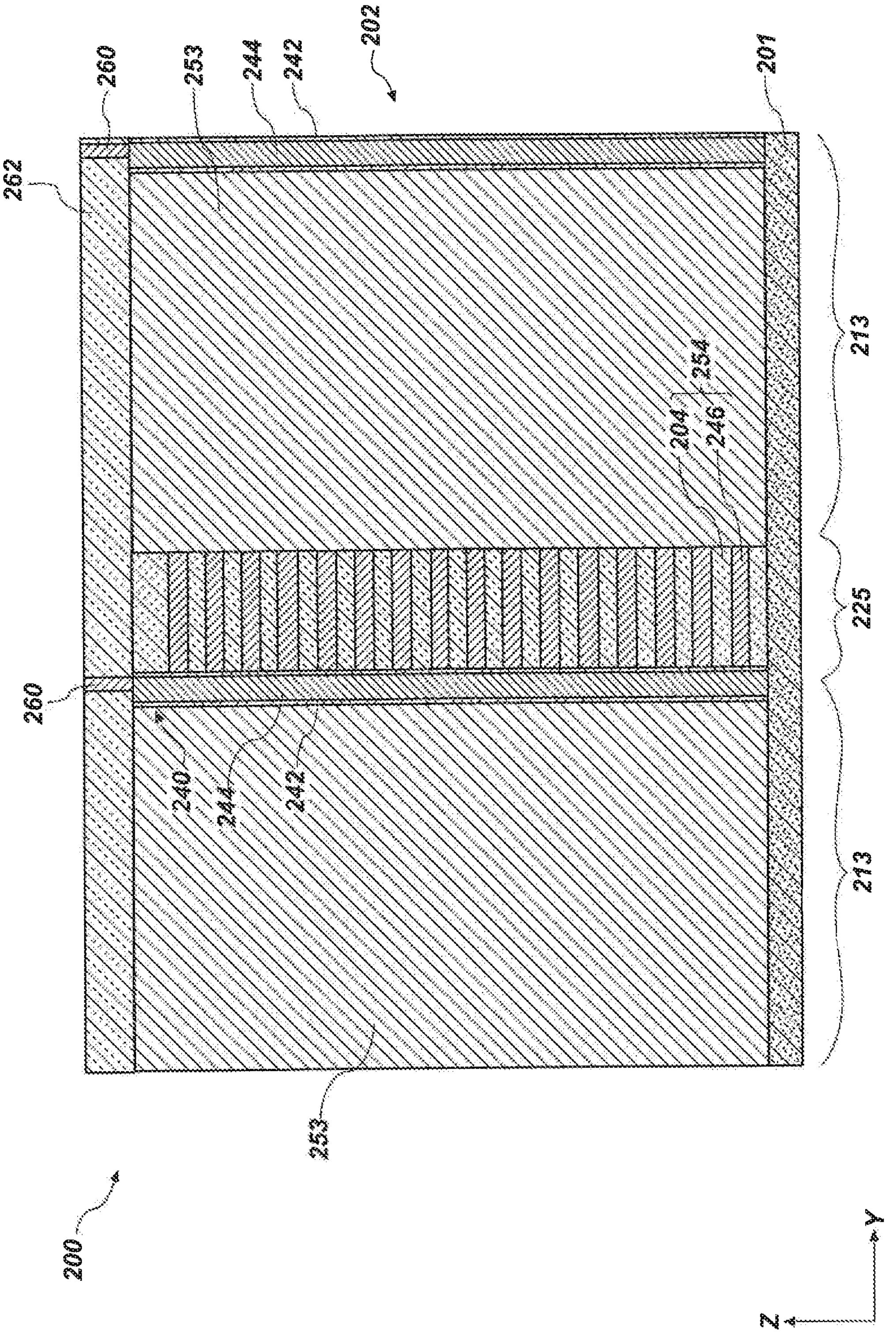
Figure 12D:
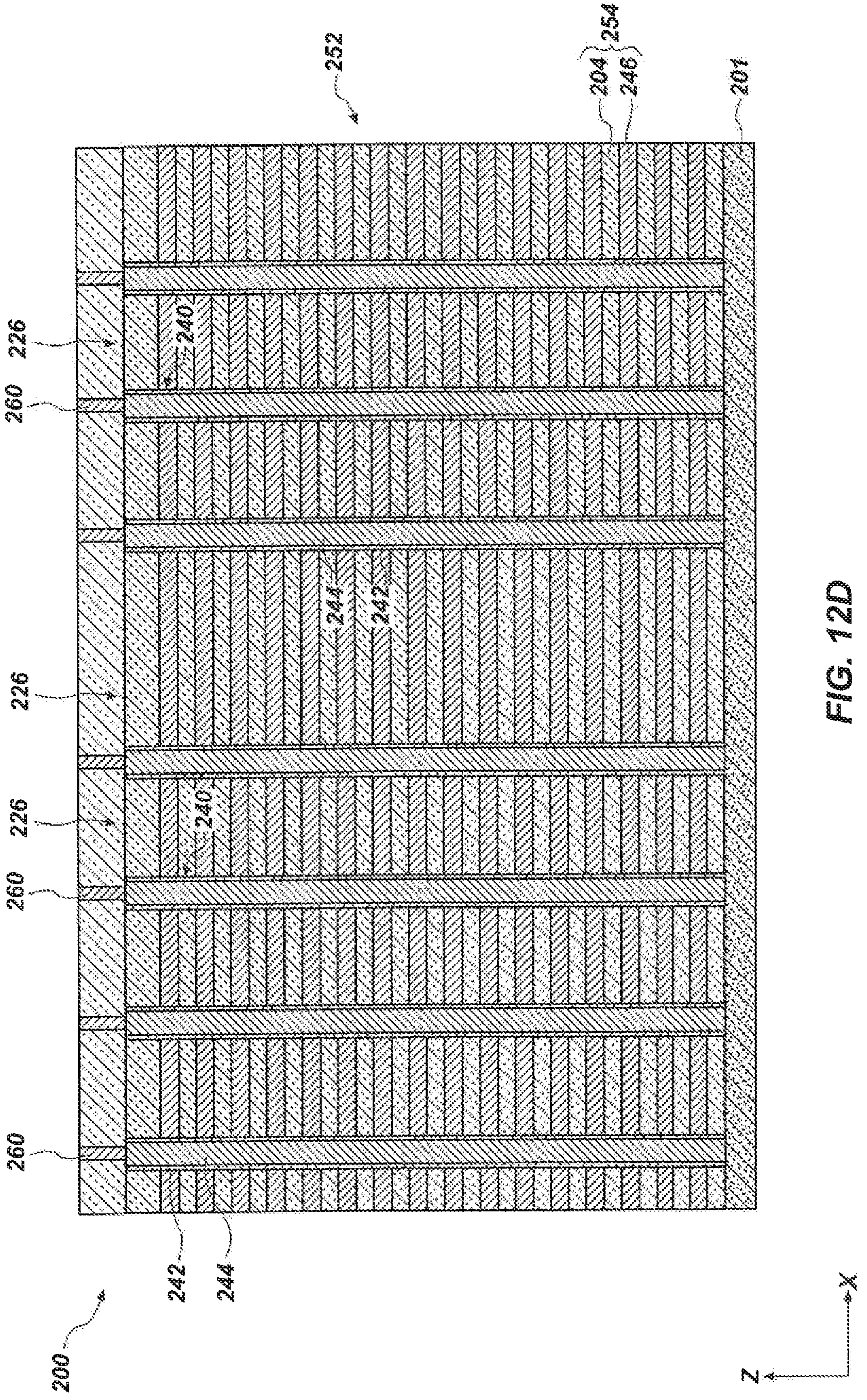

FIG. 12A through FIG. 12D are a simplified, partial top-down view (FIG. 12A) of the microelectronic device structure 200 and simplified, partial cross-sectional views (FIG. 12B through FIG. 12D) of the microelectronic device structure 200, following the processing stage previously described with reference to FIG. 11A and FIG. 11B. FIG. 12B is a simplified, partial cross-sectional view of the microelectronic device structure 200 taken through section line B-B of FIG. 12A. FIG. 12C is a simplified, partial cross-sectional view of the microelectronic device structure 200 taken through section line C-C of FIG. 12A. FIG. 12D is a simplified, partial cross-sectional view of the microelectronic device structure 200 taken through section line D-D of FIG. 12A.

With collective reference to FIG. 12A through FIG. 12D, first conductive interconnect structures 258 (FIG. 12A and FIG. 12B) are formed in electrical communication with the conductive contact structures 256, and second conductive interconnect structures 260 (FIG. 12A, FIG. 12C, and FIG. 12D) are formed in electrical communication with the first material 244 of the pillar structures 240. The first conductive interconnect structures 258 and the second conductive interconnect structures 260 may be formed within and electrically isolated from one another by a dielectric material 262.

The first conductive interconnect structures 258 may be substantially similar to the first conductive interconnect structures 158 described above with reference to FIG. 6A and FIG. 6B. In some embodiments, the first conductive interconnect structures 258 are configured to be in electrical communication with a data line (e.g., a bit line, a digit line). The first conductive interconnect structures 258 in electrical communication with the conductive structures 246 (e.g., by means of the conductive contact structures 256) may be in electrical communication with the same data line. The multiple first conductive interconnect structures 258 and the multiple conductive contact structures 256 facilitate redundancy in the formation of a conductive path between the conductive structures 246 and the data lines. In addition, the multiple first conductive interconnect structures 258 and the multiple conductive contact structures 256 reduces the electrical resistivity between the data lines and the conductive structures 246.

Each of the first conductive interconnect structures 258 and the second conductive interconnect structures 260 are individually formed of and include conductive material, such as one or more of the materials described above with reference to the conductive material 248. In some embodiments, the first conductive interconnect structures 258 and the second conductive interconnect structures 260 are individually formed of and include tungsten.

Figure 13:
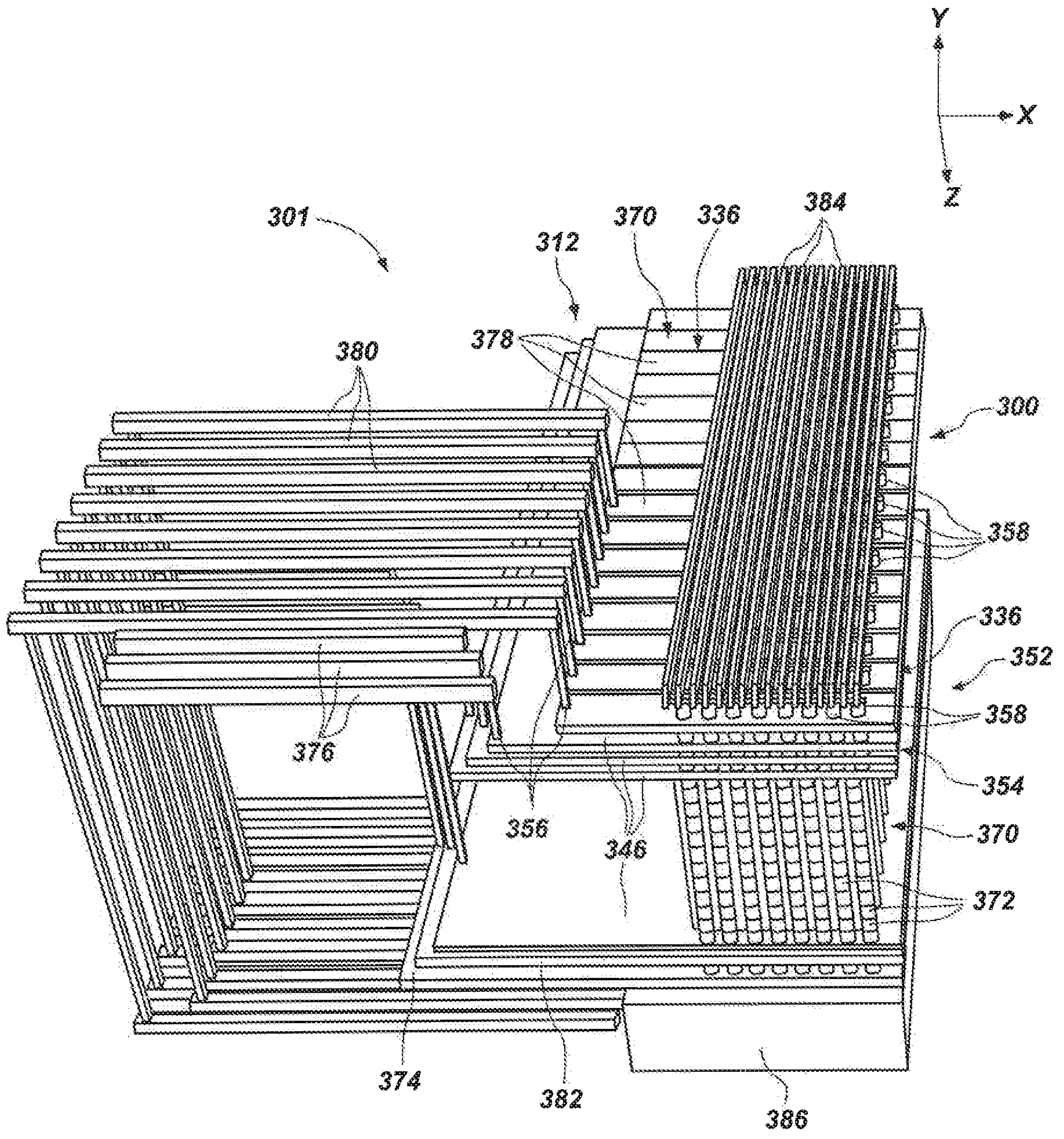
FIG. 13 is a block diagram of an electronic system, in accordance with embodiments of the disclosure.

Microelectronic device structures (e.g., the microelectronic device structures 100, 200 previously described with reference to FIG. 6A through FIG. 6C and FIG. 12A through FIG. 12D) of the disclosure may be included in microelectronic devices of the disclosure. For example, FIG. 13 illustrates a partial cutaway perspective view of a portion of a microelectronic device 301 (e.g., a memory device, such as a 3D NAND Flash memory device) including a microelectronic device structure 300. The microelectronic device structure 300 may be substantially similar to of the microelectronic device structures 100, 200 previously described with reference to FIG. 6A through FIG. 6C and FIG. 12A through FIG. 12D. In FIG. 13 and the associated description, functionally similar features (e.g., structures, materials) are referred to with similar reference numerals incremented by 100. To avoid repetition, not all features shown in FIG. 13 are described in detail herein. Rather, unless described otherwise below, a feature designated by a reference numeral that is a 100 increment of the reference numeral of a previously described feature will be understood to be substantially similar to the previously described feature. By way of non-limiting example, unless described otherwise below, a feature designated by the reference numeral 346 in FIG. 13 will be understood to be substantially similar to the conductive structures 146, 246 previously described herein with reference to FIG. 6A through FIG. 6C and FIG. 12A through FIG. 12D. In addition, for clarity and ease of understanding the drawings and associated description, some features (e.g., structures, materials) of the microelectronic device structures 100, 200 previously described herein are not shown in FIG. 13. However, it will be understood that any features of the microelectronic device structures 100, 200 previously described with reference to one or more of FIG. 6A through FIG. 6C and FIG. 12A through FIG. 12D may be included in the microelectronic device structure 300 of the microelectronic device 301 described herein with reference to FIG. 13.

As shown in FIG. 13, in addition to the features of the microelectronic device structure 300 previously described herein in relation to the microelectronic device structures 100, 200 (FIG. 6A through FIG. 6C, FIG. 12A through FIG. 12D), the microelectronic device 301 may further include cell pillar structures 370 (also referred to as "vertical strings of memory cells") vertically extending through each block structure 336 of the stack structure 352. The cell pillar structures 370 may be positioned within regions (e.g., memory array regions) of the block structure 336 horizontally offset (e.g., in the X-direction) from the staircase structures 312 within the block structures 336. Intersections of the cell pillar structures 370 and the conductive structures 346 of the tiers 354 of the block structures 336 of stack structure 352 form strings of memory cells 372 vertically extending through each block structure 336 of the stack structure 352. For each string of memory cells 372, the memory cells 372 thereof may be coupled in series with one another. Within each block structure 336, the conductive structures 346 of some of the tiers 354 thereof may serve as access line structures (e.g., word line structures) for the strings of memory cells 372 within the horizontal area of the block structure 336. In some embodiments, within each block structure 336, the memory cells 372 formed at the intersections of the conductive structures 346 of some of the tiers 354 and the cell pillar structures 370 comprise so-called "MONOS" (metal-oxide-nitride-oxide-semiconductor) memory cells. In additional embodiments, the memory cells 372 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 372 comprise so-called "floating gate" memory cells including floating gates (e.g., metallic floating gates) as charge storage structures. The floating gates may horizontally intervene between central structures of the cell pillar structures 370 and the conductive structures 346 of the different tiers 354 of the stack structure 352.

The microelectronic device 301 may further include at least one source structure 374, access line routing structures 376, first select gates 378 (e.g., upper select gates, drain select gates (SGDs)), select line routing structures 380, one or more second select gates 382 (e.g., lower select gates, source select gate (SGSs)), and digit line structures 384. The digit line structures 384 may vertically overlie and be coupled to the cell pillar structures 370 (and, hence, the strings of memory cells 372). The source structure 374 may vertically underlie and be coupled to the cell pillar structures 370 (and, hence, the strings of memory cells 372). In addition, the contact structures 356 may couple various features of the microelectronic device 301 to one another as shown (e.g., the select line routing structures 380 to the first select gates 378; the access line routing structures 376 to the conductive structures 346 of the tiers 354 of the block structures 336 of the stack structure 352). The contact structures 356 may be substantially similar to the conductive contact structures 156, 256.

The digit line structures 384 may be electrically coupled to the strings of cell pillar structures 370 through first conductive interconnect structures 358 (only some of which are illustrated in FIG. 13 for clarity and ease of understanding the description).

The microelectronic device 301 may also include a base structure 386 positioned vertically below the cell pillar structures 370 (and, hence, the strings of memory cells 372). The base structure 386 may include at least one control logic region including control logic devices configured to control various operations of other features (e.g., the strings of memory cells 372) of the microelectronic device 301. As a non-limiting example, the control logic region of the base structure 386 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 386 may be coupled to the source structure 374, the access line routing structures 376, the select line routing structures 380, and the digit line structures 384. In some embodiments, the control logic region of the base structure 386 includes CMOS (complementary metal-oxide-semiconductor) circuitry. In such embodiments, the control logic region of the base structure 386 may be characterized as having a "CMOS under Array" ("CuA") configuration.

Thus, in accordance with some embodiments of the disclosure, a microelectronic device comprises a stack structure comprising a vertically alternating sequence of conductive structures and insulative structures arranged in tiers, the stack structure divided into block structures horizontally extending in parallel in a first direction and horizontally separated from one another in a second direction by dielectric slot structures. At least one of the block structures comprises a stadium structure comprising opposing staircase structures each having steps comprising edges of the tiers, and conductive contact structures vertically extending to and in contact with at least some of the conductive structures at the steps, the conductive contact structures positioned proximate horizontal boundaries of the stadium structure in the second direction.

Furthermore, in accordance with further embodiments of the disclosure, a memory device comprises a stack structure comprising tiers each comprising conductive material and insulative material vertically neighboring the conductive material, staircase structures comprising steps comprising edges of the tiers, the steps ascending and descending in a first horizontal direction, conductive contact structures each individually in electrical communication with the conductive material of one of the tiers at one of the steps, each of the conductive contact structures individually positioned near one of two opposing boundaries of the one of the steps in a second direction orthogonal to the first horizontal direction, and strings of memory cells vertically extending through portions of the stack structure neighboring the staircase structures in the first horizontal direction.

In accordance with additional embodiments, a method of forming a microelectronic device comprises forming rows of stadium structures within a stack structure, each of the stadium structures individually comprising steps at horizontal edges of tiers of a vertically alternating sequence of insulative structures and sacrificial structures of the stack structure, forming a first liner material and a second liner material overlying at least a portion of each of the steps of the stadium structures, forming pillar structures vertically through the second liner material over the at least a portion of each step of the stadium structures to form isolated portions of the second liner material, forming slots through at least a portion of the stadium structures, removing the sacrificial structures and the isolated portions of the second liner material through the slots, forming conductive structures vertically between pairs of the insulative structures vertically neighboring one another after removing the sacrificial structures through the slots, and forming conductive material at locations from which the isolated portions of the second liner material were removed to form isolated conductive contact structures in electrical communication with the conductive structures.

Figure 14:
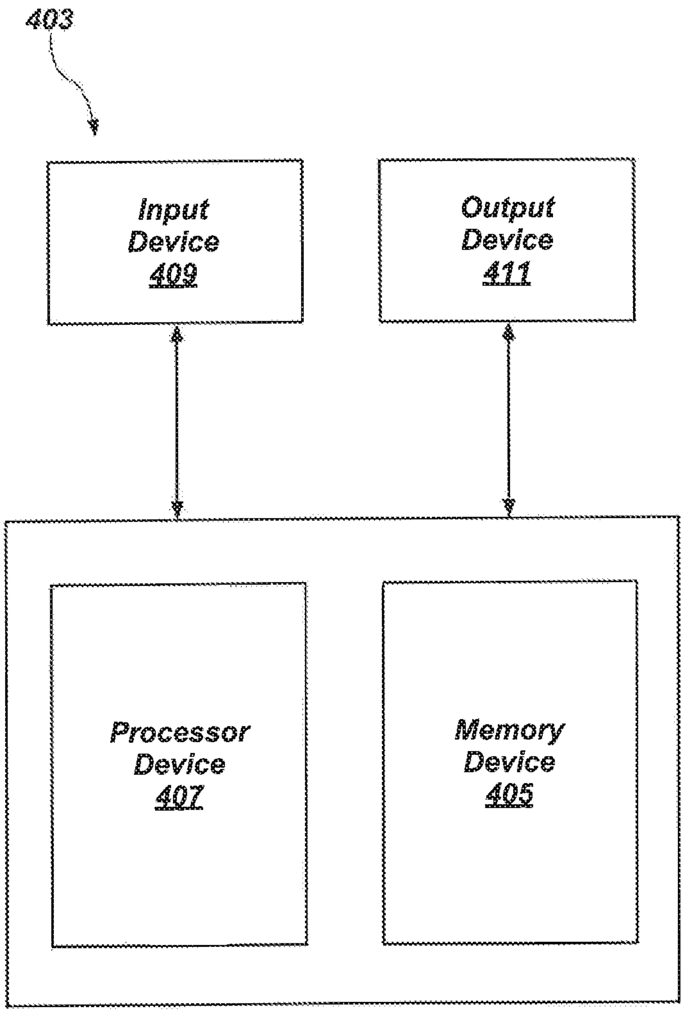
FIG. 14 is a block diagram of a processor-based system, in accordance with embodiments of the disclosure.

Microelectronic devices (e.g., the microelectronic device 301 including microelectronic device structures (e.g., the microelectronic device structures 100, 200, 300) of the disclosure may be included in embodiments of electronic systems of the disclosure. For example, FIG. 14 is a block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device structure previously described herein (e.g., the microelectronic device structure 100, 200, 300 previously described with reference to FIG. 6A through FIG. 6C, FIG. 12A through FIG. 12D, FIG. 13) or a microelectronic device (e.g., the microelectronic device 301) previously described with reference to FIG. 13).

The electronic system 403 may further include at least one electronic signal processor device 407 (often referred to as a "microprocessor"). The electronic signal processor device 407 may, optionally, include an embodiment of one or more of a microelectronic device and a microelectronic device structure previously described herein. The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Accordingly, in at least some embodiments, an electronic device comprises an input device, an output device, a processor device operably coupled to the input device and the output device, and a memory device operably coupled to the processor device and comprising at least one microelectronic device structure. The at least one microelectronic device structure comprises a stack structure comprising block structures separated from one another by slot structures, each of the block structures including a vertically alternating sequence of insulative structures and conductive structures arranged in tiers. At least one of the block structures comprises staircase structures having steps comprising horizontal edges of the tiers, at least two conductive contact structures individually in electrical communication with a portion of one of the conductive structures defining one of the steps, the at least two conductive contact structures vertically extending through an insulative material vertically overlying the staircase structures, a pillar structure vertically extending through the stack structure and horizontally between the at least two conductive contact structures, and strings of memory cells horizontally neighboring the staircase structures and vertically extending through the stack structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:

a stack structure comprising a vertically alternating sequence of conductive structures and insulative structures arranged in tiers, the stack structure divided into block structures horizontally extending in parallel in a first direction and horizontally separated from one another in a second direction by dielectric slot structures, at least one of the block structures comprising:

a stadium structure comprising opposing staircase structures each having steps comprising edges of the tiers, at least some of the steps individually comprising an arcuate portion horizontally extending in the second direction; and conductive contact structures vertically extending to and in contact with at least some of the conductive structures at the steps, the conductive contact structures positioned at horizontal boundaries of the stadium structure in the second direction.

2. The microelectronic device of claim 1, wherein each of the at least some of the conductive structures is individually in contact with multiple of the conductive contact structures.

3. The microelectronic device of claim 1, wherein:

every other step of the steps of the stadium structure is individually in electrical communication with one of the conductive contact structures positioned at a first of the horizontal boundaries of the stadium structure in the second direction; and other ones of the steps of the stadium structure are individually in electrical communication with an additional one of the conductive contact structures at a second of the horizontal boundaries of the stadium structure in the second direction.

4. The microelectronic device of claim 1, wherein the conductive contact structures individually have arcuate surfaces, the arcuate surfaces comprising:

a first arcuate surface partially defining a first diameter; and a second arcuate surface partially defining a second diameter larger than the first diameter.

5. The microelectronic device of claim 1, further comprising pillar structures vertically extending through the stack structure at the steps.

6. The microelectronic device of claim 5, wherein:

one of the pillar structures vertically extends through every other step of the steps at a location horizontally neighboring a first of the dielectric slot structures; and another one of the pillar structures vertically extends through remaining ones of the steps at a location horizontally neighboring a second of dielectric slot structures.

7. The microelectronic device of claim 6, wherein each of the pillar structures is partially horizontally surrounded by at least one of the conductive contact structures.

8. The microelectronic device of claim 7, further comprising at least one dielectric liner material horizontally interposed between each of the pillar structures and the at least one of the conductive contact structures.

9. The microelectronic device of claim 1, further comprising first conductive interconnect structures each individually in electrical communication with one of the conductive contact structures.

10. The microelectronic device of claim 1, further comprising a bridge structure comprising the stack structure horizontally between the stadium structure and an additional stadium structure spaced from the stadium structure in the second direction.

11. A memory device, comprising:

a stack structure comprising tiers each comprising conductive material and insulative material vertically neighboring the conductive material;

staircase structures comprising steps comprising edges of the tiers, the steps ascending and descending in a first horizontal direction, at least some of the steps individually comprising an arcuate portion horizontally extending in a second horizontal direction orthogonal to the first horizontal direction;

conductive contact structures each individually in electrical communication with the conductive material of one of the tiers at one of the steps, each of the conductive contact structures individually positioned at one of two opposing boundaries of the one of the steps in the second horizontal direction; and strings of memory cells vertically extending through portions of the stack structure neighboring the staircase structures in the first horizontal direction.

12. The memory device of claim 11, wherein the conductive contact structures comprise substantially the same material composition as the conductive material of the stack structure.

13. The memory device of claim 11, wherein each of the steps is in electrical communication with two of the conductive contact structures, a first one of the two of the conductive contact structures positioned at a first of the two opposing boundaries and a second one of the two of the conductive contact structures positioned at a second of the two opposing boundaries.

14. The memory device of claim 11, further comprising additional contact structures vertically extending completely through the stack structure within horizontal areas of the staircase structures, each of the additional contact structures positioned at one of the two opposing boundaries of the one of the steps in the second horizontal direction.

15. A method of forming a microelectronic device, the method comprising:

forming rows of stadium structures within a stack structure and horizontally extending in a first direction, each of the stadium structures individually comprising steps at horizontal edges of tiers of a vertically alternating sequence of insulative structures and sacrificial structures of the stack structure, each of the steps including an arcuate portion horizontally extending in a second direction orthogonal to the first direction;

forming a first liner material and a second liner material overlying at least a portion of each of the steps of the stadium structures;

forming pillar structures vertically through the second liner material over the at least a portion of each step of the stadium structures to form isolated portions of the second liner material;

forming slots through at least a portion of the stadium structures;

removing the sacrificial structures and the isolated portions of the second liner material through the slots;

forming conductive structures vertically between pairs of the insulative structures vertically neighboring one another after removing the sacrificial structures through the slots; and forming conductive material at locations from which the isolated portions of the second liner material were removed to form isolated conductive contact structures in electrical communication with the conductive structures.

16. The method of claim 15, wherein forming the slots through at least a portion of the stadium structures comprises forming the slots to comprise:

a horizontally central portion vertically extending through a stadium structure; and horizontally extending portions extending from the horizontally central portion to a bridge region between a first row of the stadium structures and a second row of the stadium structures.

17. The method of claim 15, wherein forming isolated conductive contact structures comprises forming each step to individually be in electrical communication with two isolated conductive contact structures at the conductive structure of the step.

18. The method of claim 15, further comprising:

forming first conductive interconnect structures in electrical communication with the isolated conductive contact structures; and forming second conductive interconnect structures in electrical communication with the pillar structures.

19. An electronic system, comprising:

an input device;

an output device;

a processor device operably coupled to the input device and the output device; and a memory device operably coupled to the processor device and comprising at least one microelectronic device, the at least one microelectronic device comprising a stack structure comprising block structures separated from one another by slot structures, each of the block structures including a vertically alternating sequence of insulative structures and conductive structures arranged in tiers, at least one of the block structures comprising:

a stadium structure comprising opposing staircase structures individually having steps comprising horizontal edges of the tiers, at least some of the steps respectively comprising an arcuate portion horizontally extending in a direction in which the block structures are separated from one another by the slot structures;

at least two conductive contact structures individually in electrical communication with a portion of one of the conductive structures defining one of the steps, the at least two conductive contact structures vertically extending through an insulative material vertically overlying the staircase structures;

a pillar structure vertically extending through the stack structure and within a horizontal area of the arcuate portion of a respective one of the at least some of the steps, the pillar structure horizontally between the at least two conductive contact structures; and strings of memory cells horizontally neighboring the staircase structures and vertically extending through the stack structure.

20. The electronic system of claim 19, wherein the at least two conductive contact structures are located at a horizontal end of one of the steps adjacent a slot structure of the slot structures.

21. The electronic system of claim 19, further comprising a conductive interconnect structure vertically overlying and in electrical communication with the pillar structure.

22. The electronic system of claim 19, wherein:

alternating ones of the steps within a horizontal area of one of the block structures have a first group of the conductive contact structures thereon at a boundary between the one of the block structures and a first of the slot structures; and remaining ones of the steps within the horizontal area of the one of the block structures have a second group of the conductive contact structures thereon that is at an additional boundary between the one of the block structures and a second slot structure spaced from the first slot structure by the one of the block structures.

* * * * *